(12) United States Patent
Mann et al.

(10) Patent No.: US 9,182,578 B2
(45) Date of Patent: Nov. 10, 2015

(54) IMAGING OPTICAL SYSTEM AND ILLUMINATION OPTICAL SYSTEM

(75) Inventors: Hans-Juergen Mann, Oberkochen (DE); Johannes Zellner, Aalen (DE); Aurelian Dodoc, Heidenheim (DE); Marco Pretorius, Oberkochen (DE); Christoph Menke, Oberkochen (DE); Wilhelm Ulrich, Aalen (DE); Martin Endres, Koenigsbronn (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 769 days.

(21) Appl. No.: 13/326,516

(22) Filed: Dec. 15, 2011

(65) Prior Publication Data

US 2012/0147347 A1 Jun. 14, 2012

Related U.S. Application Data

(63) Continuation of application No. PCT/EP2010/057971, filed on Jun. 8, 2010.

(60) Provisional application No. 61/219,823, filed on Jun. 24, 2009.

(30) Foreign Application Priority Data

Jun. 24, 2009 (DE) .................. 10 2009 030 501

(51) Int. Cl.
*G03B 27/42* (2006.01)
*G02B 17/06* (2006.01)
(Continued)

(52) U.S. Cl.
CPC ........ *G02B 17/0663* (2013.01); *G02B 27/0905* (2013.01); *G03F 7/70233* (2013.01)

(58) Field of Classification Search
CPC .......... G02B 17/0663; G02B 27/0905; G02B 17/0657; G02B 26/06; G02B 17/0642; G02B 17/0647; G02B 17/0652; G02B 19/0028; G02B 26/0825; G02B 5/0816; G02B 17/06; G02B 21/04; G02B 5/10; G02B 17/0888; G02B 26/0816; G02B 27/0977; G02B 27/14; G02B 27/145; G03F 7/70308; G03F 7/70233
USPC .................................... 355/53, 55, 63, 67, 77
See application file for complete search history.

(56) References Cited

U.S. PATENT DOCUMENTS 5,623,343 A 4/1997 Nara et al.
5,777,724 A 7/1998 Suzuki
(Continued)

FOREIGN PATENT DOCUMENTS

CN 101 263 430 9/2008
DE 10 2006 043 251 A1 3/2007
(Continued)

OTHER PUBLICATIONS

Taiwanese office action, with English translation thereof, for TW Appl No. 97 101 634, dated Sep. 10, 2013.
(Continued)

*Primary Examiner* — Mesfin T Asfaw
(74) *Attorney, Agent, or Firm* — Fish & Richardson P.C.

(57) ABSTRACT

An imaging optical system has a plurality of mirrors, which image an object field in an object plane into an image field in an image plane. A reflection face of at least one of the mirrors is configured as a free form face which cannot be described by a rotationally symmetrical function. The object field has an aspect ratio greater than 1. A ratio of a minimal and a maximal transverse dimension of the object field can be less than 0.9.

38 Claims, 26 Drawing Sheets

(51) Int. Cl.
 *G02B 27/09* (2006.01)
 *G03F 7/20* (2006.01)

(56) References Cited

U.S. PATENT DOCUMENTS

| | | | |
|---|---|---|---|
| 6,104,474 | A | 8/2000 | Suzuki |
| 6,229,595 | B1 | 5/2001 | McKinley et al. |
| 6,573,978 | B1 | 6/2003 | McGuire, Jr. |
| 6,929,373 | B2 | 8/2005 | Yoshikawa et al. |
| 7,414,781 | B2 | 8/2008 | Mann et al. |
| 7,682,031 | B2 | 3/2010 | Mann et al. |
| 2002/0136351 | A1 | 9/2002 | Singer |
| 2002/0154284 | A1 | 10/2002 | Sato |
| 2003/0142283 | A1 | 7/2003 | McGuire, Jr. |
| 2003/0235682 | A1 | 12/2003 | Sogard |
| 2005/0024619 | A1 | 2/2005 | Shinoda et al. |
| 2006/0103908 | A1 | 5/2006 | Loopstra et al. |
| 2007/0024965 | A1 | 2/2007 | Sander |
| 2007/0058269 | A1 | 3/2007 | Mann et al. |
| 2008/0225387 | A1* | 9/2008 | Hainz et al. .......... 359/351 |
| 2008/0247067 | A1 | 10/2008 | Sasaki |
| 2009/0040493 | A1 | 2/2009 | Komatsuda |
| 2013/0342821 | A1 | 12/2013 | Mann |

FOREIGN PATENT DOCUMENTS

| | | |
|---|---|---|
| EP | 0 744 665 | 11/1996 |
| EP | 1 093 021 A2 | 4/2001 |
| JP | 07-066103 A | 3/1995 |
| JP | 11-312639 A | 11/1999 |
| JP | H11-312639 A | 11/1999 |
| JP | 2001-185480 | 7/2001 |
| JP | 2002-015979 | 1/2002 |
| JP | 2002-203784 A | 7/2002 |
| JP | 2004-029625 | 1/2004 |
| JP | 2004-031958 A | 1/2004 |
| JP | 2004-126510 A | 4/2004 |
| JP | 2005-012169 A | 1/2005 |
| JP | 2005-122132 A | 5/2005 |
| JP | 2005-167232 A | 6/2005 |
| JP | 2005-172988 | 6/2005 |
| JP | 2006-140504 A | 6/2006 |
| JP | 2008-176326 A | 7/2008 |
| JP | 2008-258461 A | 10/2008 |
| JP | 2009-044147 A | 2/2009 |
| KR | 2000-00712780 | 11/2000 |
| KR | 100 312 882 B1 | 10/2001 |
| TW | 594043 | 6/2004 |
| TW | 200632372 A | 9/2006 |
| WO | WO 2006/069725 | 7/2006 |
| WO | WO 2007/031271 A1 | 3/2007 |
| WO | WO 2007/128407 | 11/2007 |
| WO | WO 2008/149178 A1 | 12/2008 |
| WO | WO 2009/010213 A1 | 1/2009 |

OTHER PUBLICATIONS

Korean office action, with English translation thereof, for KR Appl No. 10-2012-7001177, dated Dec. 30, 2013.
Chinese Office Action, with translation thereof, for corresponding CN Appl No. 201080037247.0, dated Jun. 24, 2013.
B. Tatian, "Nonrotationally Symmetric Systems: A New Problem for Optical Design and Fabrication, Applications of Geometrical Optics", Proc. SPIE, 39:205, (1973).
B. Tatian, "Testing an Unusual Optical Surface", International Lens Design Conference, Proc. SPIE, 554:139, (1985).
Japanese office action with English translation with respect to JP Appl No. 2012-516 619, dated Jun. 3, 2013.
International Search Report for corresponding PCT Appl No. PCT/EP2010/057971, dated Dec. 28, 2010.
English translation of German examination report for corresponding DE Appl No. 10 2009 030 501.7-51, dated Dec. 17, 2009.
Koran Office Action, with translation thereof, for corresponding KR Appl No. 10-2012-7001177, dated May 31, 2013.
Chinese office action, with English translation thereof, for CN Appl No. 2010 8003 7247.0, dated Apr. 15, 2014.
Chinese office action, with English translation thereof, for CN Appl No. 2010 8003 7247.0, dated Nov. 15, 2014.
Japanese office action with English translation thereof, for JP Appl No. 2013-252435, dated Oct. 24, 2014.
Japanese Office Action with English translation thereof for JP Appln. No. 2013-252435, 5 pages, dated Jun. 4, 2015.

* cited by examiner

IMAGING OPTICAL SYSTEM AND ILLUMINATION OPTICAL SYSTEM

CROSS-REFERENCE TO RELATED APPLICATIONS

This application is a continuation of, and claims benefit under 35 USC 120 to, international application PCT/EP2010/057971, filed Jun. 8, 2010, which claims benefit under 35 USC 119 of German Application No. 10 2009 030 501.7, filed Jun. 24, 2009 and under 35 USC 119(e) of U.S. Ser. No. 61/219,823, filed Jun. 24, 2009. International application PCT/EP2010/057971 is hereby incorporated by reference in its entirety.

FIELD

The disclosure relates to an imaging optical system for imaging an object field into an image field, an illumination optical system for illuminating an object field, an illumination system with such an illumination optical system, a projection exposure system with such an illumination system and/or such an imaging optical system, a production method for a microstructured or nanostructured component using such a projection exposure system, and a microstructured or nanostructured component produced by such a method.

BACKGROUND

Imaging optical systems for use in a projection exposure system are known from U.S. Pat. No. 7,414,781 B2. Illumination optical systems for use in a projection exposure system for microlithography are known from U.S. Pat. No. 7,414,781 B2 and WO 2007/128407A.

SUMMARY

The disclosure provides an imaging optical system designed to taken into account increased demands on the correction of imaging errors over the field imaged by the imaging optical system.

In imaging optical system disclosed herein an object field is the two-dimensional region which can be imaged the imaging optical system with values for specific imaging errors, which can be better than error specification values associated with the respective imaging errors.

A point pattern size of beams of optically calculated point patterns in the object field plane can be used as the error specification value for the imaging errors. Within the object field, these point pattern sizes (spot sizes) desirably does not exceed an rms (root mean square) value of $1\times10^{-4}$ mm which is an example for the error specification value. Smaller error specification values for the spot size, for example $0.7\times10^{-4}$ mm, $0.5\times10^{-4}$ mm, $0.4\times10^{-4}$ mm, $0.3\times10^{-4}$ mm, $0.2\times10^{-4}$ mm or even $0.15\times10^{-4}$ mm are also possible.

An annular arc field with a small radius of curvature, with simultaneous use of free form faces, according to the first aspect leads to an imaging optical system, which offers the possibility of a particularly precise correction of imaging errors over the object field. In this specification, the term "face" is used as a synonym for "surface". The radius of the two part circles limiting the arc field may be 250 mm or may even be smaller. Because of the small part circle radius of the image field, an imaging error correction with the use of free form faces is possible, which deviate only slightly from approximating rotationally symmetrical reference faces and can therefore be produced comparatively easily and, in particular, can be measured precisely.

The dimension designations "longitudinal dimension" and "transverse dimension" used in the application are oriented according to the fact that the described object fields have an aspect ratio different from 1.0, so a longer extent and a shorter extent running transverse thereto of the object field can always be defined. The longitudinal dimension runs along the longer extent or the longitudinal side. The transverse dimension runs transverse to this along the narrow side.

A field formed according to the first aspect, because of the transverse dimension ratio, has a transverse dimension varying over the field and therefore has a minimal transverse dimension and a maximal transverse dimension. This can be used for field forms adapted to the design of the imaging optical system and also to the design of an illumination optical system illuminating the object field, in which field forms a particularly good imaging quality can be achieved. In particular, a field form may be selected, a uniform illumination of which is possible with a comparatively small outlay. The ratio of the minimal transverse dimension and the maximal transverse dimension may be less than 0.85, may be less than 0.8, may be less than 0.7, may be less than 0.6, may be less than 0.5, may be less than 0.4, may be less than 0.3 and may, for example, be only 0.2. The free form face may deviate from a rotationally symmetrical reference face by more than a wavelength of the illumination light, with which the imaging optical system is used. That which is as stated with regard to this in U.S. Pat. No. 7,414,781 B2 applies to deviations of this type characterising the free form face in relation to a rotationally symmetrical reference face.

The free form faces used may be static free form faces, in other words free form faces, which are not provided by a dynamic effect of actuators.

The mirror symmetry of the reference field form, from which the object field and/or the image field deviates, relates here to a plane of symmetry perpendicular to the respective field plane and parallel to a transverse dimension of the object field and/or the image field. If the imaging optical system is used in a projection exposure system, which is designed as a scanner, the object field deviating from the mirror-symmetrical field form and/or image field is not mirror-symmetrical in relation to a plane extending perpendicular to the respective field plane and parallel to an, in particular, central transverse dimension. It has surprisingly been found that the dismissal of the demand for a mirror symmetry of the object field and the further degrees of freedom thus obtained in the design of the reflection faces of the imaging optical system to a particular extent leads to the possibility of a flexible design and image error correction of the imaging optical system, without the use of free form faces being absolutely necessary for this. The additionally possible use of free form faces allows a further improvement of the imaging properties of the imaging optical system. Owing to the object of mirror symmetry, an object field and/or an image field with a transverse dimension which changes, for example, monotonically along this longitudinal dimension, for example with a growing transverse dimension, can be realised, so that, for example, an object field and/or an image field results, which proceeding from a narrow edge, widens monotonically toward the opposing edge.

The degrees of freedom with regard to the design of the optical system can be increased again when using at least one free form face.

The disclosure also provides an illumination optical system, with which an illumination of object fields formed according to the above aspects is possible.

The illumination field of the illumination optical system according to the disclosure is the two-dimensional region which is illuminated with values of specific illumination parameters, which are better than respectively associated illumination specification values. The illumination intensity may be used, for example, as an illumination parameter. An illumination specification value may, for example, be 0.9 times an illumination intensity which can maximally be reached within the illumination field. The illumination field may coincide with the object field of the imaging optical system.

The illumination optical system according to the disclosure is in a position to illuminate illumination or object fields with a varying transverse dimension. The ratio of the minimal transverse dimension and the maximal transverse dimension may be less than 0.85, may be less than 0.8, may be less than 0.7, may be less than 0.6, may be less than 0.5, may be less than 0.4, may be less than 0.3 and may be 0.2. The illumination optical system according to the disclosure may be designed such that the illumination of the object field succeeds with a varying transverse dimension, without the illumination light for the field forming having to be stopped down.

The advantages of a free form face design of an illumination optical component can correspond to those which have already been described above with reference to the imaging optical system.

The following embodiment variants of the object or illumination field form lead to corresponding designs of the imaging optical system and/or the illumination optical system.

An object field can be limited by a curved line, an opposing longitudinal line and two boundary lines in each case connecting the ends of these two opposing lines. The longitudinal line may also be a curved line, a line running straight or else a line with at least one turning point and/or with at least one discontinuity or unsteady point. If a projection exposure system, which uses the imaging optical system, is designed as a scanner, the curved line may be the first object field limiting line, which an object point to be imaged passes on entry into the object field. Alternatively, the curved line may be that limiting line of the object field, which an object point to be imaged passes on leaving the object field. In relation to the object field, the curved line may extend curved in a concave or convex manner. The object field may be configured as an arc field curving away in total from a reference axis extending perpendicular to the object field. If the imaging optical system is designed with mirrors with rotationally symmetrical reflection faces, the reference axis may be the optical axis of the imaging optical system. If the imaging optical system has at least one free form face as the reflection face, the reference axis may be the axis of rotational symmetry of rotationally symmetrical reference faces approximating at least one free form face. The reference axis may be an axis, proceeding from which a mathematically simple description (face function) of the form of the reflection faces of the imaging optical system is possible. The object field may have a varying transverse dimension. New possibilities are produced here for the design of the imaging optical system compared to the conventional arc fields in the prior art, which curve around the optical axis or a corresponding reference axis. The object field may also be designed as an arc field curving around the reference axis, it being possible for this object field to be formed in such a way that it has a varying transverse dimension. The longitudinal line opposing the curved line may limit the object field as a line extending convexly or else concavely. The longitudinal line opposing the curved line may then curve away from the reference axis or may curve around the reference axis.

Certain field form configurations have proven to be advantageous to fulfil certain specifications with regard to the correction of imaging errors and with regard to their efficient illumination. Object field forms with a constriction, in other words with a transverse dimension which is reduced in this constriction region, can be illuminated, as has surprisingly been shown, with illumination optical systems, in particular with field facet mirrors, which have no corresponding constriction. In this case, a rotation of the images of individual field facets relative to one another occurring because of the imaging ratios within the illumination optical system can be used during the superimposition thereof on the object field. If the imaging optical system is used in a projection exposure system, which is designed as a scanner, the transverse dimension of the object field may extend parallel or substantially parallel to a scanning direction. A variation between a minimal transverse dimension and a maximal transverse dimension of the object field then leads to different illumination periods of a point on the reticle scanned by the illuminated object field, depending on whether the reticle point is scanned through the object field at a level of a greater or at the level of a smaller transverse dimension of the object field. This is also called a field-dependent variation of a scan length. A ratio of a minimal transverse dimension and a maximal transverse dimension of the object field, which is smaller than 0.9, corresponds to a variation of the scan length by more than 10%. A constriction of the object field, in other words a region of a minimal transverse dimension, may be present a region of an axis of symmetry of the object field extending parallel to the scanning direction.

Certain mirror numbers can be a particularly advantageous compromise with regard to the correction of imaging errors, on the one hand, and the total throughput of the illumination light through the imaging optical system, on the other hand.

A wavefront error can lead to an optical system imaging particularly well.

The advantages of an illumination optical system can correspond to those which have already been described above with reference to the imaging optical system and to the illumination optical system for illuminating a field with a varying transverse dimension. With regard to the particular forms of boundaries of the reflection faces of the field facets, the respective particular form may apply to one, to some or to all of the field facet reflection faces of the field facet mirror. At least one of the field facets may not be configured in a geometrically similar manner to the object field. This is a departure from the configuration of conventional illumination optical systems, in which, for example, arcuate field facets illuminate an also arcuate, in other words a geometrically similar object field. According to the disclosure, in conjunction with the field facets not configured in a geometrically similar manner to the object field, it was recognised that the imaging effects changing the field facet form, which are caused by the following optical system, which images the field facets overlaying one another in the object field, can be completely or partially compensated by this. A field facet form is not geometrically similar to an object field form if an outer contour of the field facet (the field facet boundary) differs in its configuration from an outer contour of the object field.

In an illumination optical system, the boundary condition can also given up, according to which the projection of field facet edges is identical in the direction of a normal of a carrier plate generally present of the field facet mirror. Owing to the new degree of freedom of allowing non-identically formed projection faces, a pre-compensation can be achieved of a rotation, which is possible because of imaging ratios, of the images of the individual field facets relative to one another during the superimposition thereof on the object field.

The advantages of an illumination system according, a projection exposure system, a production method, and a microstructured or nanostructured component can correspond to those which have already been mentioned above with reference to the imaging optical system according to the disclosure, on the one hand, and with reference to the illumination optical system according to the disclosure, on the other hand. In a projection exposure system, a complete illumination of the object field can be ensured. A certain area ratio can lead to an efficient utilisation of the illumination light. The illumination field may be even better adapted in terms of size. The illumination field may, for example, be only 1% larger than the object field. The illumination field may also be more than 5% larger than the object field. The imaging optical system of the projection exposure system, which is also called a projection optical system, may be an imaging optical system according to the disclosure.

BRIEF DESCRIPTION OF THE DRAWINGS

Embodiments of the disclosure will be described in more detail below with the aid of the drawings, in which.

DETAILED DESCRIPTION

Figure 1:
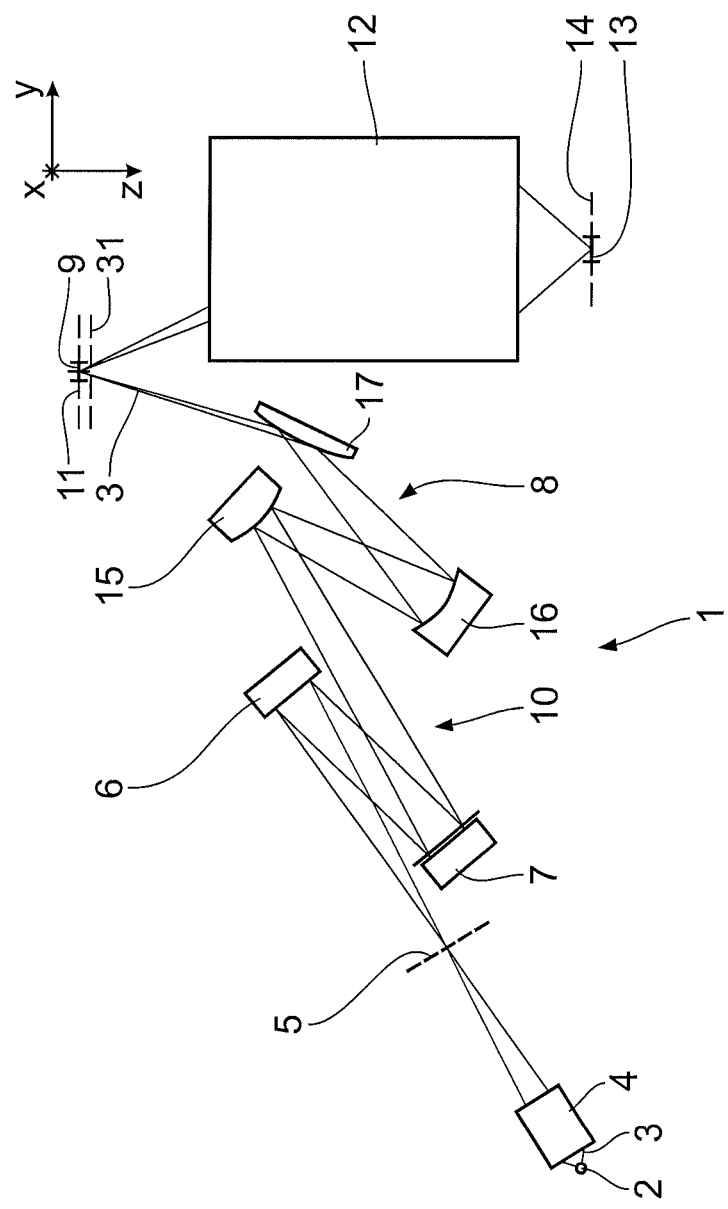
FIG. 1 schematically shows a projection exposure system for EUV microlithography, an illumination optical system being shown in section and a projection optical system being shown highly schematically.

FIG. 1. schematically shows a projection exposure system 1 for EUV microlithography. An EUV radiation source is used as the light source 2. In this case, this may be an LPP (Laser Produced Plasma) radiation source or a DPP (Discharge Produced Plasma) radiation source. A synchotron or a free electron laser (FEL) is also a possible light source. The light source 2 emits EUV useful radiation 3 with a wavelength in the range of between 5 nm and 30 nm. The useful radiation 3 will also be designated illumination or imaging light below.

The illumination light 3 emitted by the light source is firstly collected by a collector 4. Depending on the type of light source 2, this may be an ellipsoidal mirror or a nested collector. After the collector 4, the illumination light 3 passes through an intermediate focus plane 5 and then impinges on a field facet mirror 6. Embodiments of the field facet mirror 6 will be described below in detail. From the field facet mirror 6 the illumination light 3 is reflected toward a pupil facet mirror 7. The illumination light bundle is divided into a plurality of illumination channels via the facets of the field facet mirror 6, on the one hand, and the pupil facet mirror 7, on the other hand, precisely one facet pair with a field facet or pupil facet being associated with each illumination channel.

A following optical system 8 arranged downstream of the pupil facet mirror 7 guides the illumination light 3, in other words the light of all the illumination channels toward an object field 9. The field facet mirror 6, the pupil facet mirror 7 and the following optical system 8 are components of an illumination optical system 10 for illuminating an illumination field, which coincides with the object field 9 and therefore will also be called an object field below. The object field 9 lies in an object plane 11 of a projection optical system 12 of the projection exposure system 1 arranged downstream of the illumination optical system 10. The form of the object field 9 depends on the configuration of the illumination optical system 10 described below, on the one hand, and the projection optical system 12, on the other hand. A global Cartesian xyz-coordinate system is used for the entire projection exposure system 1 according to FIG. 1 and a local Cartesian xyz-coordinate system is used in FIG. 2ff. for individual components of the projection exposure system 1. A structure arranged in the object field 9 on a reticle, not shown in the drawing, in other words on a mask to be projected, is imaged on an image field 13 in an image plane 14, by the projection optical system 12 reduced by a reduction scale. The reduction scale in the projection optical system 12 is 4×. Other reduction scales, for example 5×, 6×, 8× or 10× are possible. A wafer, also not shown in the drawing, is arranged at the site of the image field 13, onto which wafer the structure of the reticle is transmitted to produce a microstructured or nanostructured component, for example a semiconductor chip.

The following optical system 8 between the pupil facet mirror 7 and the object field 9 has three further EUV mirrors 15, 16, 17. The last EUV mirror 17 before the object field 9 is configured as a grazing incidence mirror. In alternative embodiments of the illumination optical system 10, the following optical system 8 may also have more or less mirrors or even be dispensed with completely. In the latter case, the illumination light 3 is guided from the pupil facet mirror 7 directly to the object field 9.

To facilitate the illustration of positional relationships, an xyz-coordinate system is used below. In FIG. 1, the x-direction extends perpendicular to the plane of the drawing and into it. The y-direction in FIG. 1 extends to the right and the z-direction runs downward in FIG. 1. To the extent that a local Cartesian coordinate system is used in FIG. 2ff, the latter in each case spans the reflection face of the component shown. The x-direction is then in each case parallel to the x-direction in FIG. 1. An angle relationship of the y-direction of the individual reflection face to the y-direction in FIG. 1 depends on the orientation of the respective reflection face.

Figure 2:
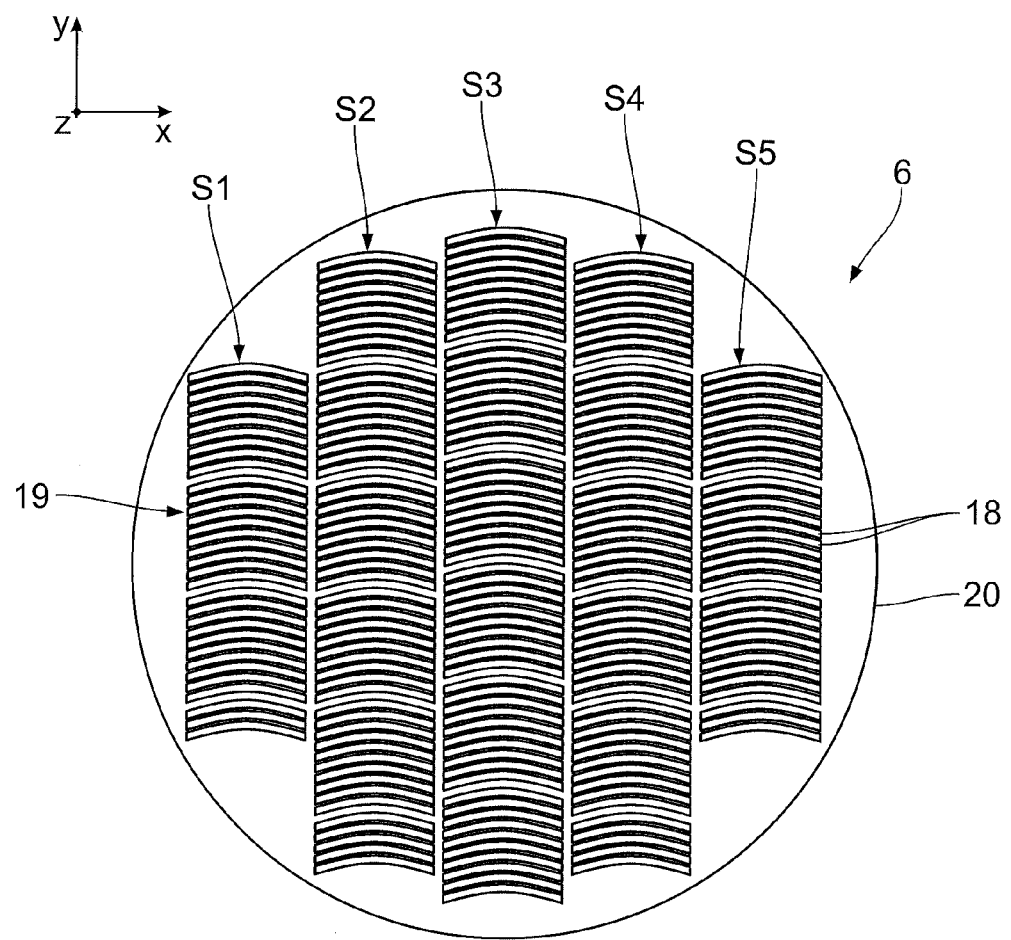
FIG. 2 shows a plan view of a field facet mirror of the illumination optical system according to FIG. 1.

FIG. 2 shows the field facet mirror 6 in more detail. The field facet mirror 6 according to FIG. 2 has a field facet arrangement with curved field facets 18. These field facets 18 are arranged in a total of five columns S1, S2, S3, S4 and S5, which are numbered consecutively from left to right in FIG. 2. A plurality of field facet groups 19 is present in each of the five columns S1 to S5, which are also called field facet blocks. The arrangement of the field facets 18 is carried by a carrier plate 20 shown in a circular form in FIG. 2, of the field facet mirror 6. The field facet arrangement is inscribed in the circular limitation of the carrier plate 20. A normal to the carrier plate 20 extends perpendicular to the xy-plane. An edging of a far field of the illumination light 3 coincides with this circular limitation. The arcuate field facets 18 of the field facet mirror 6 according to FIG. 2 all have the same area and the same ratio of width in the x-direction and height in the y-direction, in other words they all have the same x-y aspect ratio.

Figure 3:
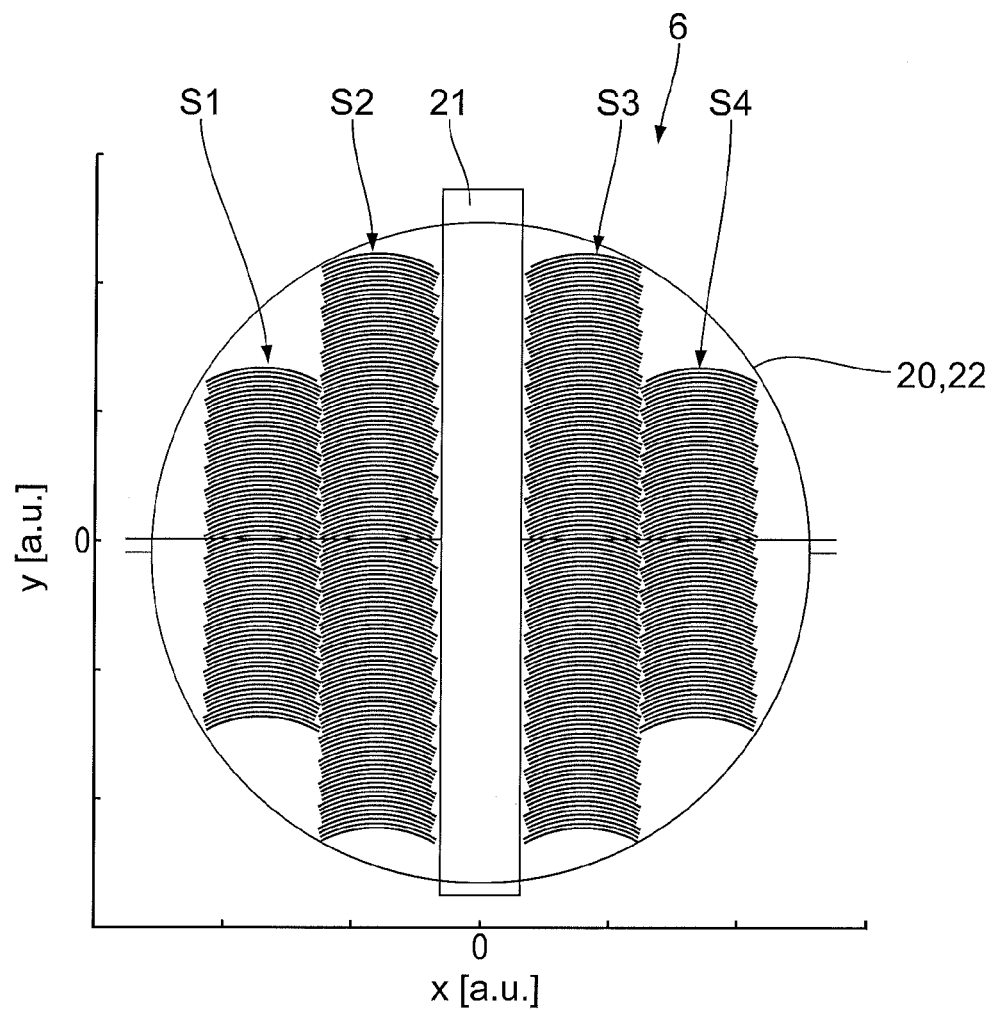
FIG. 3 shows a plan view of a further configuration of a field facet mirror of the illumination optical system according to FIG. 1.

FIG. 3 shows a further configuration of the field facet mirror 6, which is used instead of the field facet mirror 6 according to FIG. 2 in the projection exposure system 1. The field facet mirror 6 according to FIG. 3 has a total of four individual field facets 18 arranged in columns S1, S2, S3, S4, which are numbered consecutively from left to right in FIG. 3. The two central columns S2, S3 are separated from one another by an installation space 21, which extends in the y-direction and has a constant x-extent. The installation space 21 in turn corresponds to a far field shadowing of the illumination light bundle, which is structurally caused by a corresponding structure of the light source 2 and of the collector 4. The four facet columns S1 to S4 in each case have a y-extent, which ensures that all the four facet columns S1 to S4 lie within a circularly limited far field 22 of the illumination light 3. The edge of a carrier plate 20 for the field facets 18 coincides with the edging of the far field 22.

Figure 6:
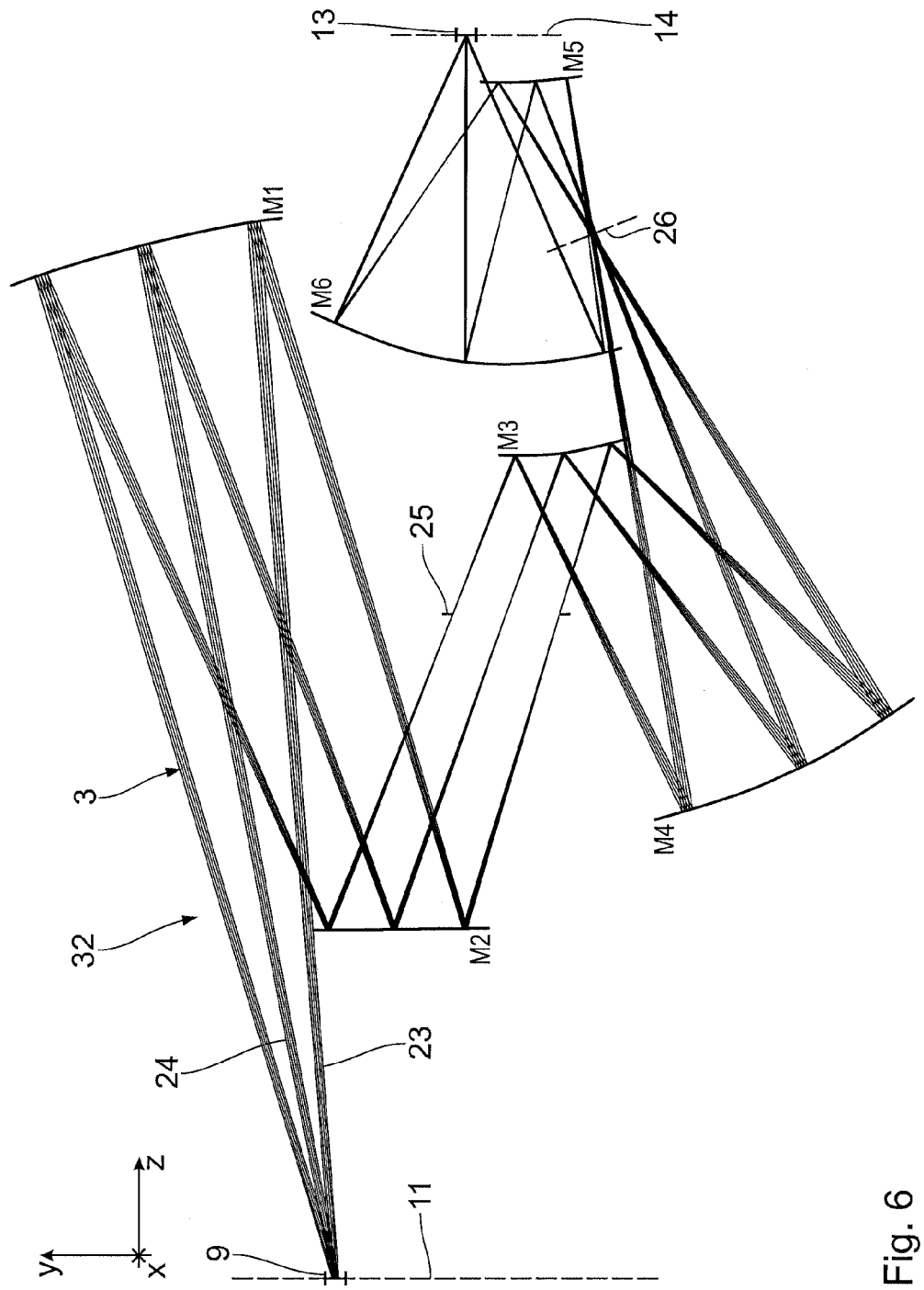
FIG. 6 shows, in a view similar to FIG. 4, a further configuration of a projection optical system for imaging an object field, which is similar to that of FIG. 5.

The field facets 18 have a mutually congruent arc or part ring form in relation to a projection onto the xy-plane, in other words in relation to a main reflection plane of the field facet mirror 6, which may be similar to the form of the object field 9 which can be illuminated with the field facet mirror according to FIG. 6.

The object field 9 (cf. also FIG. 5) has an x/y-aspect ratio of 13/1. The x/y-aspect ratio of the field facets 18 may be greater than 13/1. Depending on the configuration, the x/y-aspect ratio of the field facets 18 is, for example, 26/1 and is generally greater than 20/1.

In total, the field facet mirror according to FIG. 3 has 416 field facets 18. Alternative configurations of field facet mirrors 6 of this type, such as, for example, the field facet mirror 6 according to FIG. 2, may have numbers of field facets 18 in the range of between a few tens to, for example, a thousand.

The field facets 18 of the field facet mirror 6 according to FIG. 3 have an extent in the y-direction of about 3.4 mm. The extent of the field facets 18 in the y-direction is, in particular, greater than 2 mm. The extent of the field facets 18 in the x-direction varies, so that several of the field facets 18 have a larger, and several of the field facets 18 of the field facet mirror 6 according to the figure, have a smaller x-extent. The field facets 18 of the field facet mirror 6 according to FIG. 3 thus differ with respect to their projection onto an xy-base plane of the field facet mirror with respect to their size and if individual field facet pairs can be transferred into one another by rotation about an axis parallel to the z-axis, with respect to their orientation.

The projection faces of the reflection faces of at least two of the field facets 18 onto the base plane of the field facet mirror 6, in other words also the xy-plane, also differ because of their varying extent along the x-direction with respect to the arc angle, which they move through. Expressed differently, not all the field facets 18 of the field facet mirror 6 according to FIG. 3 have the same azimuthal extent of their arc curvature.

Configurations of the field facet mirror 6 are also possible, in which the projections of the reflection faces of at least two of the field facets 18 onto the xy-base plane differ with respect to their form. Thus, for example, field facets 18 with a different y-extent may be used.

The totality of all 416 field facets 18 of the field facet mirror 6 according to FIG. 3 has a packing density of 73%. The packing density is defined as the sum of the area of all field facets 18 in relation to the total area illuminated on the carrier plate 21.

Figure 4:
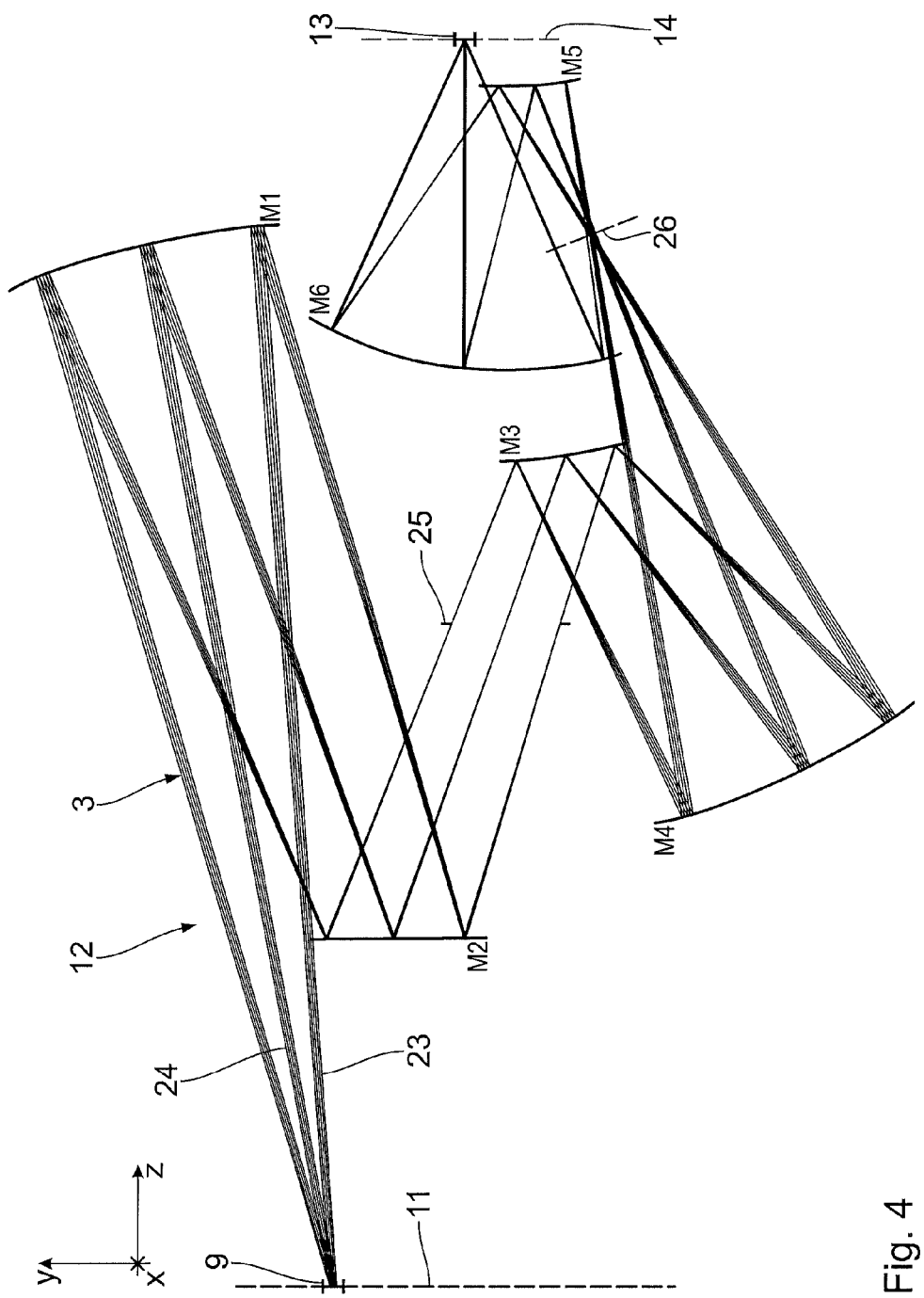
FIG. 4 shows a section containing imaging beam paths of field points spaced apart from one another through a configuration of a projection optical system of the projection exposure system according to FIG. 1.

FIG. 4 shows the optical design of a first configuration of the projection optical system 12 in a section, which contains centres of the object field 9 and the image field 13 and extends parallel to the narrow sides of the respective object field. Components, which correspond to those which have already been described above with reference to FIG. 1, have the same reference numerals and will not be discussed again in detail.

The beam path is shown of three respective individual beams 23, which proceed from five object field points located above one another in FIG. 4 and spaced apart from one another in the y-direction, the three individual beams 23, which belong to one of these five object field points, being, in each case, associated with three different illumination directions for the five object field points. These three individual beams 23, which belong to one of the nine object field points, are in each case the upper and the lower coma beam and the main beam, which is also designated in FIG. 4 by the reference numeral 24.

Proceeding from the object plane 11, the individual beams 23 are firstly reflected by a first mirror M1 and then by further mirrors M2 to M6. The projection optical system 12 according to FIG. 4 thus has six reflective mirrors. The mirrors M1 to M6 are thus numbered consecutively in accordance with their order in the imaging beam path between the object field 9 and the image field 13. FIG. 4 only shows the calculated reflection faces of the mirrors M1 to M6. The substrates and the carrier components of the mirrors M1 to M6 are not shown. These mirrors carry a highly reflective coating for the wavelength of the illumination light 3, if this is desirable on the basis of the wavelength, for example in the EUV. In the illumination optical system 10 and the projection optical system 12, radiations with a wavelength, which is very different from one another, can also be guided, as these optical systems have substantially achromatic properties. It is thus possible to guide, for example, an adjusting laser in these optical systems 10, 12 or to operate an auto-focussing system, with a wavelength which is very different from the working wavelength thereof simultaneously being worked with for the illumination light. Thus an adjusting laser can operate at 632.8 nm, at 248 nm or at 193 nm, while, simultaneously, an illumination light in the range of between 5 and 30 nm is worked with.

The mirrors M2, M3 and M5 have a convex basic form, in other words can be described by convex best-adapted face. The radius of curvature of the mirror M2 is so large that the latter practically appears as a planar mirror in the view according to FIG. 4. The mirrors M1, M4 and M6 have a concave basic form, in other words may be described by a concave best-adapted face. In the following description, mirrors of this type will be designated in a simplified manner only as convex or concave. The concave mirror M3 ensures a good correction of the image field curvature in the projection optical system 12.

All six mirrors M1 to M6 of the projection optical system 12 are configured as free form faces which cannot be described by a rotationally symmetrical function. Other configurations of the projection optical system 12 are also possible, in which at least one of the mirrors M1 to M6 has a free form reflection face of this type.

The production of a free form face of this type is described in EP 1 950 594 A1.

The free form face may be described mathematically by the following equation:

$$Z = \frac{cr^2}{1 + \sqrt{1 - (1+k)c^2 r^2}} + \sum_{j=2}^{N} C_j X^m Y^n$$

wherein:

$$j = \frac{(m+n)^2 + m + 3n}{2} + 1$$

Z is the arrow height of the free form face. $r^2 = x^2 + y^2$ applies. c is a constant, which corresponds to the vertex curvature of a corresponding asphere. k corresponds to a conical constant of a corresponding asphere. $C_j$ are coefficients of the monomials $X^m Y^n$. Typically, the values of c, k and $C_j$ are determined on the basis of the desired optical properties of the mirror within the projection optical system 12. The order of the monomial, m+n, may be varied as desired. A monomial of a higher order may lead to a design of the projection optical system with better image error correction, but is more complex to calculate. m+n may adopt values of between 3 and more than 20.

Free form faces may also be described mathematically by Zernike polynomials, which are described, for example, in the manual of optical design programs CODE V®. Alternatively, free form faces can be described with the aid of two-dimensional spline surfaces. Examples of this are Bezier curves or non-uniform rational basis splines (NURBS). Two-dimensional spline surfaces may, for example, be described by a network of points in an xy-plane and associated z-values or by these points and pitches associated with them. Depending on the respective type of spline surface, the complete surface is obtained by interpolation between the network points using, for example, polynomials or functions, which have specific properties with regard to their continuity and differentiability. Examples of this are analytical functions.

That region in the imaging beam path of the projection optical system 12 is designated a pupil, in which individual beams proceeding from the object field points intersect, which, relative to the main beams 24 proceeding from these object field points are in each case associated with the same illumination angle. That plane, in which these intersection points of the individual beams 23 are located or which comes closest to the spatial distribution of these intersection points, which does not absolutely have to lie precisely on the plane, can be called the pupil plane.

Those individual beams 23, which proceed from spaced-apart object field points and are associated with the same illumination direction, run between the object plane 11 and the first mirror M1 divergently into the projection optical system 12. This will also be called a negative back focus of an entry pupil of the projection optical system 12 below. The entry pupil of the projection optical system 12 according to FIG. 4 does not lie within the projection optical system 12, but in the beam path in front of the object field 9. This makes it possible, for example, to arrange a pupil component of the illumination optical system 10, in other words, for example, the pupil facet mirror 7, in the entry pupil of the projection optical system 12, in the beam path in front of the projection optical system 12, without further imaging optical components having to be present between this pupil component and the object plane 11. In this case, the following optical system 8 is dispensed with in the illumination optical system 10.

As an alternative to this, a positive back focus of the entry pupil is also possible, or as a further alternative, an object-side telecentric beam path of the projection optical system 12.

The individual beams 23 belonging to a specific illumination direction of the nine object field points intersect in a pupil plane 25 of the projection optical system 12 between the mirrors M2 and M3. The pupil plane 25 is mechanically accessible, so an aperture stop can be arranged there, without shadowing or impeding the other beam path of the illumination light 3 between the object field 9 and the image field 13.

The mirrors M1 to M4 image the object field 9 in an intermediate image plane 26, which is arranged between the mirrors M4 and M5.

The mirror M5, which, together with the mirror M6, images the illumination or imaging light 3 from the intermediate image plane 26 into the image field 13, is arranged close to a further pupil plane, which is conjugated with the pupil plane 25, of the projection optical system 12. This further pupil plane is located in the beam path of the imaging light 3 between the mirror M5 and the mirror M6.

Figure 5:
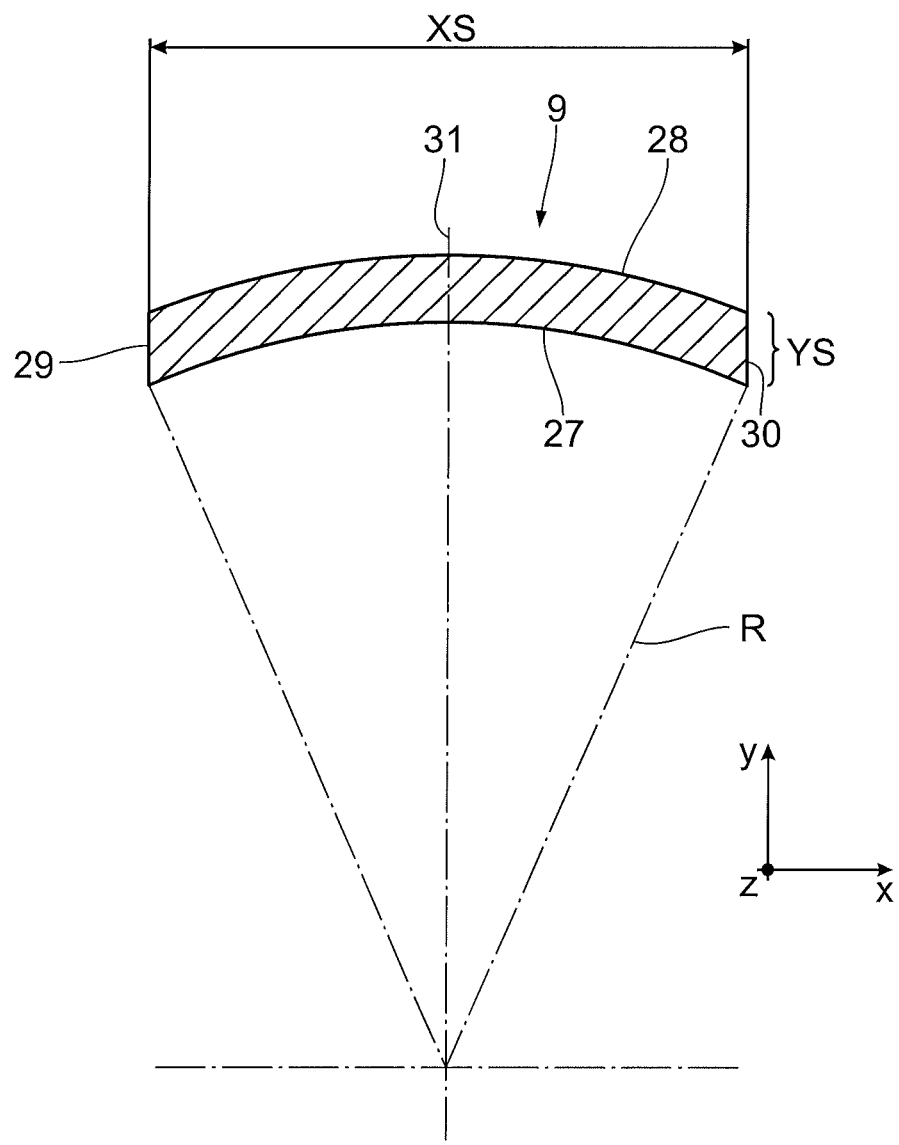
FIG. 5 shows a plan view of an object field which can be illuminated by the illumination optical system according to FIG. 1 and imaged by the projection optical system according to FIG. 4.

FIG. 5 shows a plan view, in an enlarged manner, of the object field 9 of the projection optical system 12 according to FIG. 4. The associated image field 13, regardless of the fact that it is reduced by the reduction scale of the projection optical system 12 according to FIG. 4, has precisely the same form. The object field 9 has the form of an arc field, which is limited by two part circles 27, 28, which are displaced in parallel with one another in the y-direction by a spacing YS (scan slot length). The inner one of the two part circles, the circle 27, has a radius R. The radius R in a first configuration of the projection optical system 12 according to FIG. 4 in the object field 9 is 400 mm. The corresponding radius R of the image field 13 in the projection optical system 12 in accordance with the reduction scale is 100 mm.

The extent of the object field 9 or the image field 13 along the y-direction is also called the transverse dimension of the object field 9 or of the image field 13.

The object field 9 is also limited by two boundary lines 29, 30 which in each case connect the two ends of the part circles 27, 28 and extend parallel to a mirror plane 31 of symmetry of the object field 9, which is perpendicular to the xy-plane. The two boundary lines 29, 30 have a spacing XS with respect to one another, the so-called scan slot width.

The optical design data of the reflection faces of the mirrors M1 to M6 of the projection optical system 12 according to FIG. 4 may be inferred from the following tables. The first of these tables gives, for the optical components and for the aperture stop, in each case, the reciprocal value of the vertex curvature (radius) and a spacing value (thickness), which corresponds to the z-spacing of adjacent elements in the beam path, proceeding from the object plane 11. The second table gives the coefficients $C_j$ of the monomials $X^m Y^n$ in the free form face equation given above for the mirrors M1 to M6.

N-radius designates a standardisation value $R^{m+n}$, which is inserted in the formula introduced above for the area description as follows:

$$Z = \frac{cr^2}{1+\sqrt{1-(1+k)c^2r^2}} + \sum_{j=2}^{N} \frac{C_j}{R^{m+n}} X^m Y^n$$

| Surface | Radius | Thickness | Operating mode |
| --- | --- | --- | --- |
| Object plane | infinite | 1715.894 | |
| M1 | −2207.484 | −1158.582 | REFL |
| M2 | −90154.738 | 498.932 | REFL |
| Stop | infinite | 260.082 | |
| M3 | 566.867 | −603.150 | REFL |
| M4 | 948.660 | 1198.155 | REFL |
| M5 | 644.470 | −452.234 | REFL |
| M6 | 555.685 | 526.540 | REFL |
| Image plane | infinite | 0.000 | |

| Coefficient | M1 | M2 | M3 | M4 | M5 | M6 |
| --- | --- | --- | --- | --- | --- | --- |
| K | 0.000000E+00 | 0.000000E+00 | 0.000000E+00 | 0.000000E+00 | 0.000000E+00 | 0.000000E+00 |
| Y | 0.000000E+00 | 0.000000E+00 | 0.000000E+00 | 0.000000E+00 | 0.000000E+00 | 0.000000E+00 |
| X2 | 3.944134E−06 | 1.404973E−05 | −9.781153E−06 | −5.543586E−07 | 1.302744E−06 | −1.190201E−05 |
| Y2 | −1.828593E−07 | −6.377267E−06 | −1.031184E−06 | 8.325516E−07 | 5.314583E−06 | −1.112356E−05 |
| X2Y | −4.941921E−09 | 3.109417E−08 | 1.568817E−07 | 2.069423E−09 | −4.861590E−07 | −2.829547E−09 |
| Y3 | −3.065567E−09 | 3.814488E−08 | 2.272650E−07 | 1.976753E−09 | −4.056309E−07 | 2.675306E−09 |
| X4 | −1.431837E−11 | −4.549179E−10 | −2.146317E−09 | 1.074253E−11 | 2.862867E−09 | 4.746677E−12 |
| X2Y2 | −7.294784E−12 | −1.096591E−09 | −2.317369E−09 | 3.720133E−12 | 4.844109E−09 | 2.289964E−12 |
| Y4 | −2.945652E−12 | −1.704039E−10 | −1.549015E−09 | −1.918067E−12 | 2.214187E−09 | 5.218548E−12 |

-continued

| Coefficient | M1 | M2 | M3 | M4 | M5 | M6 |
|---|---|---|---|---|---|---|
| X4Y | 3.415683E−14 | 2.932234E−13 | 2.007659E−11 | 7.497194E−14 | 3.423406E−12 | −5.312960E−14 |
| X2Y3 | −1.793988E−14 | 2.906948E−12 | 3.530795E−11 | −2.472491E−14 | 1.854704E−11 | −1.146371E−13 |
| Y5 | −7.010487E−16 | −1.000023E−12 | 5.307729E−13 | −4.058022E−16 | 1.659331E−11 | −4.860458E−14 |
| X6 | −5.026556E−17 | −5.312630E−16 | 3.589473E−15 | −4.073204E−18 | 2.595741E−13 | 1.382552E−16 |
| X4Y2 | −1.704047E−16 | −1.016210E−14 | 2.259403E−13 | 2.327452E−16 | 1.011648E−12 | 5.100381E−16 |
| X2Y4 | −5.054827E−17 | −1.861679E−14 | 4.807447E−14 | −5.319875E−17 | 3.159346E−13 | 5.649418E−16 |
| Y6 | −6.233435E−18 | −8.716496E−17 | −4.771466E−14 | 1.056536E−17 | −2.796023E−13 | 1.904290E−16 |
| X6Y | 3.602039E−19 | 3.348913E−17 | 1.189607E−16 | −2.274352E−19 | −3.965784E−15 | −3.581964E−19 |
| X4Y3 | 2.143249E−19 | 1.511365E−16 | 1.622416E−15 | 2.868472E−19 | −1.076836E−14 | −1.168350E−18 |
| X2Y5 | 1.161326E−19 | 5.615798E−17 | −1.222372E−15 | 2.816277E−21 | −1.221893E−14 | −9.505895E−19 |
| Y7 | 7.961066E−22 | 9.381051E−18 | −1.772222E−16 | −7.536615E−15 | −1.471683E−19 |  |
| X8 | −3.640867E−23 | −1.687235E−20 | −1.296068E−19 | −3.850942E−23 | −8.931996E−18 | 7.547908E−22 |
| X6Y2 | −1.023050E−21 | −3.085213E−19 | −2.537843E−18 | −1.169904E−21 | −3.834309E−17 | 3.344785E−21 |
| X4Y4 | 3.028641E−22 | −7.040607E−19 | 9.196973E−19 | 2.927225E−22 | 5.855013E−17 | 6.284467E−21 |
| X2Y6 | 3.239429E−23 | 1.428498E−19 | −1.821503E−17 | 1.579277E−22 | 2.520268E−16 | 4.700019E−21 |
| Y8 | −3.537201E−24 | −8.359148E−21 | −2.128984E−18 | 1.698418E−24 | 3.032694E−17 | 9.759308E−22 |
| X8Y | 7.459119E−26 | 1.537777E−24 | −7.953709E−21 | −3.053095E−25 | 3.267740E−19 | −2.025141E−24 |
| X6Y3 | 1.208972E−24 | 9.254187E−22 | −3.568761E−20 | −2.320691E−24 | 1.648190E−18 | −9.813382E−24 |
| X4Y5 | −1.045821E−24 | 1.150424E−21 | −4.051226E−20 | 5.044676E−25 | 4.218185E−18 | −1.594355E−23 |
| X2Y7 | −3.375889E−25 | −1.194620E−21 | −1.059746E−19 | 1.372226E−25 | 5.280368E−18 | −9.408245E−24 |
| Y9 | −1.341595E−26 | −5.268920E−23 | −1.679037E−20 | 2.208003E−26 | 6.570853E−19 | −1.375174E−24 |
| X10 | 2.448397E−29 | 1.037237E−25 | −8.323044E−24 | −2.454759E−29 | 8.132219E−22 | 6.599322E−27 |
| X8Y2 | −3.546031E−29 | 3.090916E−25 | −4.918920E−23 | −2.777086E−28 | 6.956406E−21 | 3.643467E−26 |
| X6Y4 | −5.162232E−28 | −8.861590E−25 | −1.281099E−22 | −1.442364E−27 | 1.930921E−20 | 8.637716E−26 |
| X4Y6 | 7.259007E−28 | −1.013890E−25 | −1.389358E−22 | 5.124991E−28 | 3.341465E−20 | 9.414062E−26 |
| X2Y8 | 2.521126E−28 | 1.956583E−24 | −2.277347E−22 | −5.363091E−29 | 2.794363E−20 | 4.259016E−26 |
| Y10 | 1.643000E−29 | 1.128324E−25 | −4.131545E−23 | −4.165055E−30 | 2.583987E−21 | 6.903764E−27 |
| Nradius | 1.156069E+00 | 1.156069E+00 | 1.156069E+00 | 1.156069E+00 | 1.156069E+00 | 1.156069E+00 |

FIG. 6 shows a further configuration of a projection optical system 32, which can be used instead of the projection optical system 12 in the projection exposure system 1. Components or reference variables, which correspond to those, which have already been described above with reference to FIGS. 1 to 5, have the same reference numerals and will not be discussed again in detail.

Basically, the structure of the projection optical system 32 according to FIG. 6 corresponds to that of the projection optical system 12 according to FIG. 4. A substantial difference is that the radius R of the object field 9 in the projection optical system 32 is 250 mm. The radius of the image field 13 is correspondingly 62.5 mm. The object field 9 and the image field 13 are thus substantially more strongly curved in the projection optical system 32 than in the projection optical system 12.

The optical design data of the reflection faces of the mirrors M1 to M6 of the projection optical system 32 can be inferred from the following tables, which correspond to the tables on the projection optical system according to FIG. 4.

| Surface | Radius | Thickness | Operating mode |
|---|---|---|---|
| Object plane | infinite | 1718.230 |  |
| M1 | −2206.059 | −1158.713 | REFL |
| M2 | −97862.835 | 502.097 | REFL |
| Stop | infinite | 251.443 |  |
| M3 | 566.109 | −603.402 | REFL |
| M4 | 948.170 | 1199.811 | REFL |
| M5 | 645.031 | −450.209 | REFL |
| M6 | 556.390 | 526.137 | REFL |
| Image plane | infinite | 0.000 |  |

| Coefficient | M1 | M2 | M3 | M4 | M5 | M6 |
|---|---|---|---|---|---|---|
| K | 0.000000E+00 | 0.000000E+00 | 0.000000E+00 | 0.000000E+00 | 0.000000E+00 | 0.000000E+00 |
| Y | 0.000000E+00 | 0.000000E+00 | 0.000000E+00 | 0.000000E+00 | 0.000000E+00 | 0.000000E+00 |
| X2 | 2.476720E−06 | 9.305509E−06 | −4.875943E−06 | 3.760601E−07 | 4.722663E−06 | −8.822404E−06 |
| Y2 | −3.606949E−07 | −4.975142E−06 | −2.405405E−07 | 9.980364E−07 | 2.322883E−06 | −8.953779E−06 |
| X2Y | −6.338619E−09 | 2.251930E−08 | 1.596846E−07 | 2.183065E−09 | −3.531721E−07 | 5.902310E−10 |
| Y3 | −3.207737E−09 | 2.489371E−08 | 1.895165E−07 | 9.947794E−10 | −3.235813E−07 | 5.259488E−09 |
| X4 | −1.395870E−11 | −4.669327E−10 | −2.037128E−09 | 1.160757E−11 | 2.685432E−09 | 1.589061E−11 |
| X2Y2 | −4.995708E−12 | −1.005020E−09 | −1.875449E−09 | 2.972624E−12 | 3.832468E−09 | 2.443942E−11 |
| Y4 | −3.150050E−12 | −1.628884E−10 | −1.268000E−09 | −5.802260E−13 | 1.852850E−09 | 1.391673E−11 |
| X4Y | 2.182446E−14 | 1.974129E−13 | 2.242638E−11 | 6.186620E−14 | −4.053689E−13 | −5.595759E−14 |
| X2Y3 | −1.495388E−14 | 2.228949E−12 | 2.857248E−11 | −3.196206E−14 | 3.232229E−11 | −1.342033E−13 |
| Y5 | −1.299854E−15 | −9.405493E−13 | 2.198428E−12 | −8.834601E−16 | 2.206795E−11 | −6.377158E−14 |
| X6 | −1.496093E−16 | −3.696595E−16 | 6.843163E−17 | 2.106462E−16 | 2.547868E−13 | 1.831653E−16 |
| X4Y2 | −1.181951E−16 | −7.579027E−15 | 2.261987E−13 | 1.767659E−16 | 1.048404E−12 | 6.645128E−16 |
| X2Y4 | −5.234558E−17 | −1.840810E−14 | −7.868547E−14 | −3.367574E−17 | 4.653243E−13 | 7.273029E−16 |
| Y6 | −7.011186E−18 | −2.273215E−16 | −5.881065E−14 | 1.125919E−17 | −2.814835E−13 | 2.553243E−16 |
| X6Y | 3.563578E−20 | 2.665788E−17 | 2.334597E−16 | 5.205048E−20 | −3.436184E−15 | −3.855364E−19 |
| X4Y3 | 1.576151E−19 | 1.178128E−16 | 1.905591E−15 | 2.814810E−19 | −1.190690E−14 | −1.147018E−18 |
| X2Y5 | 8.234406E−20 | 5.837055E−17 | −1.275417E−15 | 6.975384E−21 | −1.484315E−14 | −7.609955E−19 |

-continued

| Coefficient | M1 | M2 | M3 | M4 | M5 | M6 |
|---|---|---|---|---|---|---|
| Y7 | 7.928051E−22 | 8.016905E−18 | −1.980583E−16 | 1.675319E−21 | −9.076707E−15 | −1.296533E−19 |
| X8 | −1.351158E−23 | −1.514317E−20 | −8.546129E−20 | 3.673454E−23 | −8.049612E−18 | 9.138728E−22 |
| X6Y2 | 9.136218E−23 | −2.262384E−19 | −1.293762E−18 | 2.035835E−22 | −3.428225E−17 | 4.019705E−21 |
| X4Y4 | 1.217750E−22 | −4.557617E−19 | 5.839925E−18 | 9.888590E−22 | 7.897231E−17 | 6.767444E−21 |
| X2Y6 | 3.777958E−23 | 1.754370E−19 | −1.096470E−17 | 9.185971E−23 | 2.589767E−16 | 4.353008E−21 |
| Y8 | −1.147426E−24 | −3.182359E−21 | −1.542770E−18 | −1.934399E−25 | 2.811562E−17 | 8.551744E−22 |
| X8Y | −1.880382E−26 | −1.852426E−24 | −7.718379E−21 | 1.394945E−25 | 2.810342E−19 | −2.296127E−24 |
| X6Y3 | −4.858272E−25 | 4.369651E−22 | −3.072406E−20 | 7.425185E−25 | 1.814876E−18 | −1.044172E−23 |
| X4Y5 | −5.230332E−25 | 3.272886E−22 | −1.447244E−20 | 2.440397E−24 | 4.942891E−18 | −1.587384E−23 |
| X2Y7 | −2.221082E−25 | −1.305854E−21 | −6.310080E−21 | 1.958521E−25 | 5.622597E−18 | −9.049360E−24 |
| Y9 | −1.082999E−26 | −3.718772E−23 | −1.350725E−20 | 3.280081E−26 | 6.439151E−19 | −8.965376E−25 |
| X10 | 1.230055E−29 | 7.557711E−26 | −9.783298E−24 | −2.206201E−31 | 6.699570E−22 | 7.728826E−27 |
| X8Y2 | 6.992811E−29 | 3.415831E−25 | −4.923798E−23 | 4.348419E−28 | 6.757513E−21 | 4.374342E−26 |
| X6Y4 | 4.414591E−28 | 1.696061E−25 | −1.276773E−22 | 1.215158E−27 | 2.179366E−20 | 1.012533E−25 |
| X4Y6 | 3.555369E−28 | 8.298611E−25 | −9.542249E−23 | 2.285914E−27 | 3.644510E−20 | 1.104028E−25 |
| X2Y8 | 1.503038E−28 | 1.982530E−24 | −1.509712E−22 | 2.033490E−28 | 2.795631E−20 | 5.238522E−26 |
| Y10 | 1.221013E−29 | 5.971944E−26 | −3.617937E−23 | 2.819248E−29 | 2.030488E−21 | 8.149163E−27 |
| Nradius | 1.156069E+00 | 1.156069E+00 | 1.156069E+00 | 1.156069E+00 | 1.156069E+00 | 1.156069E+00 |

Figure 7:
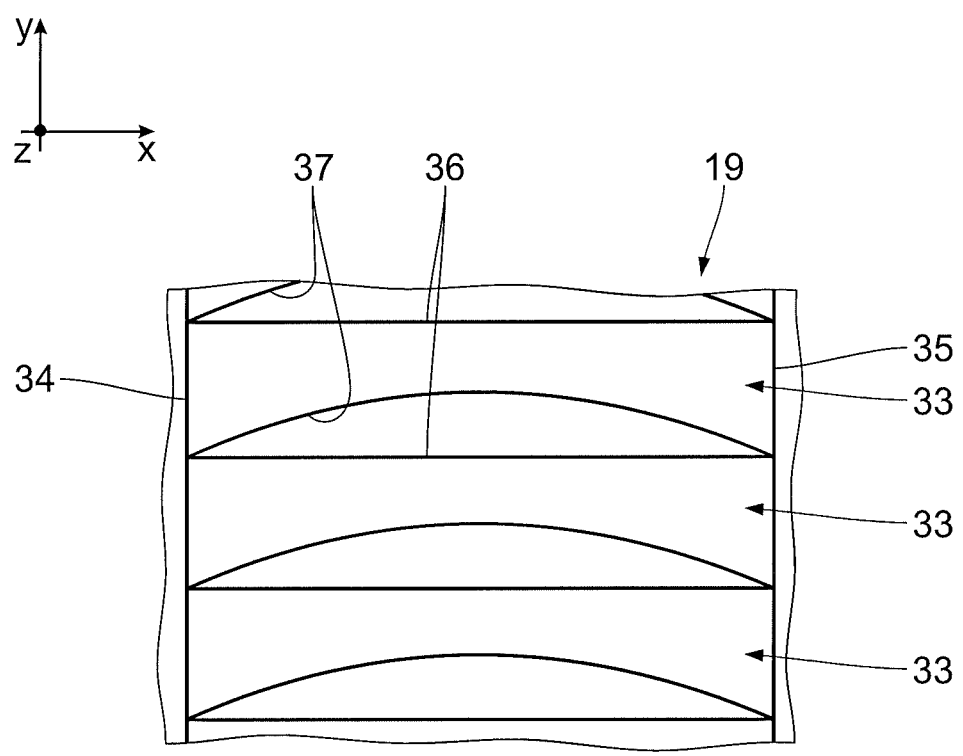
FIG. 7 shows, highly enlarged in comparison to FIGS. 2 and 3, a detail of a facet block of a further configuration of a field facet mirror of the illumination optical system, also in a plan view.

FIG. 7 shows a detail of a facet block 19 of a further field facet mirror, which can be used in a variant of the illumination optical system 10 instead of the field facet mirror 6 according to FIG. 2 or 3. Three field facets 33 are shown, which are used in accordance with the field facets 18 of the configurations of the field facet mirror 6 according to FIG. 2 or 3 for channel-wise illumination of an object field. Components which correspond to those, which have already been described above in conjunction with the field facet mirrors 2 and 3, have the same reference numerals and will not be discussed again in detail.

The field facets 33 are limited by two straight narrow sides 34, 35, which extend parallel to the y-direction. Furthermore, each of the field facets 33 is limited by a longitudinal side 36 which runs straight and by a longitudinal side 37 which extends concavely in an arcuate manner. Overall, the view shown in FIG. 7 of the field facets 33 is reminiscent of the side view of a bridge with a single bridge arc.

The x/y-aspect ratio of the field facets 33 corresponds to the aspect ratio, which has already been described above in conjunction with the field facets 18 of the field facet mirrors 6 according to FIGS. 2 and 3.

Figure 8:
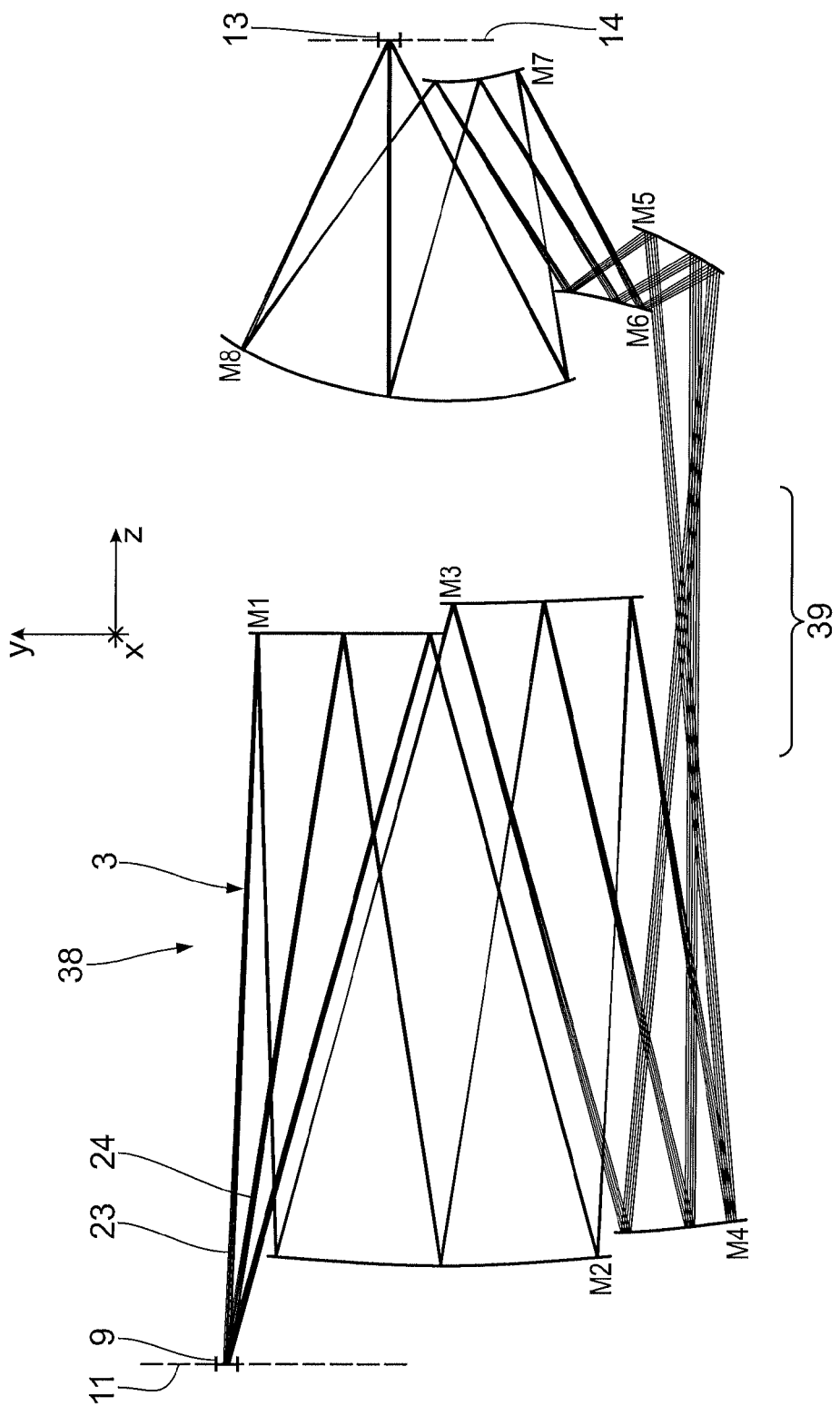
FIG. 8 shows, in a view similar to FIG. 4, a further configuration of a projection optical system for imaging an object field which can be illuminated with the field facets in the configuration according to FIG. 7.

FIG. 8 shows a section, which belongs to two further configurations of a projection optical system 38, which can be used instead of the projection optical system 12 in the projection exposure system 1. The section according to FIG. 8 contains centres of the object field 9 and the image field 13 and also extends parallel to the narrow sides of the respective object field. Components or reference variables, which correspond to those, which were already described above with reference to FIGS. 1 to 7, have the same reference numerals and will not be described again in detail. The two configurations of the projection optical system 38 differ only with regard to the details of the description of the precise form of the reflection faces of the mirrors, these detailed changes producing form changes, which cannot be seen in the view according to FIG. 8.

The projection optical system 38 in total has eight reflective mirrors, which, proceeding from the object field 9 in the sequence of the beam path of the illumination light 3 are designated mirrors M1 to M8. The mirrors M1 to M8 all, in total, also have reflection free form faces which cannot be described by a rotationally symmetrical function. The mirror M1 has a radius of curvature which is so large that it practically appears to be a planar mirror in the view of FIG. 8. The mirrors M2, M4, M5 and M8 have a concave basic form. The mirrors M3, M6 and M7 have a convex basic form.

The mirrors M1 to M8, on the one hand, and the mirrors M3 to M8, on the other hand, are arranged back to back. The mirrors M2 and M4, on the one hand, and the mirrors M1 to M3, on the other hand, are arranged at an adjacent height with regard to their z-position.

The projection optical system 38 has a positive back focus of the entry pupil. A first pupil plane of the projection optical system 38 is arranged in the region of the mirror M2. The reflection face of the mirror M2 may be designed such that the mirror M2 simultaneously adopts the function of an aperture stop in the projection optical system 38. An intermediate image region 39 of the projection optical system 38 is located between the mirrors M4 and M5. A further pupil plane of the projection optical system 38 is located between the mirrors M7 and M8.

Figure 9:
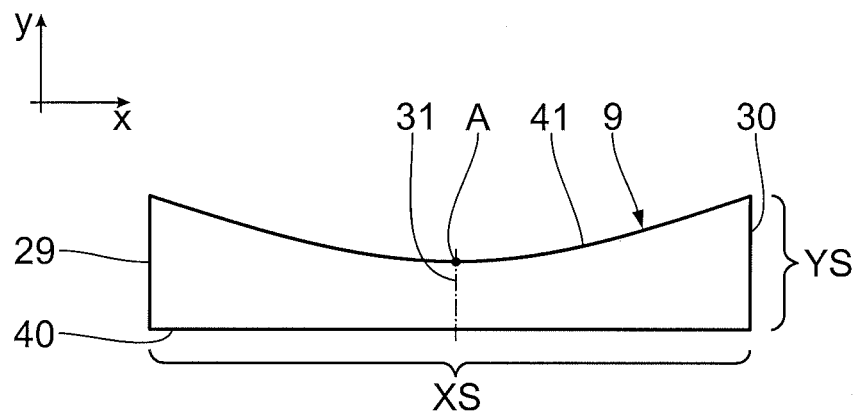
FIG. 9 shows, in a view similar to FIG. 5, a field form of an object field which can be imaged by the projection optical system according to FIG. 8.

The following tables give the optical design data of the reflection faces of the mirrors M1 to M8 of the projection optical system 38 in accordance with the free form face formulae given above, with which a free form of the object field 9 shown in FIG. 9 can be imaged. These tables correspond with regard to the structure to the tables on the projection optical system 12 according to FIG. 4.

| Surface | Radius | Thickness | Operating mode |
|---|---|---|---|
| Object plane | infinite | 1098.330 | |
| M1 | 153511.132 | −949.171 | REFL |
| M2 | 2160.649 | 0.000 | REFL |
| Stop | infinite | 992.953 | |
| M3 | 3646.180 | −955.841 | REFL |
| M4 | 2784.535 | 1576.656 | REFL |
| M5 | −737.433 | −137.143 | REFL |
| M6 | −1009.074 | 299.414 | REFL |
| M7 | 393.502 | −480.902 | REFL |
| M8 | 587.807 | 543.183 | REFL |
| Image plane | infinite | 0.000 | |

| Coefficient | M1 | M2 | M3 | M4 |
|---|---|---|---|---|
| K | 0.000000E+00 | 0.000000E+00 | 0.000000E+00 | 0.000000E+00 |
| Y | 0.000000E+00 | 0.000000E+00 | 0.000000E+00 | 0.000000E+00 |
| X2 | 8.706684E−06 | −1.358492E−07 | 2.139546E−06 | −1.247612E−06 |
| Y2 | 7.286096E−07 | 1.154149E−06 | −1.869118E−08 | −1.615452E−06 |
| X2Y | −7.623198E−08 | −1.456070E−08 | −8.438450E−08 | 1.730158E−09 |
| Y3 | −1.941115E−08 | 9.488865E−09 | −5.019599E−09 | 1.115071E−08 |
| X4 | 1.568548E−10 | −6.312509E−12 | −3.242204E−10 | −1.243674E−10 |
| X2Y2 | 6.285002E−10 | −2.472255E−11 | −6.229378E−10 | −5.041593E−11 |
| Y4 | 3.456979E−11 | −3.074067E−12 | −1.453307E−10 | −3.200257E−11 |
| X4Y | −5.477190E−13 | −5.196812E−14 | 9.020864E−14 | −6.199786E−13 |
| X2Y3 | −3.173999E−12 | −8.414628E−14 | −4.537760E−13 | 1.408892E−13 |
| Y5 | 1.864571E−13 | −2.708654E−14 | 4.009072E−13 | 5.531353E−14 |
| X6 | −3.505167E−18 | 4.560936E−18 | 2.066143E−16 | 3.106024E−16 |
| X4Y2 | 2.672277E−15 | −4.795758E−17 | −7.830767E−17 | −2.788023E−15 |
| X2Y4 | 1.697043E−14 | −4.173397E−17 | −4.320480E−15 | −2.955739E−16 |
| Y6 | 5.218421E−16 | −3.793159E−17 | −5.017415E−16 | −5.089571E−17 |
| X6Y | −5.174777E−18 | 2.473488E−21 | 7.949569E−19 | 2.532443E−18 |
| X4Y3 | −2.311987E−17 | 1.523615E−19 | 9.012916E−18 | −5.104267E−18 |
| X2Y5 | −5.947650E−17 | 2.248632E−19 | −1.142173E−17 | −4.433585E−19 |
| Y7 | −4.352516E−18 | 5.056982E−20 | −2.775533E−18 | −7.316439E−20 |
| X8 | 3.769836E−21 | 4.576615E−23 | 3.253920E−22 | −2.665927E−21 |
| X6Y2 | 7.852383E−20 | −2.547129E−23 | 2.281390E−20 | 1.221707E−21 |
| X4Y4 | 1.435929E−19 | 2.671114E−22 | 6.514380E−20 | −5.382327E−21 |
| X2Y6 | 1.262466E−19 | 2.528621E−22 | −1.666109E−20 | −6.785096E−22 |
| Y8 | 7.930698E−21 | 7.851768E−23 | −2.791981E−21 | −2.061091E−22 |
| X8Y | −7.402832E−23 | 5.594367E−26 | 5.466469E−26 | −1.631974E−23 |
| X6Y3 | −4.195517E−22 | 6.688034E−25 | 6.603642E−23 | −1.789391E−23 |
| X4Y5 | −4.617833E−22 | 5.230063E−25 | 9.545295E−23 | −3.940392E−24 |
| X2Y7 | −1.598117E−22 | −4.016112E−25 | −5.951364E−23 | −1.346733E−24 |
| Y9 | −6.986220E−24 | −4.354973E−25 | −7.139628E−24 | −1.781484E−25 |
| X10 | 2.697541E−26 | 8.392558E−28 | −2.763390E−27 | −1.664701E−27 |
| X8Y2 | 2.429468E−25 | 4.354108E−27 | −1.821931E−26 | −2.575227E−26 |
| X6Y4 | 7.263483E−25 | 9.739146E−27 | 2.208093E−26 | −3.205953E−26 |
| X4Y6 | 5.320783E−25 | 7.290240E−27 | −1.577087E−26 | −6.751192E−27 |
| X2Y8 | 9.256738E−26 | 1.662822E−27 | −9.678788E−26 | −3.716723E−27 |
| Y10 | 5.515771E−27 | −4.905872E−28 | −1.344000E−26 | −5.402532E−28 |
| Nradius | 1.000000E+00 | 1.000000E+00 | 1.000000E+00 | 1.000000E+00 |

| Coefficient | M5 | M6 | M7 | M8 |
|---|---|---|---|---|
| K | 0.000000E+00 | 0.000000E+00 | 0.000000E+00 | 0.000000E+00 |
| Y | 0.000000E+00 | 0.000000E+00 | 0.000000E+00 | 0.000000E+00 |
| X2 | 3.449124E−06 | −7.856936E−06 | −2.921415E−05 | −6.203525E−06 |
| Y2 | 4.071531E−07 | 1.614327E−06 | 2.403781E−05 | −6.622373E−06 |
| X2Y | 8.947776E−09 | −1.009113E−07 | 7.563272E−08 | 8.392422E−09 |
| Y3 | −1.090617E−08 | −1.157762E−09 | −1.592754E−07 | 1.072072E−08 |
| X4 | 2.847887E−10 | 1.014886E−09 | 2.010026E−09 | −3.747419E−12 |
| X2Y2 | 2.524867E−10 | 1.767168E−10 | 3.046468E−09 | 1.381907E−11 |
| Y4 | 1.873867E−11 | 3.002758E−11 | 3.183705E−09 | 1.297025E−11 |
| X4Y | 2.512952E−12 | 1.196988E−11 | −5.313573E−12 | −2.357534E−14 |
| X2Y3 | 1.159661E−13 | 3.797763E−13 | −2.744864E−11 | −2.373431E−14 |
| Y5 | −1.720881E−14 | −1.729597E−13 | −1.483519E−11 | −2.365769E−14 |
| X6 | −3.695290E−15 | 9.158950E−14 | 7.770105E−14 | 2.418435E−17 |
| X4Y2 | 1.291223E−14 | 5.419668E−14 | 2.281940E−13 | 4.852774E−17 |
| X2Y4 | 1.120219E−15 | −1.415448E−15 | −7.883080E−14 | 4.240020E−17 |
| Y6 | 2.404681E−18 | 8.278547E−16 | −1.061466E−13 | 4.374604E−17 |
| X6Y | 3.807111E−18 | 1.246137E−15 | 1.906811E−16 | −2.696822E−21 |
| X4Y3 | 4.780479E−17 | 1.071977E−16 | 1.519383E−15 | 1.047432E−19 |
| X2Y5 | 7.503896E−18 | −2.332080E−17 | 6.139908E−16 | 1.024270E−20 |
| Y7 | −1.925267E−20 | 1.175990E−18 | −1.319640E−15 | −3.368051E−20 |
| X8 | 3.134682E−19 | 2.962326E−18 | 1.143712E−18 | 8.389618E−23 |
| X6Y2 | 2.743401E−19 | 6.429680E−18 | 5.100611E−19 | 2.855117E−22 |
| X4Y4 | 1.191875E−19 | 3.563327E−19 | 7.253233E−18 | 7.381074E−22 |
| X2Y6 | 1.616881E−20 | −1.971328E−20 | 2.931526E−17 | 8.204677E−22 |
| Y8 | 5.225335E−22 | 1.011407E−22 | −2.198482E−18 | 3.575178E−22 |
| X8Y | 1.506916E−21 | 2.293276E−20 | −4.326969E−21 | 1.202840E−25 |
| X6Y3 | 1.118569E−21 | 1.467902E−20 | −3.093226E−20 | 5.538439E−25 |
| X4Y5 | 1.327918E−22 | 1.602094E−21 | −1.076329E−20 | 3.997040E−25 |
| X2Y7 | 4.101738E−24 | 1.769434E−22 | 2.144228E−19 | 1.918840E−25 |
| Y9 | 1.020131E−25 | −2.150294E−24 | 5.684512E−21 | −1.287404E−25 |
| X10 | 3.923565E−25 | 6.456213E−24 | 3.170423E−23 | 3.121999E−28 |
| X8Y2 | 1.713390E−24 | 4.302419E−23 | 2.223254E−22 | 1.706159E−27 |
| X6Y4 | 1.312094E−24 | 1.273800E−23 | 6.044446E−22 | 5.248395E−27 |
| X4Y6 | 2.726007E−26 | 2.332703E−24 | 9.627642E−22 | 5.979725E−27 |
| X2Y8 | −1.054070E−26 | 3.059437E−25 | 1.030150E−21 | 2.977355E−27 |
| Y10 | −4.925473E−28 | −6.805779E−27 | 8.505841E−23 | 4.205959E−28 |
| Nradius | 1.000000E+00 | 1.000000E+00 | 1.000000E+00 | 1.000000E+00 |

The object field 9 according to FIG. 9 has a field form, which is similar to the form of the field facets 33. The object field 9 according to FIG. 9 is limited by two boundary lines 29, 30, which extend parallel to the y-direction and have an extent YS. Furthermore, the object field 9 according to FIG. 9 is limited by a further boundary line 40, which extends straight and which extends parallel to the x-direction and has an extent XS. That which was already stated above with regard to the other forms of the object field 9 applies to the XS/YS-aspect ratio.

The object field 9 according to FIG. 9 is limited toward the fourth side by a curved line in the form of a part circle 41, which has a radius of curvature of −300 mm. The sign convention, which leads to the negative sign of this radius of curvature, means that the part circle 41 when using the imaging optical system with the object field 9, on the one hand, limits the object field 9 as a convexly extending curved line and, on the other hand, is the object field limiting line which an object point scanned by the object field 9 in the y-direction passes on leaving the object field 9. The radius absolute value is calculated proceeding from a reference axis, which is simultaneously used as the reference axis to show the free form faces.

Figure 10:
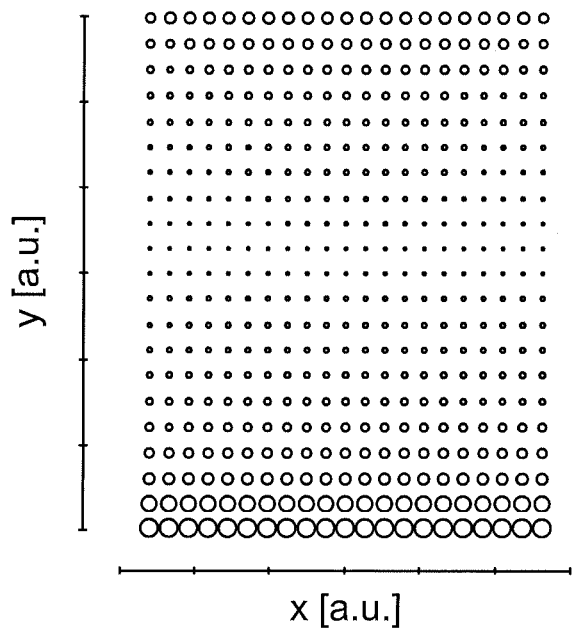
FIG. 10 shows a graph, which reproduces an imaging quality of the projection optical system according to FIG. 8 in the form of a spot size (rms value) over an image field, which includes the object field according to FIG. 9 imaged by the projection optical system.

FIG. 10 shows, as a measure of the imaging quality in an X/Y-graph, rms (root mean square) values for a point pattern size of beams of optically calculated point patterns over the object field 9 according to FIG. 9. These point patterns are also called the spot size. The value of the rms spot size is given by the diameter of the circles shown in FIG. 10.

In the Y-direction, the view according to FIG. 10 is substantially further drawn out than in the X-direction. The minimal rms spot size is $0.40011 \times 10^{-4}$ mm. The maximal rms spot size, which lies outside the object field used, is $4.5856 \times 10^{-4}$ mm.

FIG. 10 shows the rms spot sizes in a rectangular area of the object plane 11, inside which the object field 9 according to FIG. 9 is inscribed. It can be inferred from the graph according to FIG. 10 that the size of the rms spot size is very small precisely in the region of the field form of the object field 9 according to FIG. 9.

The object field 9 according to FIG. 9 may be illuminated with the field facets 33 according to FIG. 7.

Tables on optical design data of the reflection faces of the mirrors M1 to M8 of a further configuration of the projection optical system 38, with which a field form according to FIG. 11 can be imaged, are reproduced below. These tables in turn correspond to the tables on the projection optical system 12 according to FIG. 4.

| Surface | Radius | Thickness | Operating mode |
|---|---|---|---|
| Object plane | infinite | 1098.663 | |
| M1 | 151450.717 | −949.237 | REFL |
| M2 | 2160.654 | 0.000 | REFL |
| Stop | infinite | 992.757 | |
| M3 | 3646.803 | −955.941 | REFL |
| M4 | 2784.016 | 1578.502 | REFL |
| M5 | −737.402 | −137.176 | REFL |
| M6 | −1009.006 | 299.406 | REFL |
| M7 | 393.566 | −480.894 | REFL |
| M8 | 587.810 | 543.188 | REFL |
| Image plane | infinite | 0.000 | |

| Coefficient | M1 | M2 | M3 | M4 |
|---|---|---|---|---|
| K | 0.000000E+00 | 0.000000E+00 | 0.000000E+00 | 0.000000E+00 |
| Y | 0.000000E+00 | 0.000000E+00 | 0.000000E+00 | 0.000000E+00 |
| X2 | 8.554780E−06 | −1.543809E−07 | 2.213783E−06 | −1.005638E−06 |
| Y2 | 8.120223E−07 | 1.171410E−06 | −6.548621E−08 | −1.594793E−06 |
| X2Y | −7.450853E−08 | −1.499406E−08 | −8.569240E−08 | 2.190765E−09 |
| Y3 | −1.925399E−08 | 9.107231E−09 | −4.928303E−09 | 1.129958E−08 |
| X4 | 1.440776E−10 | −6.059890E−12 | −3.287590E−10 | −1.288225E−10 |
| X2Y2 | 6.231957E−10 | −2.403991E−11 | −6.313372E−10 | −5.229846E−11 |
| Y4 | 3.537330E−11 | −3.048282E−12 | −1.453140E−10 | −3.242838E−11 |
| X4Y | −5.011396E−13 | −4.506499E−14 | 9.913700E−14 | −6.482216E−13 |
| X2Y3 | −3.185489E−12 | −6.282614E−14 | −3.784334E−13 | 1.419864E−13 |
| Y5 | 1.803300E−13 | −2.087759E−14 | 3.977186E−13 | 5.596385E−14 |
| X6 | 3.345812E−16 | 4.328165E−20 | 1.982991E−16 | 5.076841E−16 |
| X4Y2 | 3.142979E−15 | −6.499339E−17 | −5.749019E−17 | −2.801087E−15 |
| X2Y4 | 1.728540E−14 | −4.598995E−17 | −4.283075E−15 | −2.850273E−16 |
| Y6 | 5.076059E−16 | −3.616405E−17 | −4.967646E−16 | −5.101384E−17 |
| X6Y | −6.397309E−18 | 9.149087E−21 | 8.017495E−19 | 3.643528E−18 |
| X4Y3 | −2.504242E−17 | 1.415321E−19 | 7.739262E−18 | −4.922536E−18 |
| X2Y5 | −5.980798E−17 | 1.878840E−19 | −1.283174E−17 | −4.702057E−19 |
| Y7 | −4.312324E−18 | 4.189615E−20 | −2.771730E−18 | −7.555197E−20 |
| X8 | −2.520482E−22 | −3.879962E−24 | 7.116653E−22 | −3.894819E−21 |
| X6Y2 | 7.716294E−20 | 3.407605E−23 | 2.818904E−20 | 3.280275E−22 |
| X4Y4 | 1.328360E−19 | 5.015290E−22 | 7.062420E−20 | −5.456486E−21 |
| X2Y6 | 1.234853E−19 | 3.557002E−22 | −1.567766E−20 | −7.080502E−22 |
| Y8 | 8.229993E−21 | 7.780181E−23 | −2.755472E−21 | −1.943559E−22 |
| X8Y | −6.143580E−23 | 1.286995E−25 | 3.422400E−24 | −2.501603E−23 |
| X6Y3 | −3.914329E−22 | 3.904601E−25 | 1.111206E−22 | −3.092891E−23 |
| X4Y5 | −3.887424E−22 | −9.987412E−26 | 1.511590E−22 | −5.196706E−24 |
| X2Y7 | −1.586571E−22 | −6.079798E−25 | −3.969459E−23 | −9.886581E−25 |
| Y9 | −6.493993E−24 | −4.098504E−25 | −7.501951E−24 | −1.967151E−25 |
| X10 | 3.257116E−26 | 1.001194E−27 | −7.711331E−27 | −3.025683E−27 |
| X8Y2 | 2.368244E−25 | 4.446467E−26 | −7.709779E−27 | −4.021635E−26 |
| X6Y4 | 6.548318E−25 | 9.169817E−27 | 1.093161E−25 | −4.945261E−26 |
| X4Y6 | 4.327394E−25 | 6.490295E−27 | 7.558475E−26 | −7.829256E−27 |
| X2Y8 | 1.060496E−25 | 1.237880E−27 | −6.966565E−26 | −3.154396E−27 |
| Y10 | 3.095939E−27 | −5.415966E−28 | −1.480211E−26 | −5.964689E−28 |
| Nradius | 0.000000E+00 | 0.000000E+00 | 0.000000E+00 | 0.000000E+00 |

-continued

| Coefficient | M5 | M6 | M7 | M8 |
|---|---|---|---|---|
| K | 0.000000E+00 | 0.000000E+00 | 0.000000E+00 | 0.000000E+00 |
| Y | 0.000000E+00 | 0.000000E+00 | 0.000000E+00 | 0.000000E+00 |
| X2 | 3.410084E−06 | −8.695784E−06 | −2.876830E−05 | −6.263620E−06 |
| Y2 | 3.127555E−07 | 1.606617E−06 | 2.353176E−05 | −6.622184E−06 |
| X2Y | 9.354598E−09 | −1.152831E−07 | 7.297341E−08 | 8.371398E−09 |
| Y3 | −1.078448E−08 | −1.060073E−09 | −1.568711E−07 | 1.057317E−08 |
| X4 | 2.604129E−10 | 1.519230E−09 | 2.181383E−09 | −4.873684E−12 |
| X2Y2 | 2.586841E−10 | 1.770169E−10 | 2.850821E−09 | 7.905163E−12 |
| Y4 | 1.888099E−11 | 2.992394E−11 | 3.206779E−09 | 1.141589E−11 |
| X4Y | 2.230002E−12 | 1.657028E−11 | −2.414645E−12 | −1.806345E−14 |
| X2Y3 | 8.574632E−14 | 5.048168E−13 | −2.526570E−11 | −1.521113E−14 |
| Y5 | −1.855619E−14 | −1.731695E−13 | −1.539652E−11 | −2.069372E−14 |
| X6 | 2.932857E−15 | 1.023217E−13 | 5.292033E−14 | 2.308661E−17 |
| X4Y2 | 1.305315E−14 | 5.651894E−14 | 2.349602E−13 | 5.768984E−17 |
| X2Y4 | 1.080595E−15 | −1.473143E−15 | −7.882243E−14 | 6.467355E−17 |
| Y6 | 4.298097E−18 | 8.412346E−16 | −1.062873E−13 | 4.889936E−17 |
| X6Y | 3.993301E−17 | 1.372061E−15 | 1.863089E−16 | 2.026168E−20 |
| X4Y3 | 5.285250E−17 | 4.377383E−17 | 1.688749E−15 | 1.590422E−19 |
| X2Y5 | 7.865882E−18 | −2.370242E−17 | 4.143261E−16 | 4.641772E−20 |
| Y7 | −2.061308E−20 | 1.119571E−18 | −1.276530E−15 | −2.472422E−20 |
| X8 | 5.363802E−19 | 2.783147E−18 | 2.069767E−18 | 1.012135E−22 |
| X6Y2 | 2.339470E−19 | 7.044881E−18 | 1.517395E−18 | 2.923146E−22 |
| X4Y4 | 1.230249E−19 | 3.458847E−19 | 1.111473E−17 | 7.776772E−22 |
| X2Y6 | 1.620718E−20 | −2.033613E−20 | 2.607999E−17 | 8.229671E−22 |
| Y8 | 5.094072E−22 | 1.826681E−22 | −2.288776E−18 | 3.569996E−22 |
| X8Y | 2.673097E−21 | 2.202888E−20 | −7.346261E−21 | 2.539059E−25 |
| X6Y3 | 6.411960E−22 | 1.619789E−20 | −2.590726E−20 | 5.102646E−25 |
| X4Y5 | 1.084164E−22 | 2.440628E−21 | 6.058006E−21 | 1.963259E−25 |
| X2Y7 | 1.268047E−24 | 1.823770E−22 | 1.560104E−19 | 9.302770E−26 |
| Y9 | 1.103157E−25 | −2.047209E−24 | 3.712384E−21 | −1.351840E−25 |
| X10 | −5.931777E−25 | −3.439303E−25 | 1.580347E−23 | 2.017711E−28 |
| X8Y2 | 3.315020E−24 | 4.279624E−23 | 1.445786E−22 | 1.838280E−27 |
| X6Y4 | 6.772854E−25 | 1.438556E−23 | 5.779722E−22 | 5.052149E−27 |
| X4Y6 | −6.434791E−27 | 3.809271E−24 | 8.173745E−22 | 4.926910E−27 |
| X2Y8 | −1.443034E−26 | 3.231595E−25 | 7.173598E−22 | 2.504960E−27 |
| Y10 | −3.953343E−28 | −7.332978E−27 | 7.790589E−23 | 4.100235E−28 |
| Nradius | 0.000000E+00 | 0.000000E+00 | 0.000000E+00 | 0.000000E+00 |

Figure 11:
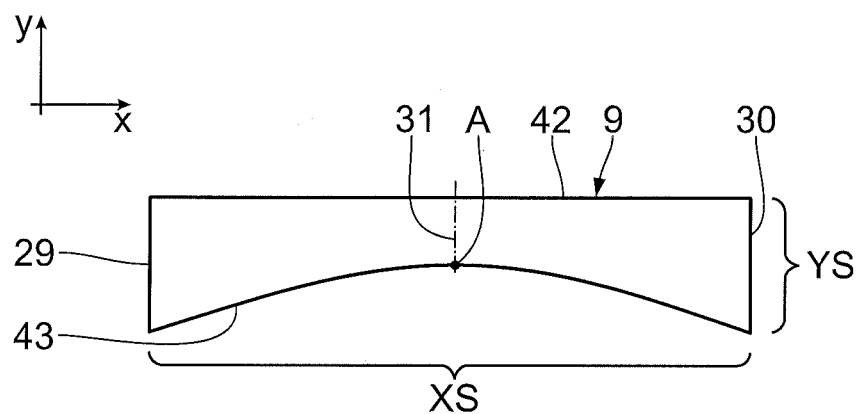
FIG. 11 shows, in a view similar to FIG. 9, a further field form of an object field which can be imaged with a variant of the projection optical system according to FIG. 8.

The object field 9 according to FIG. 11 has a form which is congruent with the object field 9 according to FIG. 9. The object field 9 according to FIG. 11 is again limited by boundary lines 29, 30 extending parallel to the y-direction, as well as a boundary line 42 also extending straight and parallel to the x-direction.

Toward the fourth side, the object field 9 according to FIG. 11 is limited by a curved line in the form of a part circle 43, which has a radius of R=300 mm. The sign of this radius of curvature is positive. This means that the part circle 43, on the one hand, limits the object field 9 in a concave manner and, on the other hand, during use within a projection exposure system designed as a scanner represents the object field limiting line which an object point scanned in the y-direction passes on entry into the object field 9. The radius absolute value is calculated proceeding from a reference axis, which is simultaneously used as the reference axis to show the free form faces.

The field form of the object field 9 according to FIG. 11 can also be illuminated with the field facets 33 according to FIG. 7.

Figure 12:
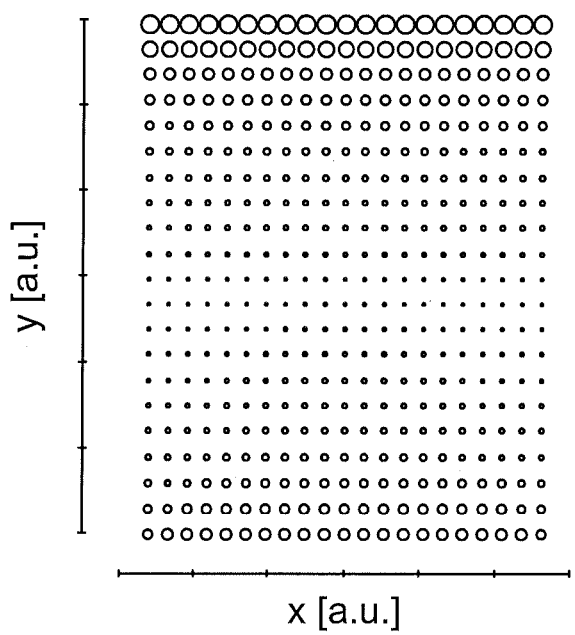
FIG. 12 shows a graph similar to FIG. 10 which reproduces an imaging quality of the projection optical system according to FIG. 8 in the form of the spot size (rms value) over the image field, which includes the object field according to FIG. 11 imaged by the projection optical system.

FIG. 12 shows, in a view similar to FIG. 10, the X/Y-distribution of the rms spot size for the respective variant of the projection optical system 38, with which the field form according to FIG. 11 can be imaged.

The minimal rms spot size is $0.39618 \times 10^{-4}$ mm. The maximal rms spot size, which lies outside the object field 9 used, is $3.932 \times 10^{-4}$ mm.

FIG. 12 shows the rms spot sizes in a rectangular region of the object plane 11, within which the object field 9 according to FIG. 11 is inscribed. It can be inferred from the graph according to FIG. 12 that the size of the rms spot size is very small precisely in the region of the field form of the object field 9 according to FIG. 11.

Figure 13:
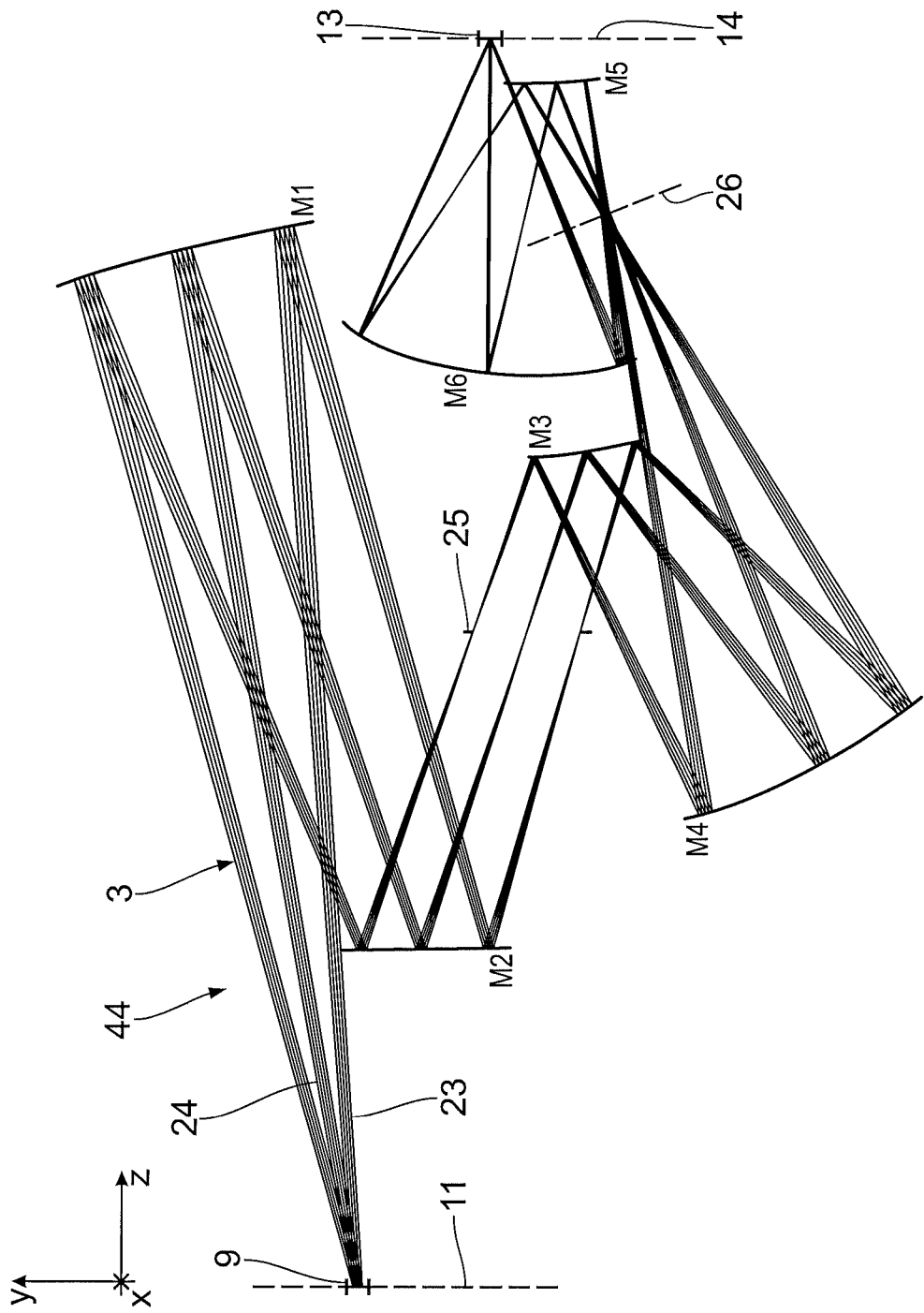
FIG. 13 shows, in a view similar to FIG. 4, a further configuration of a projection optical system.

FIG. 13 shows a section, which contains centres of the object field 9 and the image field 13 and also extends parallel to the narrow sides of the respective object field, which will be described below. Components and reference numerals which correspond to those which have already been described above with reference to FIGS. 1 to 12, have the same reference numerals and will not be described again in detail.

The projection optical system 44 according to FIG. 3, with regard to the basic structure, corresponds to the projection optical system 12 according to FIG. 4 or the projection optical system 32 according to FIG. 6 and in turn has six mirrors M1 to M6.

Figure 14:
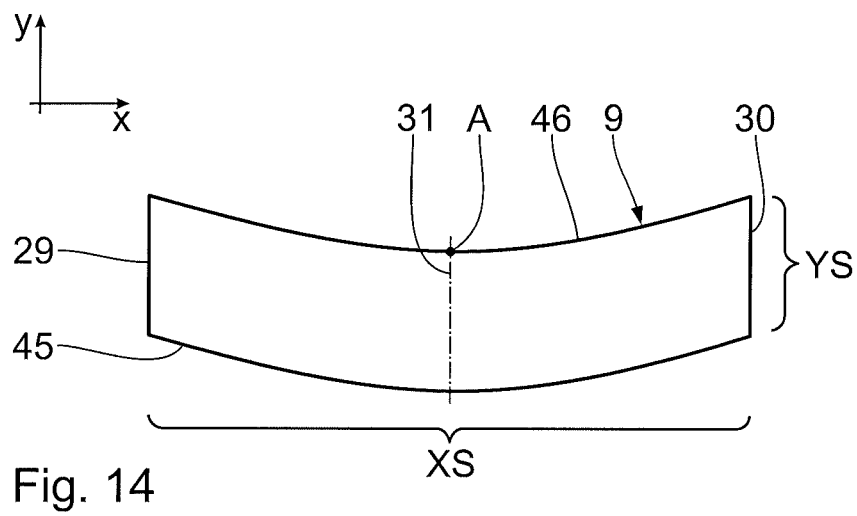
FIG. 14 shows, in a view similar to FIG. 5, a field form of an object field which can be imaged by the projection optical system according to FIG. 13.

The optical design data of the reflection faces of the mirrors M1 to M6 of a first configuration of the projection optical system 44, with which an object field 9 according to FIG. 14 can be illuminated, can be inferred from the following tables, which correspond to the tables on the projection optical system 12 according to FIG. 4.

| Surface | Radius | Thickness | Operating mode |
|---|---|---|---|
| Object plane | infinite | 1706.852 | |
| M1 | −2211.694 | −1171.503 | REFL |
| M2 | −70111.595 | 497.220 | REFL |
| Stop | infinite | 278.441 | |
| M3 | 574.135 | −603.973 | REFL |
| M4 | 949.942 | 1191.775 | REFL |

-continued

| Surface | Radius | Thickness | Operating mode |
|---|---|---|---|
| M5 | 637.738 | −459.737 | REFL |
| M6 | 551.719 | 533.737 | REFL |
| Image plane | infinite | 0.000 | |

| Coefficient | M1 | M2 | M3 | M4 | M5 | M6 |
|---|---|---|---|---|---|---|
| K | 0.000000E+00 | 0.000000E+00 | 0.000000E+00 | 0.000000E+00 | 0.000000E+00 | 0.000000E+00 |
| Y | 0.000000E+00 | 0.000000E+00 | 0.000000E+00 | 0.000000E+00 | 0.000000E+00 | 0.000000E+00 |
| X2 | 6.440422E−06 | 1.809739E−05 | −2.455162E−05 | −4.084923E−06 | −2.145767E−05 | −2.537494E−05 |
| Y2 | 8.430224E−07 | −4.745786E−06 | −6.711394E−06 | −1.760988E−06 | 2.083289E−05 | −2.309902E−05 |
| X2Y | −6.973758E−10 | −1.222234E−08 | −1.289693E−07 | −8.720806E−09 | −3.235177E−07 | −6.591031E−09 |
| Y3 | −1.120641E−09 | 3.840368E−08 | 7.271177E−08 | −1.683625E−09 | −1.525312E−07 | −9.497194E−10 |
| X4 | −4.545051E−12 | −1.666291E−10 | −1.677261E−09 | −4.101371E−12 | 3.457512E−09 | −3.930372E−11 |
| X2Y2 | −1.757585E−11 | −3.699055E−10 | −4.951445E−09 | −2.213510E−11 | 7.712103E−09 | −8.376725E−11 |
| Y4 | −2.875988E−12 | −2.532666E−10 | −2.200912E−09 | −4.149491E−12 | 2.595458E−09 | −3.171961E−11 |
| X4Y | 4.475026E−16 | −1.437171E−14 | −1.829099E−12 | −6.006398E−16 | 5.482702E−12 | −6.754713E−15 |
| X2Y3 | 1.625425E−14 | 3.887015E−13 | −6.199980E−12 | −2.739672E−14 | −5.792934E−13 | −8.955419E−15 |
| Y5 | 1.004330E−15 | 1.252514E−13 | −5.442856E−12 | 2.643623E−15 | 2.337886E−12 | 1.350153E−15 |
| X6 | −2.874501E−18 | −1.500330E−16 | −1.930382E−15 | −1.662718E−18 | 4.510516E−14 | −6.246775E−17 |
| X4Y2 | −7.719974E−18 | −5.702004E−16 | −3.723625E−15 | 1.029945E−17 | 1.042903E−13 | −1.735303E−16 |
| X2Y4 | −2.283242E−17 | −9.266115E−16 | −1.896790E−14 | −3.349600E−17 | 1.627047E−13 | −1.563252E−16 |
| Y6 | −4.430008E−18 | −1.948919E−16 | −1.496141E−14 | 1.253109E−18 | 2.922906E−14 | −4.350994E−17 |
| X6Y | 2.308875E−21 | 1.440569E−18 | 2.225387E−17 | 1.353391E−22 | −3.140619E−16 | −2.621855E−20 |
| X4Y3 | 1.559820E−21 | 7.102973E−19 | 2.100100E−18 | 4.703675E−20 | −9.518857E−17 | −7.613578E−20 |
| X2Y5 | 1.301867E−20 | 2.792593E−18 | −1.637805E−17 | −2.187060E−20 | −5.179719E−16 | −4.445347E−20 |
| Y7 | 7.564025E−22 | −6.066381E−20 | −6.060912E−18 | −4.969718E−21 | −5.683367E−16 | −9.425609E−21 |
| X8 | −1.739199E−24 | −1.141691E−21 | 4.549044E−20 | 3.960836E−24 | 3.042200E−19 | −8.279354E−23 |
| X6Y2 | −5.507588E−24 | −3.914580E−21 | 1.514717E−20 | 5.403814E−24 | 5.999171E−18 | −3.143517E−22 |
| X4Y4 | −4.282172E−24 | −1.120110E−21 | −7.281242E−20 | 4.444708E−23 | 1.404983E−17 | −4.727349E−22 |
| X2Y6 | −6.506793E−24 | −4.177508E−21 | −1.580950E−20 | −1.023938E−23 | 9.166057E−18 | −2.648288E−22 |
| Y8 | −4.552481E−25 | 3.619444E−22 | 7.408324E−21 | −4.202482E−24 | −4.914722E−18 | −3.874529E−23 |
| X8Y | 0.000000E+00 | 0.000000E+00 | 0.000000E+00 | 0.000000E+00 | 1.652709E−20 | −8.704967E−26 |
| X6Y3 | 0.000000E+00 | 0.000000E+00 | 0.000000E+00 | 0.000000E+00 | 6.053030E−20 | −3.704947E−25 |
| X4Y5 | 0.000000E+00 | 0.000000E+00 | 0.000000E+00 | 0.000000E+00 | 1.121235E−19 | −4.213250E−25 |
| X2Y7 | 0.000000E+00 | 0.000000E+00 | 0.000000E+00 | 0.000000E+00 | 7.847277E−20 | −3.368938E−25 |
| Y9 | 0.000000E+00 | 0.000000E+00 | 0.000000E+00 | 0.000000E+00 | −5.545599E−20 | −1.258716E−25 |
| X10 | 0.000000E+00 | 0.000000E+00 | 0.000000E+00 | 0.000000E+00 | 3.252077E−23 | −5.837328E−29 |
| X8Y2 | 0.000000E+00 | 0.000000E+00 | 0.000000E+00 | 0.000000E+00 | 8.140700E−23 | −4.377557E−28 |
| X6Y4 | 0.000000E+00 | 0.000000E+00 | 0.000000E+00 | 0.000000E+00 | 2.587758E−22 | −5.485181E−28 |
| X4Y6 | 0.000000E+00 | 0.000000E+00 | 0.000000E+00 | 0.000000E+00 | 3.419017E−22 | 1.950181E−28 |
| X2Y8 | 0.000000E+00 | 0.000000E+00 | 0.000000E+00 | 0.000000E+00 | 1.209030E−22 | 6.789601E−28 |
| Y10 | 0.000000E+00 | 0.000000E+00 | 0.000000E+00 | 0.000000E+00 | −1.787741E−22 | 3.081247E−28 |
| Nradius | 1.000000E+00 | 1.000000E+00 | 1.000000E+00 | 1.000000E+00 | 1.000000E+00 | 1.000000E+00 |

The object field 9 according to FIG. 14 is limited by two narrow-side boundary lines 29, 30 and by two longitudinal-side part circles 45, 46 configured as curved lines. The two part circles 45, 46 have a spacing YS from one another. The two narrow-side boundary lines 29, 30 have a spacing XS from one another.

The two part circles 45, 46 in each case have a radius of curvature of 100 mm. The sign for this radius of curvature is positive, which means that the part circle 45 limits the object field 9 convexly and the part circle 46 limits the object field 9 concavely, wherein, simultaneously during use in a projection exposure system designed as a scanner, an object point scanned in the y-direction passes the part circle 45 on entry into the object field 9 and the part circle 46 when leaving the object field 9.

Figure 15:
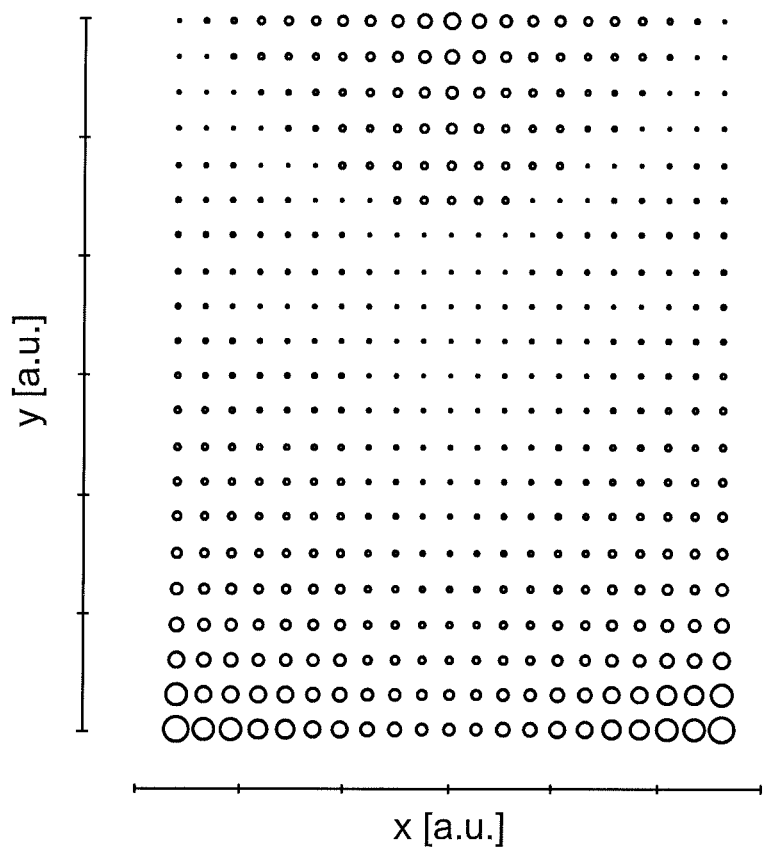
FIG. 15 shows a graph, which reproduces an imaging quality of the projection optical system according to FIG. 13 in the form of a spot size (rms value) over the image field, which includes the object field according to FIG. 14 imaged by the projection optical system.

FIG. 15 shows, in a view similar to FIG. 10, the rms spot sizes as measures of the imaging quality over the object field 9 according to FIG. 14. It is also to be seen here that the rms spot sizes are smallest in the region of the field form of the object field 9 according to FIG. 14.

The minimal rms spot size is $0.13621 \times 10^{-4}$ mm. The maximal rms spot size, which lies outside the object field 9 used, is $8.0063 \times 10^{-4}$ mm.

FIG. 15 shows the rms spot sizes in a rectangular region of the object plane 11, within which the object field 9 according to FIG. 14 is inscribed. It can be inferred from the graph according to FIG. 15 that the size of the rms spot size is very small precisely in the region of the field form of the object field 9 according to FIG. 14.

Figure 16:
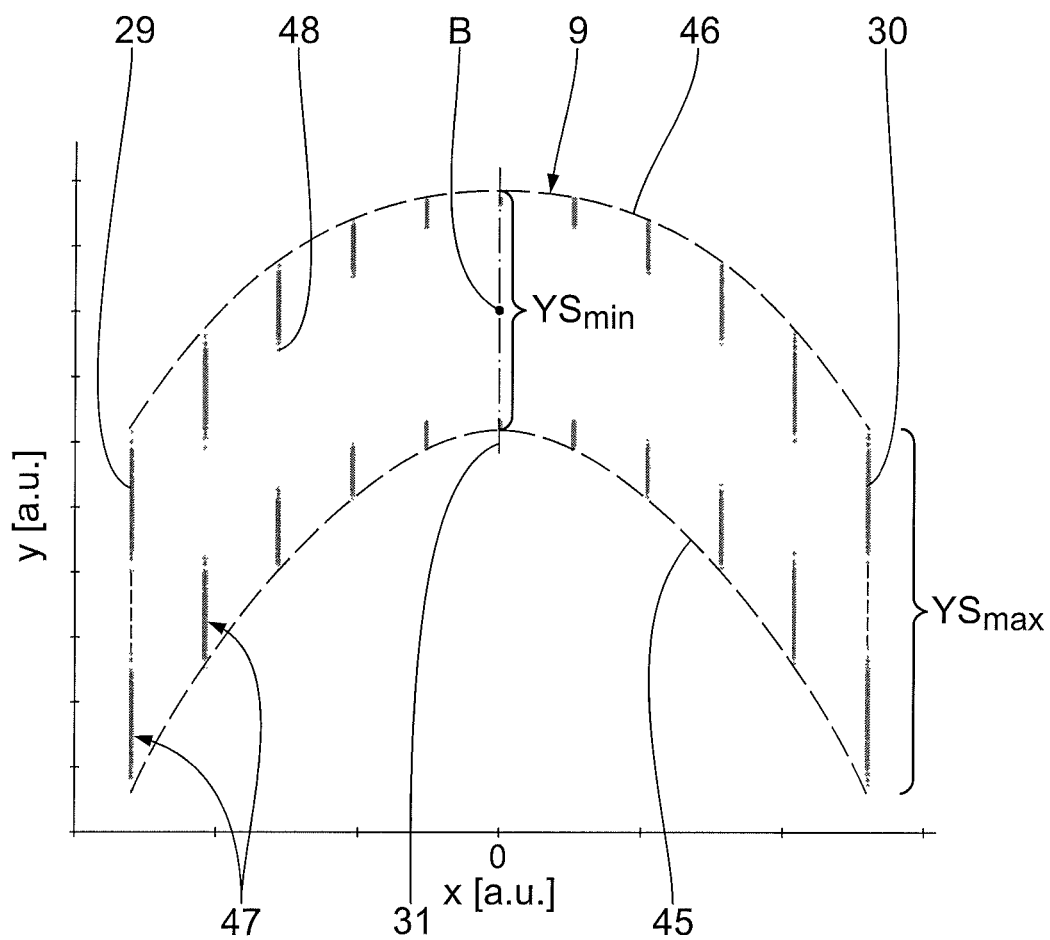
FIG. 16 shows, in a graph, a superimposition of imagings of reference points, which are arranged on field facets in the manner of those of FIGS. 2 and 3, in an object field, with a schematic view of a further field form which can be illuminated with an illumination optical system using the field facet mirrors according to FIGS. 2 and 3.

FIG. 16 shows a further variant of a form of an object field 9. The object field 9 according to FIG. 16 may be illuminated with the field facet mirrors 6 according to FIGS. 2 and 3 and can be imaged with an imaging optical system according to FIG. 4 of U.S. Pat. No. 5,315,629.

The object field 9 according to FIG. 16 is arcuate with a varying transverse dimension YS. The object field 9 according to FIG. 16 at the site of the narrow-side boundary line 29, 30, has a maximal transverse dimension $YS_{max}$ and, at the site of the mirror plane 31 of symmetry of the object field 9, a minimal transverse dimension $YS_{min}$. The ratio $YS_{min}/YS_{max}$ is about 0.65.

In the view according to FIG. 16, the y-dimension in comparison to the x-dimension is shown highly stretched. In fact, the x/y-aspect ratio of the object field 9 according to FIG. 16 is very much larger than it appears in the view according to FIG. 16.

The field facets 18, which illuminate the object field 9 according to FIG. 16, have a constant extent in the y-direction. The object field 9 according to FIG. 16 with a varying transverse dimension is illuminated by these field facets 18 on the basis of the different imaging effects of the individual illumination channels within the illumination optical system 10. These individual illumination channels are produced from the allocation of the individual field facets 18 to the pupil facets of the pupil facet mirror 7.

This different imaging effect is made clear by families 47 of reference points 48 on the respective field facets 18, the images of which are entered in the object plane 11 in FIG. 16. The reference points 48 are arranged on the field facets 18 equidistantly along the longitudinal side edges thereof. Eleven such reference points 48 are arranged along one of the longitudinal side edges. Because of the differently imaging effects of the illumination channels, the reference points 48 are imaged in the point families 47, which, depending on their spacing from the mirror plane 31 of symmetry, have an increasing extent in the y-direction. The pupil facets of the pupil facet mirror 7 are oriented such that a superimposition of the reference points 48 in the region of the mirror plane 31 of symmetry is as good as possible.

Because of this increasing y-extent of the point families 47 with an increasing spacing from the mirror plane 31 of symmetry, the form of the object field 9 according to FIG. 16 is produced as an arc field with an outwardly increasing transverse extent YS.

The extent of the point families 47 in the y-direction increases linearly with their spacing from the mirror plane 31 of symmetry.

The individual images of the field facets 18, which are superimposed in the object field 9 according to FIG. 16, are, depending on the imaging over the respective illumination channel, rotated about an axis B, which lies in the centre of the path $YS_{min}$.

Figure 17:
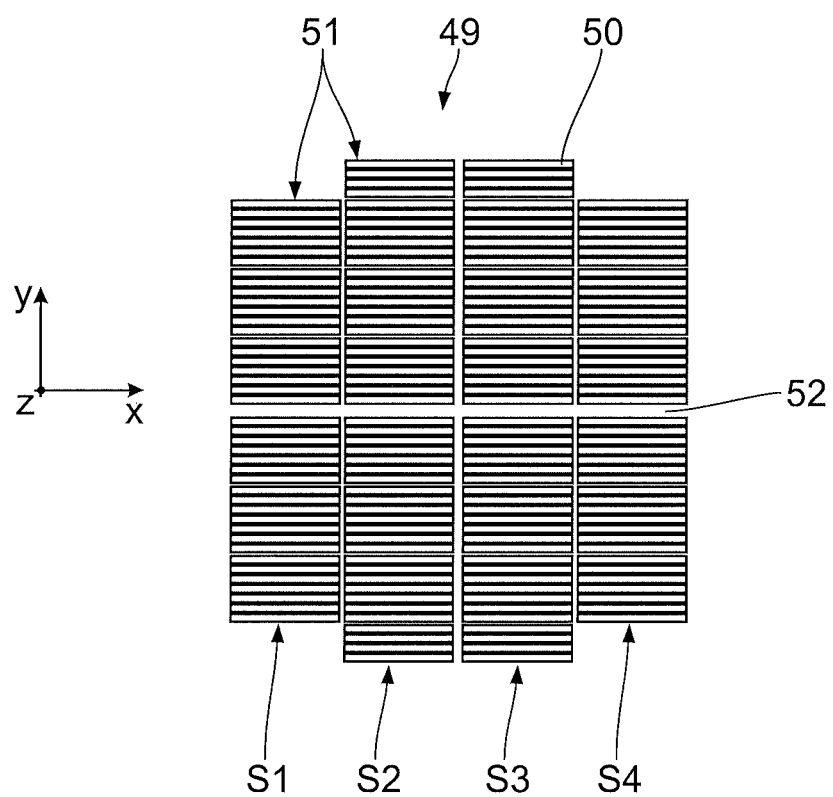
FIG. 17 shows a plan view of a further configuration of a field facet mirror of the illumination optical system according to FIG. 1.

FIG. 17 shows a further configuration of a field facet mirror 49, which may be used instead of the field facet mirror 6 in the illumination optical system 10. The field facet mirror 49 according to FIG. 17 differs from the field facet mirror 6 according to FIGS. 2 and 3 with regard to the form and the arrangement of field facets 50. The field facets 50 are rectangular and in each case have the same x/y-aspect ratio, which corresponds to the aspect ratio of the field facets 18 according to FIGS. 2 and 3. The field facets 50, like the field facets 18, predetermine a reflection face of the field facet mirror 49 and are grouped in four columns S1, S2, S3 and S4. Within the columns S1 to S4, the field facets 50 are in turn arranged in field facet groups or blocks 51 in the manner of the field facet groups 19 of the field facet mirror 6, according to FIG. 2. Between the two central facet columns S2, S3 and between centrally arranged facet lines, the facet arrangement of the field facet mirror 49 has intermediate spaces 52, in which no facets are arranged, as these regions of the far field of the light source 2 are shadowed by holding spokes of a correspondingly formed collector 4.

Figure 18:
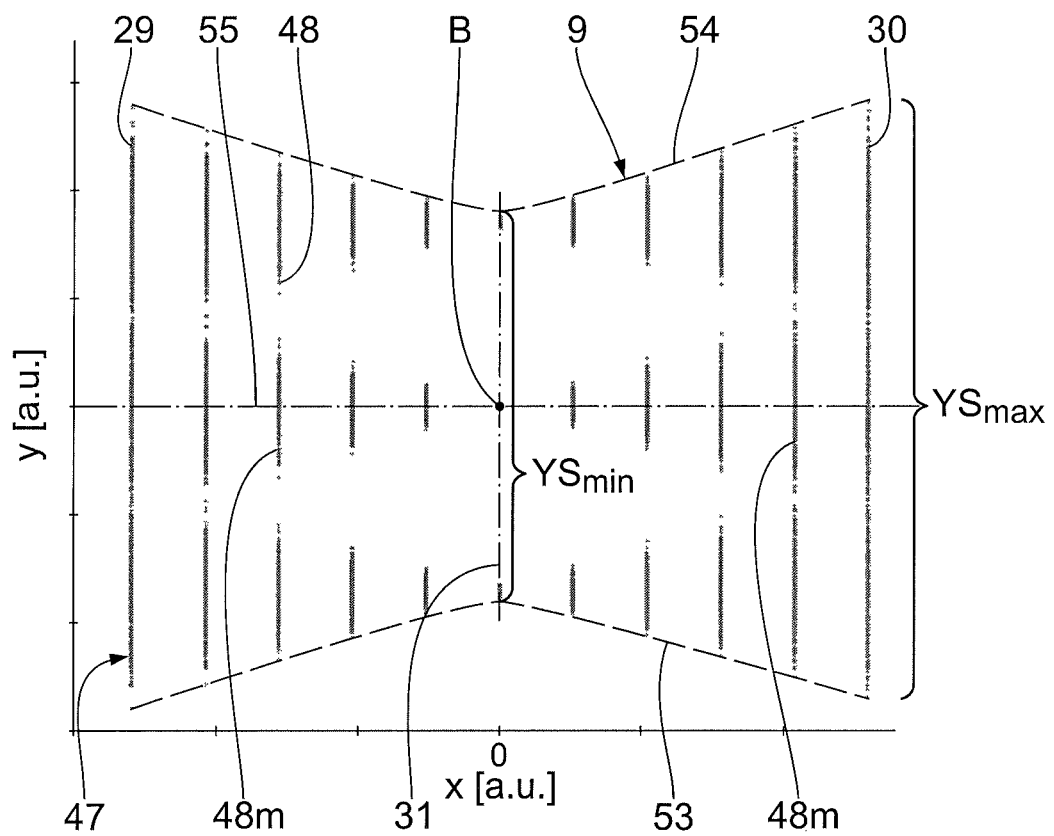
FIG. 18 shows a graph of a superimposition of imagings of reference points, which are arranged on field facets in the manner of those of FIG. 17, in an object field with a schematic view of a further field form which can be illuminated with an illumination optical system using the field facet mirror according to FIG. 17.

FIG. 18, in a view similar to FIG. 16, shows a further field form of the object field 9, which can be illuminated by the field facet mirror 49 according to FIG. 17.

Figure 19:
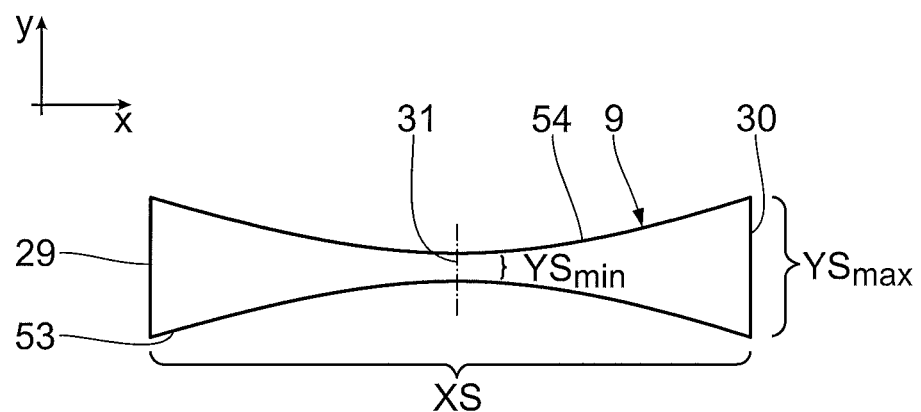
FIG. 19 shows, in a view similar to FIG. 5, an object field form which is similar to FIG. 18, which can be imaged with a variant of the projection optical system according to FIG. 13.

The object field 9 according to FIG. 18 has approximately the form of a butterfly. At the narrow sides, the object field 9 according to FIG. 18 is in turn limited by boundary lines 29, 30. At the longitudinal sides, the object field 9 according to FIG. 18 is limited by concavely extending curved lines 53, 54. The object field 9 according to FIG. 19 is also symmetrical about a mirror plane 31 of symmetry extending parallel to the yz-plane.

A transverse dimension of the object field 9 according to FIG. 18 varies between a minimal value $YS_{min}$ at the height of the mirror plane 31 of symmetry up to a maximal value $YS_{max}$ at the height of the two boundary lines 29, 30. The ratio $YS_{min}/YS_{max}$ is about 0.65.

FIG. 18 in turn shows families 47 of reference points 48 on the field facets 50, which are imaged in the object field 9. Apart from the reference points provided along the longitudinal-side edges, the images of reference points 48m arranged centrally between the longitudinal sides of the field facets 50 are also shown to make the imaging ratios on the object field 9 according to FIG. 18 clear. The superimposition of the images of the individual field facets 50 on the object field 9 is adjusted via the tilting angles of the pupil facets of the pupil facet mirror 7 in such a way that the centre points of the images of the respective field facets are thus superimposed in the central point B of the object field 9 according to FIG. 18. This point B is located on the mirror plane 31 of symmetry, which extends parallel to the yz-plane and additionally extends on a further mirror plane 55 of symmetry of the object field 9 according to FIG. 18, which extends parallel to the xz-plane.

In turn caused by the imaging ratios in the individual illumination channels due to the allocation of the field facets 50 to the respective pupil facets, a tilting of the individual field facets about the central point B is produced such that the superimposition of all the field facet images produces the butterfly-shaped configuration of the object field 9 according to FIG. 18. The extent of the point families 47 in the y-direction increases linearly here with the spacing of the point families 47 from the mirror plane 31 of symmetry. The form of the field facets 50 is not geometrically similar to the form of the object field 9 illuminated.

FIG. 19 shows a field similar to the object field 9 according to FIG. 18, to scale. The two concave curved lines 53, 54, which limit the longitudinal sides of the object field 9 according to FIG. 19, in each case, have a radius of curvature of 200 mm. In this case, in accordance with the sign convention already described above, the curved line 53 has a radius of curvature of +200 mm and the curved line 54, a radius of curvature of −200 mm. This is because the curved line 53 concavely limits the object field 9 and, during use in a projection exposure system configured as a scanner, is an object field limiting line, which an object point scanned in the y-direction passes on entry into the object field 9, and because the curved line 54 also concavely limits the object field 9, but is simultaneously an object field limiting line, which the scanned object point passes on leaving the object field 9.

The object field according to FIG. 19 differs from the object field according to FIG. 18 by the ratio between the minimal transverse dimension $YS_{min}$ and the maximal transverse dimension $YS_{max}$, which in the object field 9 according to FIG. 19 is 0.2.

The optical data of the reflection faces of mirrors M1 to M6 of the projection optical system 44 according to FIG. 13, with which the object field form according to FIGS. 18 and 19 can be imaged, can be inferred from the following tables, which correspond to the tables on the projection optical system according to FIG. 4 with regard to the structure.

| Surface | Radius | Thickness | Operating mode |
| --- | --- | --- | --- |
| Object plane | infinite | 1708.232 | |
| M1 | −2212.972 | −1166.393 | REFL |
| M2 | −65016.245 | 492.263 | REFL |
| Stop | infinite | 282.345 | |
| M3 | 574.317 | −604.029 | REFL |
| M4 | 949.891 | 1192.142 | REFL |
| M5 | 637.269 | −459.359 | REFL |
| M6 | 551.874 | 533.359 | REFL |
| Image plane | infinite | 0.000 | |

| Coefficient | M1 | M2 | M3 | M4 | M5 | M6 |
|---|---|---|---|---|---|---|
| K | 0.000000E+00 | 0.000000E+00 | 0.000000E+00 | 0.000000E+00 | 0.000000E+00 | 0.000000E+00 |
| Y | 0.000000E+00 | 0.000000E+00 | 0.000000E+00 | 0.000000E+00 | 0.000000E+00 | 0.000000E+00 |
| X2 | 5.175765E-06 | 1.583433E-05 | -2.475627E-05 | -3.414877E-06 | -2.618049E-05 | -2.520636E-05 |
| Y2 | 1.055465E-06 | -5.138951E-06 | -6.326936E-06 | -2.084452E-06 | 2.459988E-05 | -2.166868E-05 |
| X2Y | 2.971955E-09 | 1.471857E-08 | -3.361463E-08 | -4.313125E-09 | -3.175820E-07 | -4.081296E-09 |
| Y3 | -2.202870E-09 | 4.370157E-08 | 4.585420E-08 | -8.878262E-10 | -2.363718E-07 | -1.730758E-09 |
| X4 | -5.197111E-12 | -2.042188E-10 | -1.453456E-09 | -1.253979E-12 | 2.256740E-09 | -3.945822E-11 |
| X2Y2 | -2.287668E-11 | -4.902277E-10 | -4.023607E-09 | -1.812394E-11 | 5.077150E-09 | -7.702777E-11 |
| Y4 | -3.063349E-12 | -2.640177E-10 | -2.229404E-09 | -3.304145E-12 | 2.012253E-09 | -2.967909E-11 |
| X4Y | 6.767629E-16 | -1.345893E-13 | 2.525315E-12 | 1.668849E-15 | 9.936822E-12 | -1.004042E-14 |
| X2Y3 | 1.878443E-14 | 3.772115E-13 | -4.008622E-12 | -3.382883E-14 | 7.740051E-12 | -8.510393E-15 |
| Y5 | 2.557808E-15 | 7.052244E-14 | -4.658097E-12 | 9.622637E-16 | 3.577374E-12 | 1.136438E-15 |
| X6 | -4.132260E-18 | 8.457018E-17 | 2.623034E-16 | 3.090602E-18 | 8.766576E-14 | -6.200251E-17 |
| X4Y2 | -9.203793E-18 | 4.322167E-16 | 3.260458E-14 | -1.045152E-17 | 2.354718E-13 | -1.517964E-16 |
| X2Y4 | -1.905623E-17 | -7.189200E-16 | -1.885305E-14 | -6.314174E-17 | 1.870847E-13 | -1.472778E-16 |
| Y6 | -5.045610E-18 | -1.216565E-16 | -1.572458E-14 | -1.214861E-18 | 1.649492E-14 | -4.264526E-17 |
| X6Y | 8.419734E-21 | 2.333036E-18 | 5.598298E-17 | 1.667348E-20 | -1.001467E-15 | -6.041148E-20 |
| X4Y3 | 2.935993E-21 | 1.829654E-18 | 2.145860E-16 | -4.228103E-20 | -1.669135E-15 | -1.530591E-19 |
| X2Y5 | 6.308924E-21 | 3.236261E-18 | -2.668704E-17 | -6.916460E-20 | -6.422030E-16 | -4.082505E-20 |
| Y7 | -4.631514E-23 | 4.309929E-20 | -2.740321E-17 | -3.801023E-21 | -5.813536E-16 | -1.593143E-21 |
| X8 | -2.281379E-24 | -2.622880E-21 | 3.539429E-20 | 4.365486E-24 | -1.482299E-18 | -7.695599E-23 |
| X6Y2 | -9.901357E-24 | -1.004117E-20 | 2.083558E-19 | 1.612842E-23 | 4.965438E-18 | -1.861467E-22 |
| X4Y4 | -2.438227E-24 | -4.156733E-21 | 3.837003E-19 | -4.784528E-23 | 2.383893E-17 | -3.148424E-22 |
| X2Y6 | -4.554326E-24 | -6.205907E-21 | -4.789634E-20 | -4.248029E-23 | 2.408743E-17 | -2.839728E-22 |
| Y8 | -3.429856E-25 | -2.170731E-22 | -4.030925E-20 | -4.298735E-24 | -2.094352E-18 | -6.431471E-23 |
| X8Y | 0.000000E+00 | 0.000000E+00 | 0.000000E+00 | 0.000000E+00 | 6.761982E-20 | -2.076405E-25 |
| X6Y3 | 0.000000E+00 | 0.000000E+00 | 0.000000E+00 | 0.000000E+00 | 2.621230E-19 | -7.705600E-25 |
| X4Y5 | 0.000000E+00 | 0.000000E+00 | 0.000000E+00 | 0.000000E+00 | 3.100225E-19 | -6.917795E-25 |
| X2Y7 | 0.000000E+00 | 0.000000E+00 | 0.000000E+00 | 0.000000E+00 | 2.310071E-19 | -2.710050E-25 |
| Y9 | 0.000000E+00 | 0.000000E+00 | 0.000000E+00 | 0.000000E+00 | -3.240950E-20 | -5.319277E-26 |
| X10 | 0.000000E+00 | 0.000000E+00 | 0.000000E+00 | 0.000000E+00 | 9.945189E-23 | -4.660495E-29 |
| X8Y2 | 0.000000E+00 | 0.000000E+00 | 0.000000E+00 | 0.000000E+00 | 6.059499E-22 | 5.794699E-29 |
| X6Y4 | 0.000000E+00 | 0.000000E+00 | 0.000000E+00 | 0.000000E+00 | 1.186303E-21 | 5.574376E-28 |
| X4Y6 | 0.000000E+00 | 0.000000E+00 | 0.000000E+00 | 0.000000E+00 | 8.412657E-22 | 8.619569E-28 |
| X2Y8 | 0.000000E+00 | 0.000000E+00 | 0.000000E+00 | 0.000000E+00 | 4.556447E-22 | 5.617836E-28 |
| Y10 | 0.000000E+00 | 0.000000E+00 | 0.000000E+00 | 0.000000E+00 | -1.600719E-22 | 1.656977E-28 |
| Nradius | 1.000000E+00 | 1.000000E+00 | 1.000000E+00 | 1.000000E+00 | 1.000000E+00 | 1.000000E+00 |

Figure 20:
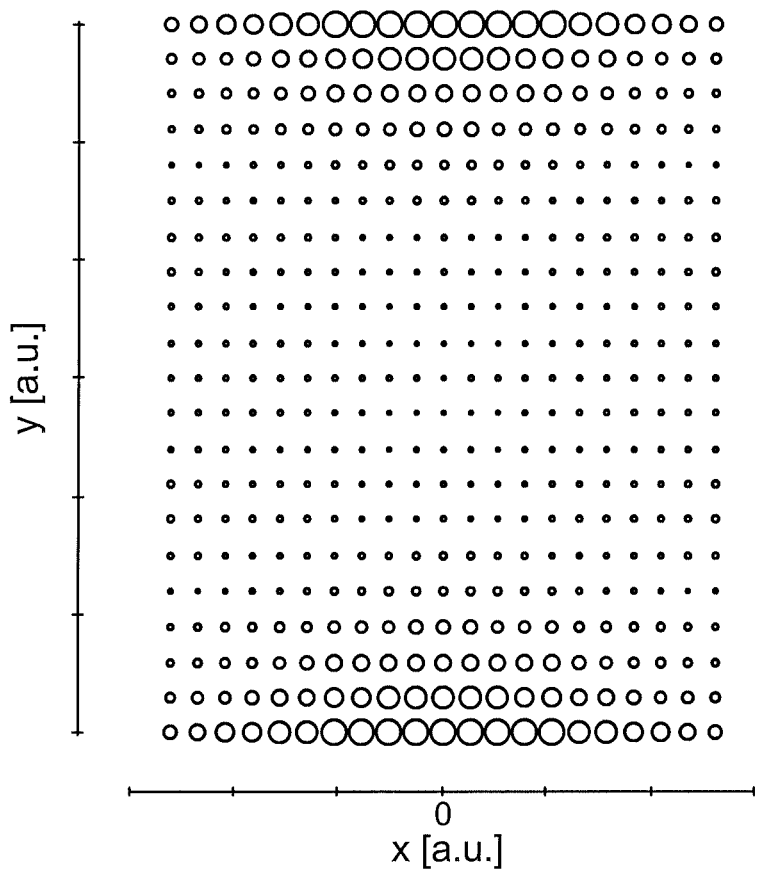
FIG. 20 shows a graph which reproduces an imaging quality of the projection optical system according to FIG. 13 over the image field, for that variant of the projection lens system according to FIG. 13, which includes the object field according to FIG. 19 imaged by the projection optical system.

FIG. 20 shows, in a view similar to FIG. 10, the course of the rms spot size over the object field 9 according to FIG. 19.

The minimal rms spot size is $0.12567 \times 10^{-4}$ mm. The maximal rms spot size, which lies outside the object field 9 used, is $4.0369 \times 10^{-4}$ mm.

FIG. 20 shows the rms spot size in a rectangular region of the object plane 11, within which the object field according to FIG. 19 is inscribed. It can be inferred from the graph according to FIG. 20 that the values of the rms spot size are very small precisely in the region of the field form of the object field 9 according to FIG. 19.

Figure 21:
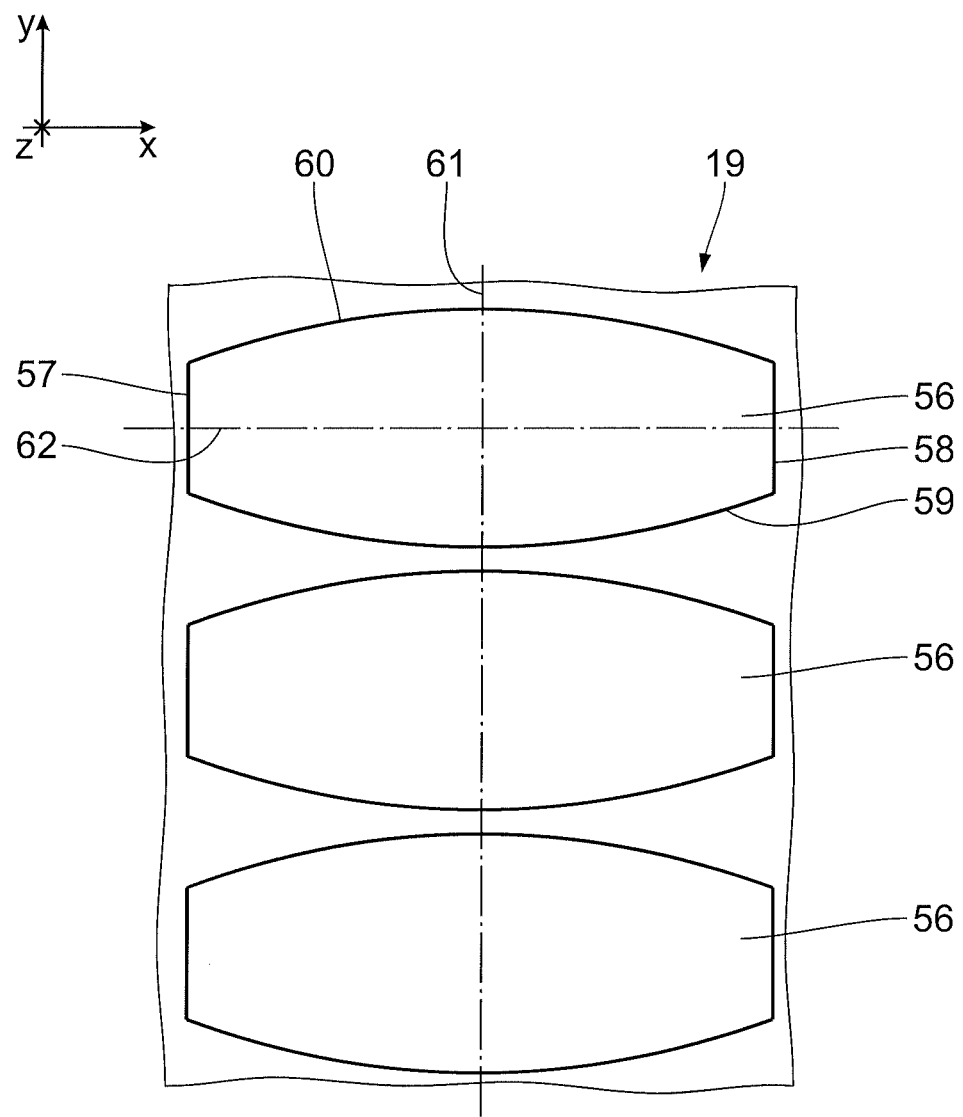
FIG. 21 shows, highly enlarged in comparison to FIGS. 2 and 3, a detail of a facet block of a further configuration of a field facet mirror of the illumination optical system, also in a plan view, this field facet configuration being suitable to illuminate an object field form, which can be imaged with a further variant of the projection optical system according to FIG. 13.

FIG. 21 shows, in a view similar to FIG. 7, a detail of a field facet block of a further variant of a field facet mirror, which can be used instead of the field facet mirror 6, 49 in the illumination optical system 10. The field facet block 19 according to FIG. 21 has field facets 56 with a barrel-shaped reflection face. The field facets 56 in each case have the same form and are limited by narrow sides 57, 58 extending straight with the same length and longitudinal sides 59, 60 extending convexly in an arcuate manner. Each of the field facets 56 is mirror-symmetrical with regard to its reflection face form in relation to a first mirror plane 61 of symmetry extending parallel to the yz-plane and, on the other hand, in relation to a further mirror plane 62 of symmetry extending parallel to the xz-plane. The two arcuate longitudinal sides 59, 60 have the same radius of curvature.

Figure 22:
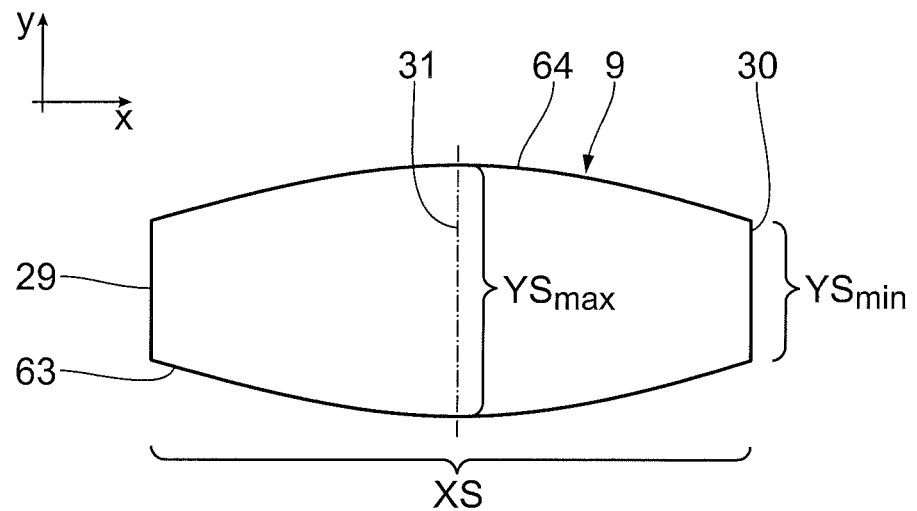
FIG. 22 shows, in a view similar to FIG. 9, the object field form which can be illuminated with the field facets according to FIG. 21.

The optical design data of reflection faces of the mirrors M1 to M6 of the projection optical system 44, with which an object field 9 shown in FIG. 22 can be imaged, which in turn can be illuminated by a field facet mirror with the field facets 56 according to FIG. 21, can be inferred from the following tables, which correspond to the tables on the projection optical system 12 according to FIG. 4 with regard to the structure.

| Surface | Radius | Thickness | Operating mode |
|---|---|---|---|
| Object plane | infinite | 1710.182 | |
| M1 | -2208.923 | -1173.379 | REFL |
| M2 | -49945.312 | 510.178 | REFL |
| Stop | infinite | 266.671 | |
| M3 | 568.251 | -605.323 | REFL |
| M4 | 948.689 | 1196.188 | REFL |
| M5 | 642.870 | -458.681 | REFL |
| M | 552.760 | 532.690 | REFL |
| Image plane | infinite | 0.000 | |

| Coefficient | M1 | M2 | M3 | M4 | M5 | M6 |
|---|---|---|---|---|---|---|
| K | 0.000000E+00 | 0.000000E+00 | 0.000000E+00 | 0.000000E+00 | 0.000000E+00 | 0.000000E+00 |
| Y | 0.000000E+00 | 0.000000E+00 | 0.000000E+00 | 0.000000E+00 | 0.000000E+00 | 0.000000E+00 |
| X2 | 4.447765E-06 | 1.297266E-05 | -1.789807E-05 | -3.188133E-06 | -1.905669E-05 | -2.248554E-05 |
| Y2 | 4.942860E-07 | -7.422338E-06 | 6.034070E-06 | -1.770628E-06 | 1.328809E-05 | -2.052478E-05 |
| X2Y | 2.913995E-10 | 2.048130E-08 | 5.278265E-09 | -2.948957E-09 | -3.899142E-07 | -5.616536E-09 |
| Y3 | -1.577492E-09 | 4.203833E-08 | 1.221239E-07 | -1.639103E-09 | -2.368506E-07 | -2.423020E-09 |

-continued

| Coefficient | M1 | M2 | M3 | M4 | M5 | M6 |
|---|---|---|---|---|---|---|
| X4 | −6.610612E−12 | −2.195502E−10 | −1.462244E−09 | 2.604282E−13 | 2.290513E−09 | −3.292426E−11 |
| X2Y2 | −1.326418E−11 | −5.253799E−10 | −4.081891E−09 | −9.470547E−12 | 4.837344E−09 | −6.803081E−11 |
| Y4 | −3.418205E−12 | −2.262255E−10 | −2.548122E−09 | −4.647794E−12 | 1.904336E−09 | −2.523468E−11 |
| X4Y | 4.061520E−15 | 2.631205E−15 | 3.512833E−12 | 1.287979E−14 | 5.388995E−12 | −1.796944E−14 |
| X2Y3 | −1.485455E−16 | 5.409775E−13 | −4.116023E−12 | −3.123463E−15 | 2.411935E−12 | −2.242840E−14 |
| Y5 | 1.192961E−15 | −1.688167E−14 | −8.041649E−12 | 1.949553E−15 | 4.077273E−12 | −3.532635E−15 |
| X6 | −3.433981E−18 | −2.616708E−17 | 7.543746E−16 | 4.057332E−18 | 7.625627E−14 | −4.382985E−17 |
| X4Y2 | −1.281220E−17 | −1.695190E−16 | 3.596898E−14 | 3.619899E−17 | 2.035406E−13 | −1.016328E−16 |
| X2Y4 | −5.536058E−18 | −1.647196E−15 | −3.385458E−14 | 1.121335E−17 | 1.737294E−13 | −1.095880E−16 |
| Y6 | −3.680023E−18 | −1.514629E−16 | −3.006187E−14 | 1.623547E−18 | 6.127783E−15 | −3.435241E−17 |
| X6Y | 3.442613E−21 | 1.906301E−18 | 6.224900E−17 | 1.677695E−20 | −8.156770E−16 | −8.842793E−20 |
| X4Y3 | 2.117723E−21 | 1.549466E−18 | 2.070471E−16 | 4.534790E−20 | −1.432152E−15 | −2.263253E−19 |
| X2Y5 | 7.711036E−21 | 6.343042E−18 | −1.079312E−16 | 3.091464E−20 | −7.919817E−16 | −7.724029E−20 |
| Y7 | 1.000834E−21 | 5.509687E−19 | −5.746540E−17 | −3.260789E−22 | −7.755634E−16 | −4.690271E−21 |
| X8 | −2.328687E−24 | −2.200924E−21 | 2.661303E−20 | 4.774222E−24 | −1.059071E−18 | −3.050361E−23 |
| X6Y2 | −3.865053E−24 | −6.616329E−21 | 1.701169E−19 | 1.898916E−23 | 4.807194E−18 | 9.693167E−25 |
| X4Y4 | −8.909681E−25 | −1.453180E−21 | 2.970104E−19 | 1.928959E−23 | 2.045204E−17 | −1.140100E−22 |
| X2Y6 | −9.155583E−24 | −1.051477E−20 | −2.101894E−19 | 1.320046E−23 | 2.434474E−17 | −2.011237E−22 |
| Y8 | −1.601133E−24 | −1.070720E−21 | −7.527280E−20 | −1.617176E−24 | −3.953909E−18 | −6.110131E−23 |
| X8Y | 0.000000E+00 | 0.000000E+00 | 0.000000E+00 | 0.000000E+00 | 4.802158E−20 | −3.443419E−25 |
| X6Y3 | 0.000000E+00 | 0.000000E+00 | 0.000000E+00 | 0.000000E+00 | 1.633170E−19 | −1.183775E−24 |
| X4Y5 | 0.000000E+00 | 0.000000E+00 | 0.000000E+00 | 0.000000E+00 | 1.974937E−19 | −9.527576E−25 |
| X2Y7 | 0.000000E+00 | 0.000000E+00 | 0.000000E+00 | 0.000000E+00 | 2.477745E−19 | −3.590753E−25 |
| Y9 | 0.000000E+00 | 0.000000E+00 | 0.000000E+00 | 0.000000E+00 | −4.853431E−20 | −5.518328E−26 |
| X10 | 0.000000E+00 | 0.000000E+00 | 0.000000E+00 | 0.000000E+00 | 7.925809E−23 | 1.603541E−28 |
| X8Y2 | 0.000000E+00 | 0.000000E+00 | 0.000000E+00 | 0.000000E+00 | 4.074446E−22 | 9.128942E−28 |
| X6Y4 | 0.000000E+00 | 0.000000E+00 | 0.000000E+00 | 0.000000E+00 | 6.612033E−22 | 1.737677E−27 |
| X4Y6 | 0.000000E+00 | 0.000000E+00 | 0.000000E+00 | 0.000000E+00 | 3.488545E−22 | 1.580440E−27 |
| X2Y8 | 0.000000E+00 | 0.000000E+00 | 0.000000E+00 | 0.000000E+00 | 4.670427E−22 | 8.332975E−28 |
| Y10 | 0.000000E+00 | 0.000000E+00 | 0.000000E+00 | 0.000000E+00 | −2.294853E−22 | 2.388901E−28 |
| Nradius | 1.000000E+00 | 1.000000E+00 | 1.000000E+00 | 1.000000E+00 | 1.000000E+00 | 1.000000E+00 |

The object field according to FIG. 22 corresponds to the form of the field facets 56 with regard to its form and is limited by narrow-side boundary 29, 30 lines and curved lines 63, 64 in the form of convex part circles, which in each case have a radius curvature of 500 mm. The object field 9 according to FIG. 22 in turn has a varying transverse dimension, the minimal value $YS_{min}$ being present at the edge, in other words at the height of the boundary lines 29, 30 and the maximal value $YS_{max}$ being present in the centre, in other words at the level of the mirror plane 31 of symmetry. The ratio $YS_{min}$ to $YS_{max}$ in the case of the object field 9 according to FIG. 22 is 0.57.

Figure 23:
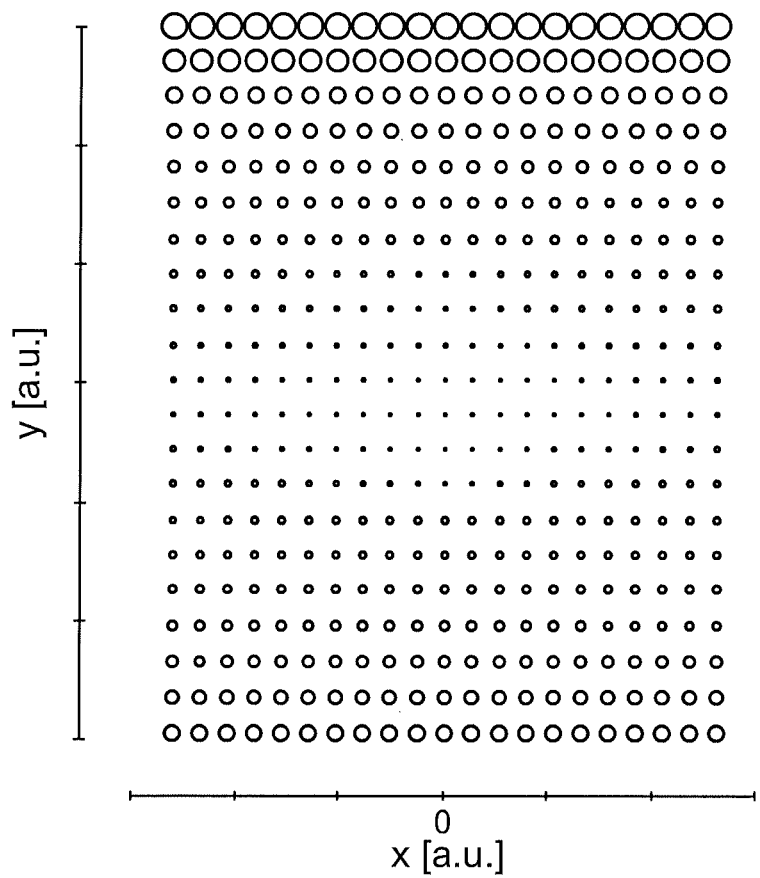
FIG. 23 shows a graph, which reproduces an imaging quality of the projection optical system according to FIG. 13 over the image field, or that variant of the projection lens system according to FIG. 13, which includes the object field according to FIG. 22 imaged by the projection optical system.

FIG. 23, in a graph similar to FIG. 10, shows the rms spot size over the object field 9 according to FIG. 22.

The minimal rms spot size is $0.82307 \times 10^{-5}$ mm. The maximal rms spot size, which lies outside the object field 9 used, is $1.8553 \times 10^{-4}$ mm.

FIG. 23 shows the rms spot sizes in a rectangular region of the object plane 11, in which the object field 9 according to FIG. 22 is inscribed. It can be inferred from the graph according to FIG. 23 that the values of the rms spot size are very small precisely in the region of the field form of the object field 9 according to FIG. 22.

Figure 24:
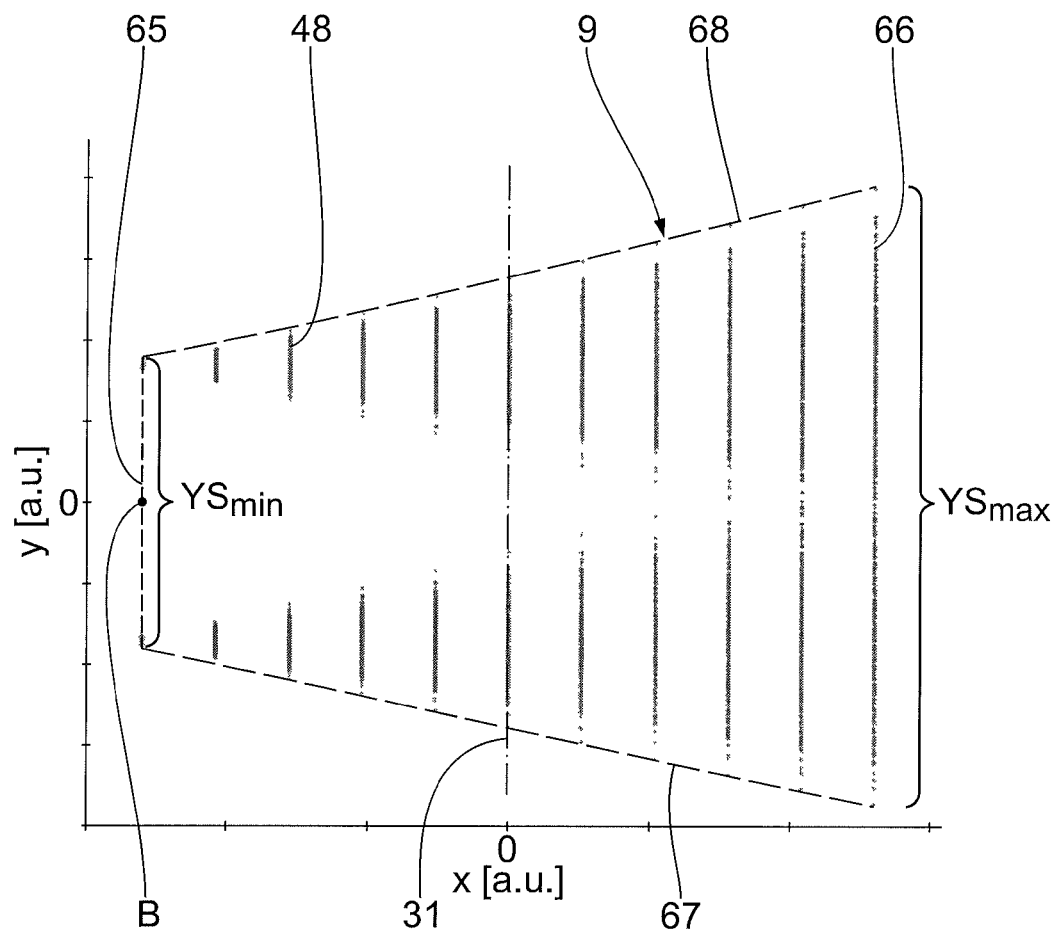
FIG. 24 shows a graph of a superimposition of imagings of reference points, which are arranged on field facets in the manner of those of FIG. 17, in an object field with a schematic view of a further field form which can be illuminated by an illumination optical system using the field facet mirror according to FIG. 17.

FIG. 24 shows, in a view similar to FIG. 16, a further form of an object field 9, which can be illuminated by rectangular field facets 50 according to the field facet mirror 49 according to FIG. 17.

The object field 9 according to FIG. 24 is wedge-shaped. In contrast to all the other object field forms described until now in conjunction with the figures, the object field 9 according to FIG. 24 is not mirror-symmetrical in relation to a central plane 31 extending parallel to the yz-plane. The object field 9 according to FIG. 24 is limited by a short narrow-side boundary line 65 with an extent $YS_{min}$ and by a long narrow-side boundary line 66 with an extent $YS_{max}$. The two boundary lines 65, 66 extend parallel to the y-direction. Furthermore, the object field 9 according to FIG. 24 is limited by two boundary lines 67, 68 which also extend approximately straight, but at an angle in relation to the x-axis. The ratio $YS_{min}$ to $YS_{max}$ in the object field 9 according to FIG. 24 is 0.49.

The illumination of the object field 9 according to FIG. 24 in turn takes place by superimposition of the images of the field facets 50. By corresponding tilting adjustment of the associated pupil facets, the field facet images are superimposed in the region of the left boundary line 65 in FIG. 24. Owing to the different imaging effect (tilting about point B) of the various illumination channels, by which the individual field facets 50 in the object plane are superimposed, a linearly increasing y-deviation of the superimposition is produced toward the right edge, in other words toward the boundary line 66 of the object field 9 according to FIG. 24, which is in turn shown by families 47 of reference points 48 arranged along the longitudinal sides of the field facets 50, the patterns of which in turn are entered in FIG. 24. The y-extent of these families 47 increases linearly to the right. A wedge form of the object field 9 according to FIG. 24 is the result.

Figure 25:
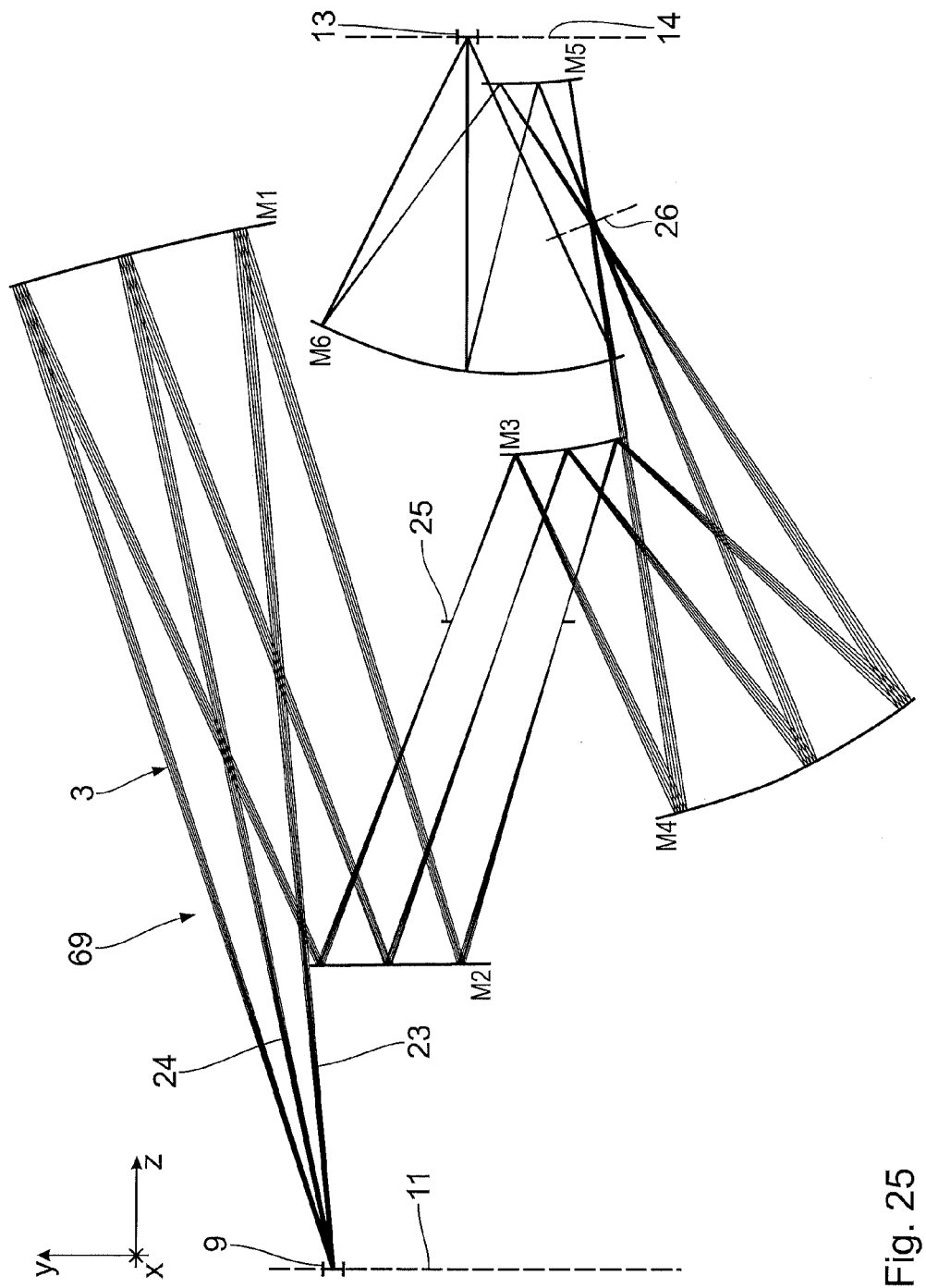
FIG. 25 shows, in a view similar to FIG. 4, a further configuration of a projection optical system, with which an object field form according to FIG. 24 can be imaged.

FIG. 25 shows a projection optical system 69, with which a wedge-shaped object field form according to FIG. 24 can be imaged. The projection optical system 69 according to FIG. 25 corresponds to that according to FIG. 4 with regard to the basic structure.

Figure 26:
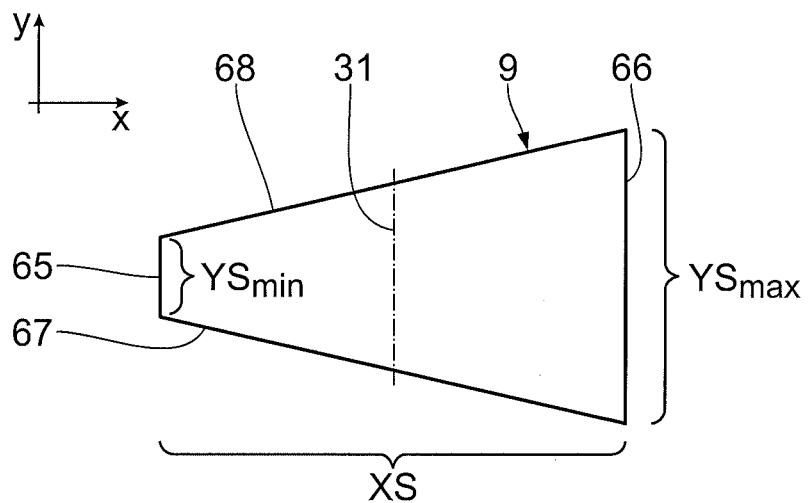
FIG. 26 shows, in a view similar to FIG. 9, an object field form similar to FIG. 24, which can be imaged by a projection optical system according to FIG. 25.

Shown in tables below are in turn optical design data of the reflection faces of the mirrors M1 to M6 of the projection optical system 69, with which a wedge-shaped object field form can be imaged, the image extent of which in the image plane 14 is shown in FIG. 26. With regard to the structure, these following tables on the projection optical system 49 in turn correspond to the tables on the projection optical system 12 according to FIG. 4.

| Surface | Radius | Thickness | Operating mode |
|---|---|---|---|
| Object plane | infinite | 1689.899 | |
| M1 | −2210.334 | −1199.401 | REFL |
| M2 | −39012.605 | 540.555 | REFL |
| Stop | infinite | 266.988 | |
| M3 | 574.318 | −606.068 | REFL |
| M4 | 949.025 | 1193.466 | REFL |
| M5 | 642.049 | −459.980 | REFL |
| M6 | 551.772 | 533.980 | REFL |
| Image plane | infinite | 0.000 | |

| Coefficient | M1 | M2 | M3 | M4 | M5 | M6 |
|---|---|---|---|---|---|---|
| K | 0.000000E+00 | 0.000000E+00 | 0.000000E+00 | 0.000000E+00 | 0.000000E+00 | 0.000000E+00 |
| X | −3.824578E−04 | −2.491448E−04 | −1.744756E−04 | 7.535770E−05 | −1.015618E−04 | 3.187012E−04 |
| Y | 5.085775E−04 | −1.213873E−03 | −7.674418E−03 | −8.114756E−04 | 3.085998E−03 | 9.570101E−04 |
| X2 | 4.038917E−06 | 5.661011E−06 | 9.889925E−06 | −1.689391E−06 | −4.431777E−05 | −2.265529E−05 |
| XY | −9.236997E−07 | −2.607748E−06 | 6.227871E−07 | 3.079079E−07 | −7.987044E−06 | −3.674092E−07 |
| Y2 | 7.218239E−07 | −9.908183E−06 | −1.212227E−05 | −1.295899E−06 | 3.206416E−05 | −2.214899E−05 |
| X3 | −1.680508E−10 | 1.387094E−09 | −1.843327E−09 | −1.776594E−10 | −2.248979E−08 | 2.585388E−10 |
| X2Y | 7.312532E−09 | 5.034857E−08 | 3.824130E−08 | −1.213293E−10 | −2.755092E−07 | 3.634433E−10 |
| XY2 | 1.508550E−09 | 9.375900E−09 | 3.490745E−08 | 5.757043E−10 | −3.964728E−08 | 1.888641E−10 |
| Y3 | −2.109040E−09 | 4.559342E−08 | 5.851897E−08 | 4.759581E−10 | −1.340763E−07 | 3.471563E−09 |
| X4 | −8.760876E−12 | −2.277959E−10 | −1.582707E−09 | 1.168916E−14 | 2.260746E−09 | −3.762556E−11 |
| X3Y | 1.378062E−12 | −3.242529E−12 | −1.132115E−10 | −1.353495E−12 | 3.022756E−11 | −1.549540E−12 |
| X2Y2 | −2.501304E−11 | −6.594960E−10 | −3.553667E−09 | −7.017119E−12 | 4.559709E−09 | −7.494488E−11 |
| XY3 | −5.400663E−13 | 9.859620E−13 | 3.170324E−11 | −1.200686E−13 | 6.560089E−12 | 1.403628E−13 |
| Y4 | −3.534105E−12 | −2.951925E−10 | −1.940671E−09 | −3.028945E−12 | 1.234646E−09 | −3.261273E−11 |
| X5 | −2.670412E−16 | −3.786020E−15 | −6.340135E−16 | −3.524846E−16 | 2.251434E−13 | 3.386125E−16 |
| X4Y | 1.557431E−14 | 1.964863E−13 | −4.176107E−13 | 9.030892E−15 | 4.301462E−13 | 4.544606E−15 |
| X3Y2 | −5.963487E−15 | 1.922075E−14 | −1.175192E−12 | −4.863707E−15 | −2.166782E−15 | 8.594699E−16 |
| X2Y3 | 7.041093E−15 | 1.199097E−12 | −2.056518E−12 | −5.292366E−15 | −5.566757E−12 | 1.278078E−14 |
| XY4 | −9.670938E−16 | −1.037176E−13 | −1.248780E−12 | 2.455694E−16 | 7.887246E−13 | −6.351312E−16 |
| Y5 | 1.138080E−15 | 5.438584E−14 | −6.413872E−12 | 7.667682E−16 | −2.590126E−12 | 9.084047E−15 |
| X6 | 1.897079E−19 | 7.816988E−17 | −2.270474E−15 | 3.464352E−18 | 7.906581E−14 | −6.223197E−17 |
| X5Y | 9.882396E−19 | 8.399415E−18 | 9.152020E−17 | −2.715922E−18 | −5.326248E−15 | −4.451651E−18 |
| X4Y2 | −4.219005E−17 | −1.051213E−15 | 5.650461E−15 | 3.532461E−17 | 1.879515E−13 | −1.668805E−16 |
| X3Y3 | 1.196034E−17 | 1.278066E−17 | −9.133328E−15 | −1.204538E−17 | −6.967022E−15 | −9.080723E−18 |
| X2Y4 | 7.917510E−18 | −2.513462E−15 | −2.054696E−14 | 4.238235E−18 | 1.369818E−13 | −1.462059E−16 |
| XY5 | 4.802504E−19 | 4.692660E−16 | −9.392364E−15 | 1.159111E−18 | 8.442641E−15 | −1.906202E−18 |
| Y6 | −3.136199E−18 | 4.922332E−16 | −3.782993E−14 | 4.680312E−18 | 3.693808E−14 | −4.844600E−17 |
| X7 | −2.059802E−22 | −1.709076E−20 | 1.394530E−18 | 3.940211E−22 | −8.812031E−18 | 1.155921E−21 |
| X6Y | −8.459960E−21 | −6.416751E−19 | 3.483558E−17 | 1.881820E−20 | −2.282653E−16 | −1.128686E−20 |
| X5Y2 | −1.111619E−21 | −8.777329E−20 | 2.752326E−18 | −8.153281E−21 | 2.646186E−17 | 6.079076E−21 |
| X4Y3 | 4.116566E−20 | 2.965495E−18 | 8.344352E−17 | 6.496392E−20 | −9.590811E−16 | −2.852777E−20 |
| X3Y4 | −1.097971E−20 | −1.527308E−19 | −3.283686E−17 | −1.597587E−20 | 4.758813E−17 | 1.587677E−20 |
| X2Y5 | −1.683219E−20 | 3.252516E−18 | −8.955168E−17 | 3.056820E−20 | −1.027312E−15 | 1.932218E−20 |
| XY6 | 1.210592E−21 | −9.036783E−19 | −3.012777E−17 | 6.167926E−22 | 9.927743E−17 | 7.260507E−21 |
| Y7 | −1.542479E−21 | −1.900389E−18 | −1.036143E−16 | 3.332811E−21 | −1.318904E−16 | 1.896820E−20 |
| X8 | −1.819407E−24 | −1.597631E−21 | 1.497390E−20 | 3.321663E−24 | −1.671646E−18 | −1.003686E−22 |
| X7Y | 4.782183E−25 | 3.174037E−22 | 1.677243E−20 | 6.402843E−25 | 4.151157E−19 | −1.046049E−23 |
| X6Y2 | 4.242719E−24 | −1.771859E−22 | 1.335246E−19 | 2.800759E−23 | −1.889296E−18 | −3.129448E−22 |
| X5Y3 | 2.689033E−25 | 2.814478E−22 | 1.271535E−20 | −9.658074E−24 | 5.933757E−19 | −4.961756E−23 |
| X4Y4 | −2.239202E−23 | −5.552341E−21 | 5.212611E−20 | 4.679006E−23 | −4.185514E−18 | −4.623757E−22 |
| X3Y5 | 3.836067E−24 | 1.234467E−22 | −4.066449E−20 | −1.063642E−23 | −2.073035E−19 | −5.120967E−23 |
| X2Y6 | 2.389252E−24 | −3.581728E−21 | −2.529166E−19 | 2.807671E−23 | −3.186546E−18 | −3.109520E−22 |
| XY7 | −9.277273E−25 | 5.905946E−22 | −3.539341E−20 | −8.214655E−25 | 2.408285E−19 | −1.550095E−23 |
| Y8 | 4.869363E−25 | 1.829224E−21 | −1.527198E−19 | 7.556827E−25 | 9.696593E−19 | −8.260716E−23 |
| X9 | 0.000000E+00 | 0.000000E+00 | 0.000000E+00 | 0.000000E+00 | 0.000000E+00 | 0.000000E+00 |
| X8Y | 0.000000E+00 | 0.000000E+00 | 0.000000E+00 | 0.000000E+00 | 0.000000E+00 | 0.000000E+00 |
| X7Y2 | 0.000000E+00 | 0.000000E+00 | 0.000000E+00 | 0.000000E+00 | 0.000000E+00 | 0.000000E+00 |
| X6Y3 | 0.000000E+00 | 0.000000E+00 | 0.000000E+00 | 0.000000E+00 | 0.000000E+00 | 0.000000E+00 |
| X5Y4 | 0.000000E+00 | 0.000000E+00 | 0.000000E+00 | 0.000000E+00 | 0.000000E+00 | 0.000000E+00 |
| X4Y5 | 0.000000E+00 | 0.000000E+00 | 0.000000E+00 | 0.000000E+00 | 0.000000E+00 | 0.000000E+00 |
| X3Y6 | 0.000000E+00 | 0.000000E+00 | 0.000000E+00 | 0.000000E+00 | 0.000000E+00 | 0.000000E+00 |
| X2Y7 | 0.000000E+00 | 0.000000E+00 | 0.000000E+00 | 0.000000E+00 | 0.000000E+00 | 0.000000E+00 |
| XY8 | 0.000000E+00 | 0.000000E+00 | 0.000000E+00 | 0.000000E+00 | 0.000000E+00 | 0.000000E+00 |
| Y9 | 0.000000E+00 | 0.000000E+00 | 0.000000E+00 | 0.000000E+00 | 0.000000E+00 | 0.000000E+00 |
| X10 | 0.000000E+00 | 0.000000E+00 | 0.000000E+00 | 0.000000E+00 | 0.000000E+00 | 0.000000E+00 |
| X9Y | 0.000000E+00 | 0.000000E+00 | 0.000000E+00 | 0.000000E+00 | 0.000000E+00 | 0.000000E+00 |
| X8Y2 | 0.000000E+00 | 0.000000E+00 | 0.000000E+00 | 0.000000E+00 | 0.000000E+00 | 0.000000E+00 |
| X7Y3 | 0.000000E+00 | 0.000000E+00 | 0.000000E+00 | 0.000000E+00 | 0.000000E+00 | 0.000000E+00 |
| X6Y4 | 0.000000E+00 | 0.000000E+00 | 0.000000E+00 | 0.000000E+00 | 0.000000E+00 | 0.000000E+00 |
| X5Y5 | 0.000000E+00 | 0.000000E+00 | 0.000000E+00 | 0.000000E+00 | 0.000000E+00 | 0.000000E+00 |
| X4Y6 | 0.000000E+00 | 0.000000E+00 | 0.000000E+00 | 0.000000E+00 | 0.000000E+00 | 0.000000E+00 |
| X3Y7 | 0.000000E+00 | 0.000000E+00 | 0.000000E+00 | 0.000000E+00 | 0.000000E+00 | 0.000000E+00 |
| X2Y8 | 0.000000E+00 | 0.000000E+00 | 0.000000E+00 | 0.000000E+00 | 0.000000E+00 | 0.000000E+00 |
| XY9 | 0.000000E+00 | 0.000000E+00 | 0.000000E+00 | 0.000000E+00 | 0.000000E+00 | 0.000000E+00 |

| Coefficient | M1 | M2 | M3 | M4 | M5 | M6 |
|---|---|---|---|---|---|---|
| Y10 | 0.000000E+00 | 0.000000E+00 | 0.000000E+00 | 0.000000E+00 | 0.000000E+00 | 0.000000E+00 |
| Nradius | 1.000000E+00 | 1.000000E+00 | 1.000000E+00 | 1.000000E+00 | 1.000000E+00 | 1.000000E+00 |

In contrast to the optical design data on the projection lens systems described until now, in the design data on the projection optical system 69 coefficients of the monomials $X^n Y^m$ with uneven powers in the x-dimension, in other words with uneven powers in the longitudinal dimension of the object field 9 or in the dimension perpendicular to the drawing plane according to FIG. 25, are also present.

The object field 9 according to FIG. 26 corresponds, with regard to the wedge form, to the object field 9 according to FIG. 24. The image of the boundary line 65 in the image plane 14 has an extent $YS_{min}$ of 1 mm. The image of the boundary line 66, in the image plane 14, has an extent $YS_{max}$ of 3 mm. The ration of $YS_{min}$ to $YS_{max}$ in the object field 9 according to FIG. 26 and in the associated image field 13 is thus 0.33. The images of the two boundary lines 65, 66, in the image plane 14, have a spacing XS of 26 mm with respect to one another.

Figure 27:
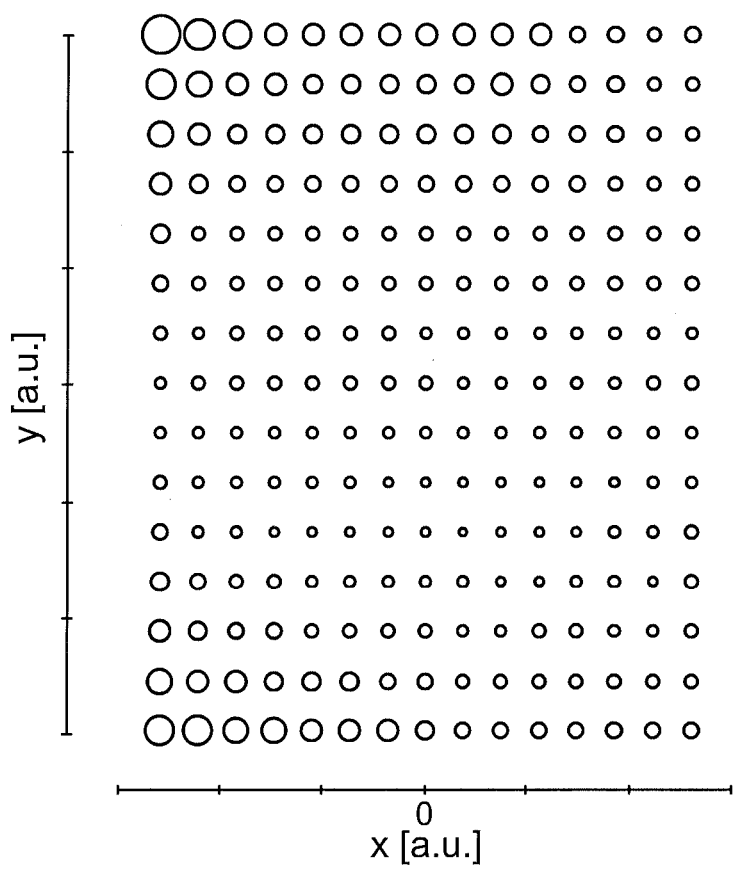
FIG. 27 shows a graph, which reproduces an imaging quality of the projection optical system according to FIG. 25 over the image field, for that variant of the projection lens system according to FIG. 25, which includes the object field according to FIG. 26 imaged by the projection optical system.

FIG. 27 in turn shows, in a graphical view similar to FIG. 10, the course of the rms spot sizes over the object field 9 according to FIG. 26.

The minimal rms spot size is $0.11318 \times 10^{-4}$ mm. The maximal rms spot size, which lies outside the object field 9 used, is $0.65788 \times 10^{-4}$ mm.

FIG. 27 shows the rms spot sizes in a rectangular region of the object plane 11, within which the object field 9 according to FIG. 26 is inscribed. It can be inferred from the graph according to FIG. 27 that values for the rms spot size are very small precisely in the region of the field form of the object field 9 according to FIG. 26.

Figure 28:
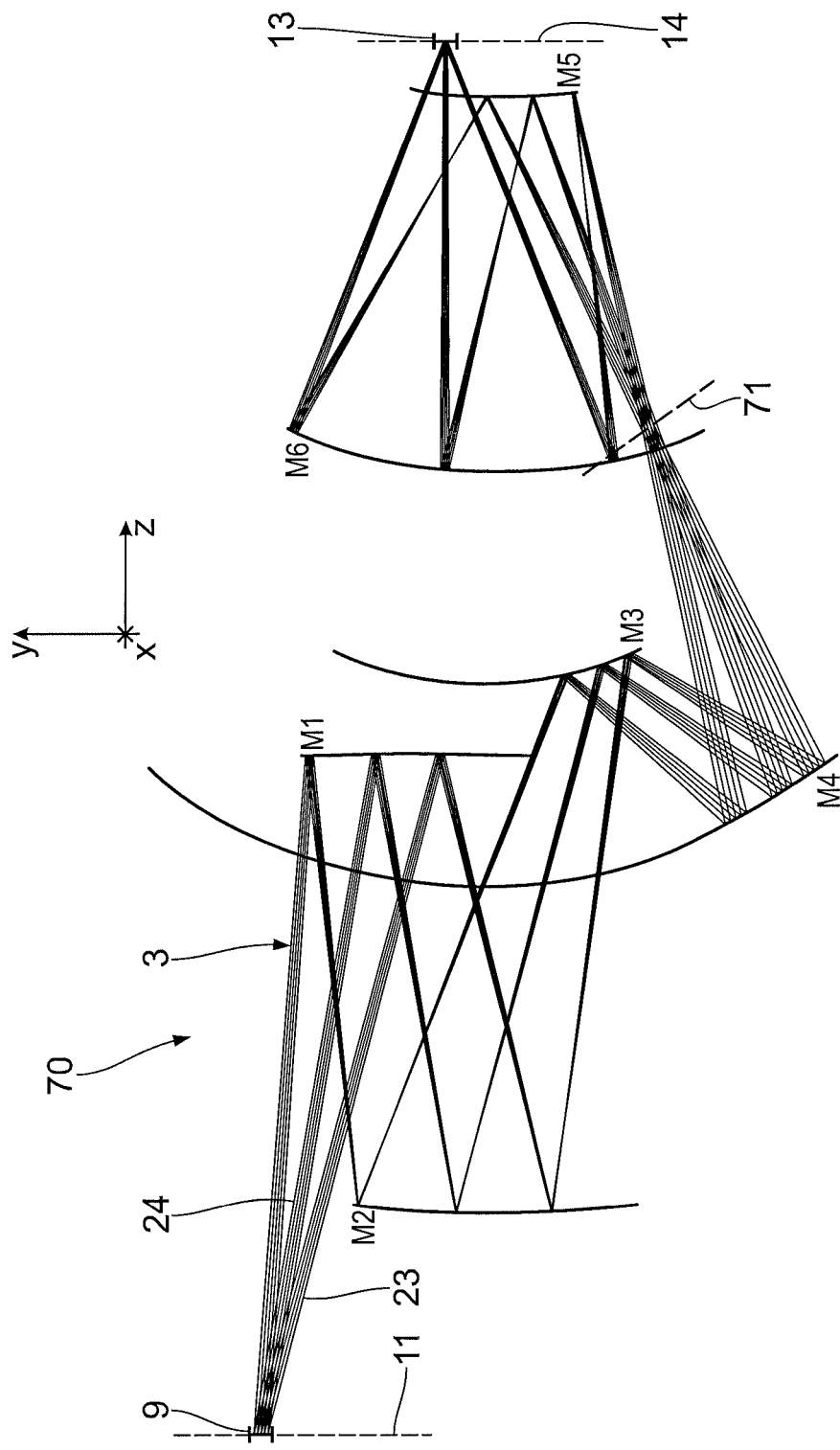
FIG. 28 shows, in a view similar to FIG. 4, a further configuration of a projection optical system, with which a further object field form can be imaged.
Figure 29:
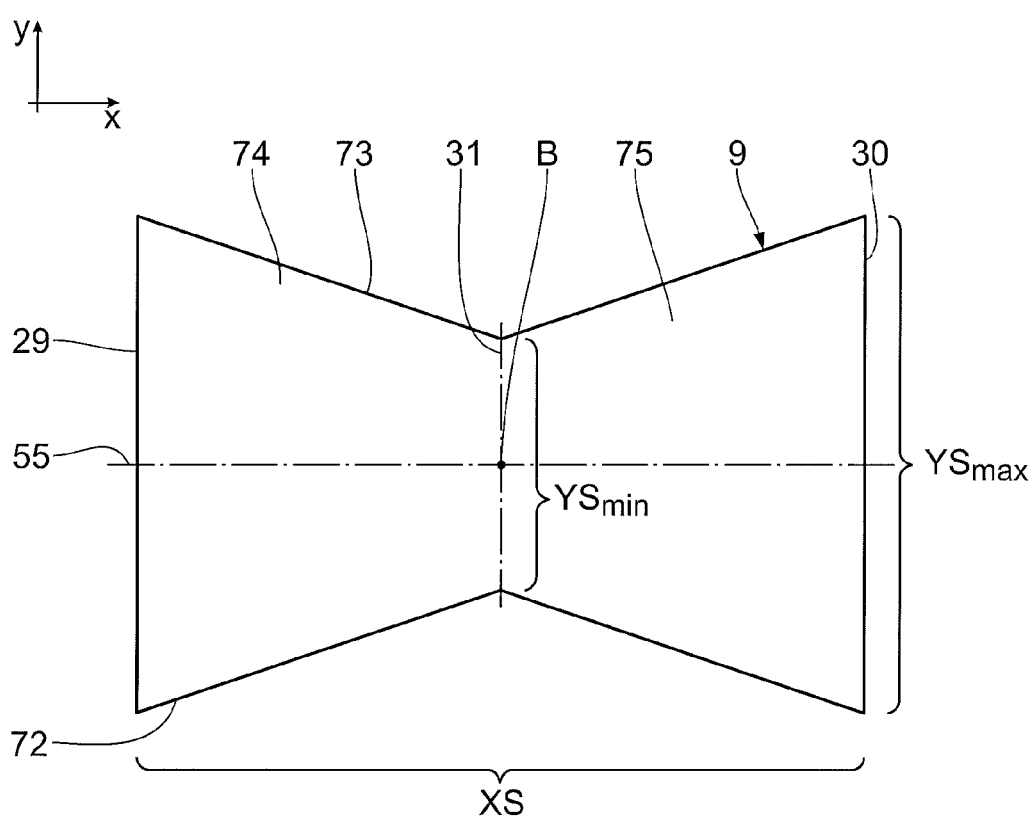
FIG. 29 shows, in a view similar to FIG. 9, the object field form, which can be imaged with the configuration of the projection optical system according to FIG. 28.

FIG. 28 shows a further configuration of a projection optical system 70, with which an object field 9 shown in a plan view in FIG. 29 can be imaged. The object field 9 according to FIG. 29, in the plan view shown, is similar to a bow tie worn as neck decoration for men and is adapted to the superimposition shown in FIG. 18 of tilted images of rectangular field facets.

With regard to the basic structure, the projection optical system 70 is in turn similar to the projection optical system 12 according to FIG. 4, but has some differences from this with regard to the more precise arrangement of the six mirrors M1 to M6.

Thus, the beam path between the object field 9 and the mirror M1 in the projection optical system 70 is significantly shorter in comparison to the spacing between the object plane 11 and the image plane 14 than in the projection optical system 12. In addition, in the projection optical system 70, the mirror M2 in the view according to FIG. 28 is already clearly visibly concave. The projection optical system 70 has a positive back focus of an entry pupil. A first pupil plane within the projection optical system 70 is arranged in the region of the mirror M2, so the reflection face of the mirror M2 can also adopt the form of an aperture stop.

An intermediate image plane 71 in the projection optical system 70 is arranged adjacent to the mirror M6.

The mirrors M1 and M6, on the one hand, and M3 and M6, on the other hand, are arranged back to back.

The optical data of the reflection face of the mirrors M1 to M6 of the projection optical system 70 can be inferred from the following tables, which correspond to the tables on the projection optical system according to FIG. 4.

| Surface | Radius | Thickness | Operating mode |
|---|---|---|---|
| Object plane | infinite | 730.511 | |
| M1 | −4378.919 | −492.706 | REFL |
| M2 | 1125.078 | 567.277 | REFL |
| M3 | 323.654 | −216.514 | REFL |
| M4 | 505.945 | 847.498 | REFL |
| M5 | 465.667 | −404.754 | REFL |
| M6 | 506.154 | 463.427 | REFL |
| Image plane | infinite | 0.000 | |

| Coefficient | M1 | M2 | M3 | M4 | M5 | M6 |
|---|---|---|---|---|---|---|
| K | 0.000000E+00 | 3.677632E+00 | −7.282053E−01 | −4.059289E−02 | 6.097818E+00 | 9.271668E−02 |
| Y | 0.000000E+00 | 0.000000E+00 | 0.000000E+00 | 0.000000E+00 | 0.000000E+00 | 0.000000E+00 |
| X2 | −3.293835E−05 | −7.895117E−06 | −4.374353E−05 | −2.084891E−06 | 2.619618E−05 | 4.498704E−06 |
| Y2 | 0.000000E+00 | 0.000000E+00 | 0.000000E+00 | 0.000000E+00 | −6.467741E−05 | 0.000000E+00 |
| X2Y | 1.135340E−07 | −1.730152E−08 | −6.895159E−08 | 1.022569E−07 | 1.094407E−07 | −4.824164E−09 |
| Y3 | 9.197554E−08 | −2.016731E−09 | 3.666814E−07 | 5.190220E−09 | −4.414676E−08 | −4.353054E−09 |
| X4 | 5.872584E−10 | −4.290121E−10 | 2.546976E−10 | −8.759823E−11 | −1.879364E−09 | −3.239401E−12 |
| X2Y2 | 1.022996E−09 | −8.298546E−10 | −1.410098E−09 | 7.809798E−10 | −4.757371E−09 | −1.902901E−11 |
| Y4 | 4.769368E−10 | −3.777206E−10 | −2.307227E−09 | −5.712408E−11 | −2.566209E−09 | −1.346338E−11 |
| X4Y | −2.308933E−12 | 5.584879E−15 | −4.571033E−12 | −7.564145E−13 | −5.675126E−12 | −1.691016E−14 |
| X2Y3 | −3.706470E−12 | −3.373519E−13 | −3.002060E−11 | 3.296445E−12 | −5.903687E−12 | −3.926964E−14 |
| Y5 | −1.293035E−12 | −2.252860E−13 | −2.904087E−11 | 3.438049E−13 | −1.200714E−11 | −2.836403E−14 |
| X6 | −4.199793E−15 | −7.567000E−16 | −2.644180E−15 | −2.715388E−16 | 1.018805E−13 | 2.622980E−17 |
| X4Y2 | −7.124537E−15 | −2.367769E−15 | −4.149095E−14 | −4.898353E−15 | 1.867911E−13 | 4.305691E−17 |
| X2Y4 | −4.464560E−15 | −2.109013E−15 | −2.211221E−13 | 5.377965E−15 | 5.757448E−14 | 4.670080E−18 |
| Y6 | −9.413155E−16 | −1.896045E−16 | −5.094045E−14 | 4.558096E−16 | −6.039224E−13 | −1.066849E−18 |
| X6Y | 2.028711E−17 | −3.148746E−18 | −1.362227E−16 | −1.097976E−18 | 4.311388E−16 | −7.272559E−20 |
| X4Y3 | 2.507267E−17 | −4.408528E−18 | −4.277810E−16 | −1.354058E−17 | 1.582705E−16 | −2.270566E−19 |
| X2Y5 | 1.668452E−17 | −2.243194E−18 | −1.021933E−15 | 1.531083E−18 | −2.206592E−16 | −3.005298E−19 |
| Y7 | −7.783709E−17 | −2.189776E−18 | 2.573714E−16 | −2.478659E−18 | −1.413471E−14 | −1.096138E−19 |
| X8 | 1.626399E−20 | 1.831322E−21 | 2.546846E−20 | −7.223363E−23 | −1.064913E−19 | 2.706514E−22 |
| X6Y2 | 4.858536E−21 | 1.606335E−20 | −6.354332E−19 | −2.521450E−21 | 3.637394E−19 | 6.859594E−22 |
| X4Y4 | 1.892074E−20 | 8.209055E−21 | −1.318863E−18 | −1.641141E−20 | −2.463787E−18 | 6.004426E−22 |
| X2Y6 | −9.251435E−22 | −4.917083E−21 | −1.930060E−18 | −6.014446E−21 | −1.900885E−18 | 1.268922E−22 |

-continued

| Coefficient | M1 | M2 | M3 | M4 | M5 | M6 |
|---|---|---|---|---|---|---|
| Y8 | 1.037002E−18 | −2.217649E−20 | 6.771334E−20 | −7.345164E−21 | −1.728967E−16 | 5.979031E−23 |
| X8Y | 0.000000E+00 | 0.000000E+00 | 0.000000E+00 | 0.000000E+00 | 0.000000E+00 | 0.000000E+00 |
| X6Y3 | 0.000000E+00 | 0.000000E+00 | 0.000000E+00 | 0.000000E+00 | 0.000000E+00 | 0.000000E+00 |
| X4Y5 | 0.000000E+00 | 0.000000E+00 | 0.000000E+00 | 0.000000E+00 | 0.000000E+00 | 0.000000E+00 |
| X2Y7 | 0.000000E+00 | 0.000000E+00 | 0.000000E+00 | 0.000000E+00 | 0.000000E+00 | 0.000000E+00 |
| Y9 | −5.863713E−21 | 2.299529E−22 | −7.694380E−21 | −3.570715E−24 | −1.139165E−18 | −5.778208E−25 |
| X10 | 0.000000E+00 | 0.000000E+00 | 0.000000E+00 | 0.000000E+00 | 0.000000E+00 | 0.000000E+00 |
| X8Y2 | 0.000000E+00 | 0.000000E+00 | 0.000000E+00 | 0.000000E+00 | 0.000000E+00 | 0.000000E+00 |
| X6Y4 | 0.000000E+00 | 0.000000E+00 | 0.000000E+00 | 0.000000E+00 | 0.000000E+00 | 0.000000E+00 |
| X4Y6 | 0.000000E+00 | 0.000000E+00 | 0.000000E+00 | 0.000000E+00 | 0.000000E+00 | 0.000000E+00 |
| X2Y8 | 0.000000E+00 | 0.000000E+00 | 0.000000E+00 | 0.000000E+00 | 0.000000E+00 | 0.000000E+00 |
| Y10 | 1.298102E−23 | −6.593895E−25 | −1.971388E−23 | 8.150943E−28 | −3.139727E−21 | 6.288318E−28 |
| Nradius | 1.000000E+00 | 1.000000E+00 | 1.000000E+00 | 1.000000E+00 | 1.000000E+00 | 1.000000E+00 |

| Coefficient | M1 | M2 | M3 | M4 | M5 | M6 | Image field |
|---|---|---|---|---|---|---|---|
| Y+31 decentring | −117.837 | −196.401 | −186.764 | −194.807 | −192.592 | −194.384 | 0.000 |
| X+31 rotation | −0.205 | −0.081 | 0.447 | 1.234 | −1.304 | −0.357 | 0.000 |

As the object field 9 according to FIG. 29, which is imaged by the projection optical system 70, is again mirror-symmetrical relative to the mirror plane 31 of symmetry extending parallel to the yz-plane, terms with even powers in x in turn exclusively contribute to the free form face description of the reflection faces of the mirrors M1 to M6 of the projection optical system 70.

The object field 9 according to FIG. 29 is similar to the object field 9 according to FIG. 18. In contrast to the longitudinal side limitations extending in an arcuate manner there, in the object field 9 according to FIG. 29, longitudinal side boundary lines 72, 73 extending in a bent manner are present. The object field 9 according to FIG. 29 can therefore be understood as a composition of two trapezoidal half fields 74, 75, the half fields 74 in FIG. 29 being shown to the left of the mirror plane 31 of symmetry and the half field 75 being shown to the right of the mirror plane 31 of symmetry. The object field 9 according to FIG. 29, similarly to the object field 9 according to FIG. 18, is also mirror-symmetrical to the mirror plane 55 of symmetry extending parallel to the xz-plane.

The smallest transverse extent $YS_{min}$ of the object field 9 according to FIG. 29 is present at the height of the mirror plane 31 of symmetry. The object field 9 according to FIG. 29 at the height of the two boundary lines 29, 30 has the largest transverse extent $YS_{max}$. The ratio $YS_{min}$ to $YS_{max}$ in the object field 9 according to FIG. 29 is 0.5.

The object field 9 according to FIG. 29 can approximately be illuminated by the rectangular field facets 50 of the field facet mirror 49.

Figure 30:
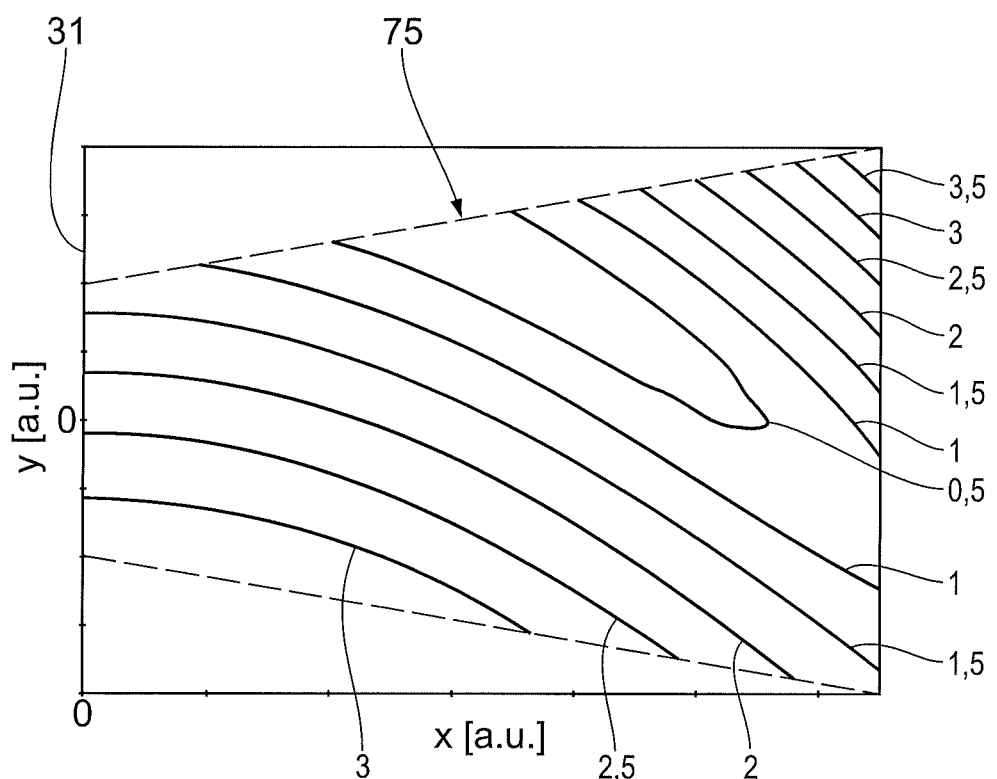
FIG. 30 shows a graph of one half of the object field form according to FIG. 29, with a telecentricity value distribution over this object field half.

FIG. 30 shows the curse of a telecentricity value over the half field 75 at a height line course, relative values being associated with the individual height lines, in each case. The maximum telecentricity value is about 3. The telecentricity value is defined as the deviation of a bundle focal point of the illumination light 3 from a perpendicular incidence onto the image plane 14, measured in mrad.

Figure 31:
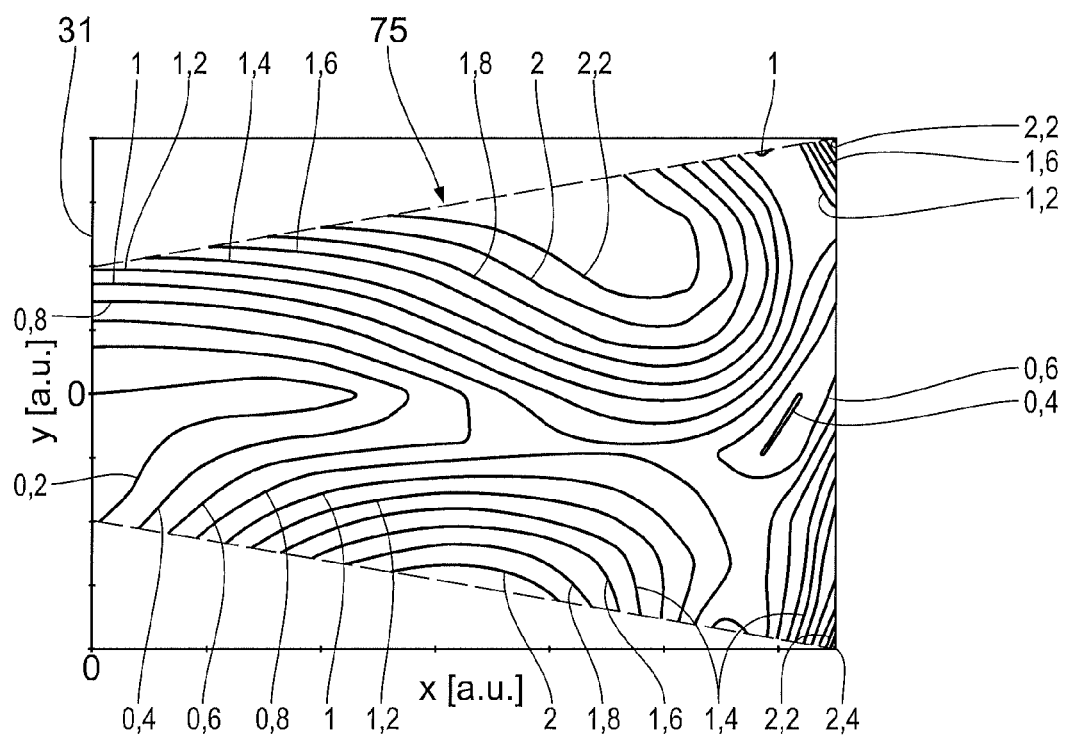
FIG. 31 shows a graph of one half of the object field form according to FIG. 29 with a distortion value distribution over this object field half.

FIG. 31 shows the distortion value, also over the half field 75, also in a height line view. The distortion varies between a minimal value after 0 mm at a maximum value of about 2.2 mm.

Figure 32:
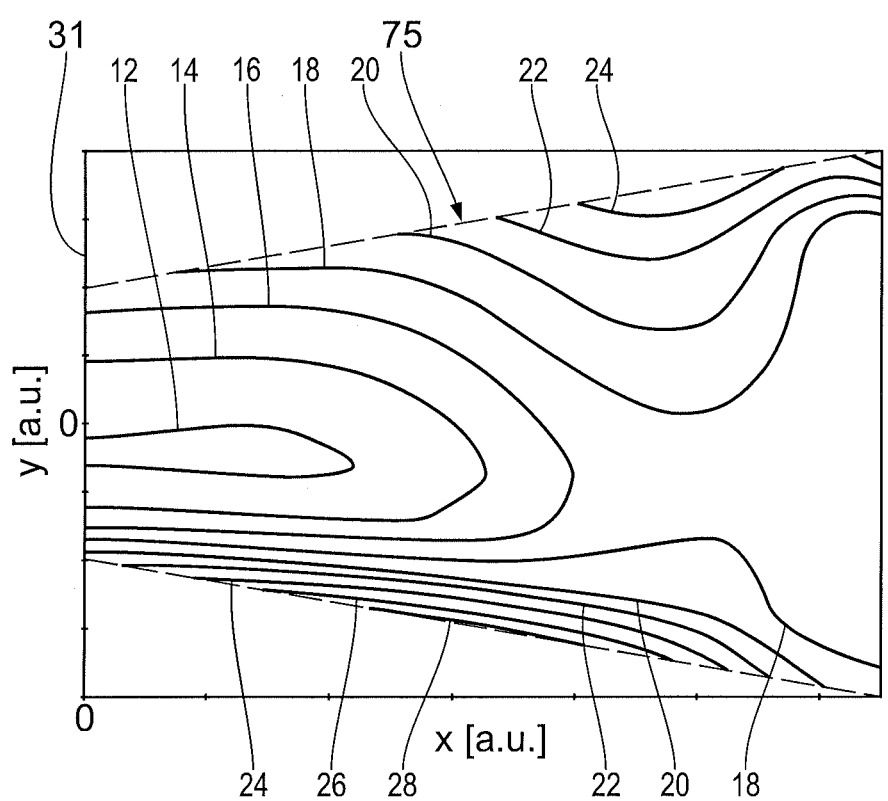
FIG. 32 shows a graph of one half of the object field form according to FIG. 29 with a wavefront value distribution over this object field half.

FIG. 32 shows the wavefront value over the half field 75, also in a height line view. This wavefront value varies between a minimal value of about 12 mλ and a maximal value of about 28 mλ, with λ representing a wavelength of the illumination light 3 of 13.5 nm.

The course of telecentricity, distortion and wavefront, in the half field 74 about the mirror plane 31 of symmetry is shown mirror-symmetrically to that shown in FIGS. 30 to 32.

To produce a microstructured or nanostructured component, the projection exposure system 1 is used as follows: firstly, the reticle and the wafer are provided. A structure on the reticle is then projected onto a light-sensitive layer of the wafer with the aid of the projection exposure system 1. By developing the light-sensitive layer, a microstructure is then produced on the wafer and thus the microstructured component is produced.

The projection exposure system 1 is implemented as a scanner. The reticle is, in this case, continuously displaced in the y-direction during the projection exposure. Alternatively, configuration as a stepper is also possible, in which the reticle is displaced step-wise in the y-direction.

If the projection exposure system 1 is configured as a scanner, the scanning direction extends parallel to the transverse dimension of the object field 9.

What is claimed is:
1. An imaging optical system, comprising:
a plurality of mirrors configured to image an object field in an object plane into an image field in an image plane,
wherein:
a reflection face of at least one of the plurality of mirrors is a free form face which cannot be described by a rotationally symmetrical function;
the object field has a longitudinal dimension and a transverse dimension;
the longitudinal dimension is greater than the transverse dimension;
a ratio of a minimal transverse dimension of the object field and a maximum transverse dimension of the object field is less than 0.9.
2. The imaging optical system of claim 1, wherein the object field has a wedge shape.

3. The imaging optical system of claim 1, wherein the object field includes two trapezoidal fields.

4. The imaging optical system of claim 1, wherein the object field has a constriction.

5. The imaging optical system of claim 1, wherein the plurality of mirrors comprises at least six mirrors.

6. The imaging optical system of claim 1, wherein the plurality of mirrors comprises precisely eight mirrors.

7. The imaging optical system of claim 1, wherein the imaging optical system has a wavefront error in the object field with a rms value of at most one nanometer.

8. The imaging optical system of claim 1, wherein the object or illumination field is defined by a curved line having first and second ends, a longitudinal line opposing the curved line and having first and second ends, and first and second boundary lines, and
wherein the first boundary line is connected to the first end of the curved line and the first end of the longitudinal line, and the second boundary line is connected to the second end of the curved line and the second end of the longitudinal line.

9. The imaging optical system of claim 8, wherein the curved line has a part circular shape.

10. The imaging optical system of claim 9, wherein the curved line has a radius of at most 300 mm.

11. The imaging optical system of claim 8, wherein the longitudinal line is a straight line.

12. The imaging optical system of claim 8, wherein the longitudinal line is curved.

13. The imaging optical system of claim 8, wherein the longitudinal line has an arcuate shape.

14. The imaging optical system of claim 13, wherein the longitudinal line has a part circular shape.

15. The imaging optical system of claim 14, wherein the longitudinal line has a radius of at most 300 mm.

16. A projection exposure system, comprising:
an illumination system; and
an imaging optical system according to claim 1,
wherein the projection exposure system is a microlithography projection exposure system.

17. An imaging optical system, comprising:
a plurality of mirrors configured to image an object field in an object plane into an image field in an image plane,
wherein:
a field is selected from the group consisting of the object field and the image field;
the field extends in a plane that includes a first direction and a second direction which is perpendicular to the first direction;
the field has a maximum dimension in the first direction;
the field has a maximum dimension in the second direction;
the maximum dimension of the field in the first direction is greater than the maximum dimension of the field in the second direction;
a third direction is perpendicular to both the first and second directions;
a central plane extends along the second and third dimensions;
the central plane intersects a midpoint of the field along the first direction; and
the field deviates from a mirror-symmetrical field in relation to the central plane.

18. The imaging optical system of claim 17, wherein a reflection face of at least one of the plurality of mirrors is a free form face which cannot be described by a rotationally symmetrical function.

19. The imaging optical system of claim 17, wherein:
the object field has a longitudinal dimension and a transverse dimension;
the longitudinal dimension is greater than the transverse dimension;
a reflection face of one of the plurality of mirrors has a face function having terms with uneven powers in the longitudinal dimension.

20. A projection exposure system, comprising:
an illumination system; and
an imaging optical system according to claim 17,
wherein the projection exposure system is a microlithography projection exposure system.

21. The imaging optical system of claim 17, wherein the field is the object field.

22. The imaging optical system of claim 17, wherein the field is the image field.

23. An illumination optical system, comprising:
components configured to illuminate an illumination field in an object plane,
wherein:
the illumination field having a longitudinal dimension and a transverse dimension;
the longitudinal dimension is greater than the transverse dimension;
a ratio of a minimum a transverse dimension of the illumination field and a maximum transverse dimension of the illumination field is less than 0.9;
during use of the illumination optical system, the transverse dimension of the illumination field is variable without stopping down the illumination light.

24. The illumination optical system of claim 23, wherein a reflection face of at least one of the components is a free form face which cannot be described by a rotationally symmetrical function.

25. The illumination optical system of claim 23, comprising:
a field facet mirror comprising a plurality of field facets;
an optical system configured to superimpose an imaging of the field facets in the illumination field.

26. The illumination optical system of claim 25, wherein a reflection face of at least one of the field facets is not configured in a geometrically similar manner to the illumination field.

27. The illumination optical system of claim 25, wherein a boundary of a reflection face of at least one of the field facets is rectangular.

28. The illumination optical system of claim 25, wherein a boundary of a reflection face has a boundary that is arcuate.

29. The illumination optical system of claim 25, wherein a boundary of a reflection face is barrel-shaped.

30. The illumination optical system of claim 25, wherein a boundary of a reflection face has a straight longitudinal side and an arcuate longitudinal side.

31. The illumination optical system of claim 25, wherein projection faces of reflection faces of at least two of the field facets differ with respect to at least one parmeter selected from the group consisting of size, form and orientation.

32. An illumination system comprising:
an EUV light source; and
an illumination optical system according to claim 23.

33. A projection exposure system, comprising:
an illumination optical system according to claim 23; and
an imaging optical system,
wherein the projection exposure system is a microlithography projection exposure system.

34. An imaging optical system, comprising:
a plurality of mirrors configured to image an object field in an object plane into an image field in an image plane, wherein:
at least one field deviates from a mirror-symmetrical field form;
the field is selected from the group consisting of the object field, the image field and a combination thereof;
the object field has a longitudinal dimension and a transverse dimension;
the longitudinal dimension is greater than the transverse dimension;
a reflection face of one of the plurality of mirrors has a face function having terms with uneven powers in the longitudinal dimension.

35. The imaging optical system of claim 34, wherein a reflection face of at least one of the plurality of mirrors is a free form face which cannot be described by a rotationally symmetrical function.

36. The imaging optical system of claim 34, wherein the at least one field is the object field.

37. The imaging optical system of claim 34, wherein the at least one field is the image field.

38. A projection exposure system, comprising:
an illumination system; and
an imaging optical system according to claim 34,
wherein the projection exposure system is a microlithography projection exposure system.

* * * * *

UNITED STATES PATENT AND TRADEMARK OFFICE
CERTIFICATE OF CORRECTION

PATENT NO. : 9,182,578 B2  
APPLICATION NO. : 13/326516  
DATED : November 10, 2015  
INVENTOR(S) : Hans-Juergen Mann et al.

Page 1 of 1

It is certified that error appears in the above-identified patent and that said Letters Patent is hereby corrected as shown below:

Col. 7, line 28, delete "synchotron" and insert -- synchrotron --.

Col. 38, line 58, Claim 31, delete "parmeter" and insert -- parameter --.

Signed and Sealed this
Twenty-fourth Day of May, 2016

Michelle K. Lee
*Director of the United States Patent and Trademark Office*